US012785564B2

(12) United States Patent
Cook et al.

(10) Patent No.: US 12,785,564 B2
(45) Date of Patent: Nov. 3, 2026

(54) NON-RIGHT-HALF-PLANE-ZERO POWER CONVERSION ARCHITECTURES WITH TRI-PHASE OPERATION AND RELATED CIRCUITS AND TECHNIQUES

(71) Applicant: Murata Manufacturing Co., Ltd., Kyoto (JP)

(72) Inventors: Aaron Cook, Windham, NH (US); David J. Perreault, Cambridge, MA (US); Aspiyan Gazder, Bedford, MA (US); John R. Hoversten, Arlington, MA (US); Yevgeniy A. Tkachenko, Belmont, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 13 days.

(21) Appl. No.: 19/092,265

(22) Filed: Mar. 27, 2025

(65) Prior Publication Data

US 2025/0309831 A1 Oct. 2, 2025

Related U.S. Application Data

(60) Provisional application No. 63/570,470, filed on Mar. 27, 2024.

(51) Int. Cl.
*H02M 3/158* (2006.01)
*H02M 1/00* (2006.01)
(Continued)

(52) U.S. Cl.
CPC ........... *H02M 3/158* (2013.01); *H02M 1/009* (2021.05); *H02M 3/07* (2013.01); *H02M 3/072* (2021.05);
(Continued)

(58) Field of Classification Search
CPC .. H02M 3/072; H02M 3/1582; H02M 1/0019; H02M 1/0025; H02M 1/0043;
(Continued)

(56) References Cited

U.S. PATENT DOCUMENTS

| | | |
|---|---|---|
| 7,103,114 B1 | 9/2006 | Lapierre |
| 7,482,869 B2 | 1/2009 | Wilson |

(Continued)

FOREIGN PATENT DOCUMENTS

| | | |
|---|---|---|
| WO | WO 2010/081843 | 7/2010 |
| WO | WO 2012/151466 | 11/2012 |
| WO | WO 2017/007991 | 1/2017 |

OTHER PUBLICATIONS

U.S. Appl. No. 18/753,516, filed Jun. 25, 2024, Perreault et. al.

(Continued)

*Primary Examiner* — Yusef A Ahmed
(74) *Attorney, Agent, or Firm* — Daly, Crowley, Mofford & Durkee, LLP

(57) ABSTRACT

Described are concepts, systems, system architectures, circuits, methods, and techniques directed toward power management and control. In particular, described are concepts, systems, system architectures, circuits, methods, and techniques for implementing power converters that may not have a right-hand pole zero in their linearized, averaged control-to-output transfer function, but that may still have buck and boost functionality.

16 Claims, 22 Drawing Sheets

(51) Int. Cl.
*H02M 3/07* (2006.01)
*H03F 1/02* (2006.01)
*H03F 3/24* (2006.01)

(52) U.S. Cl.
CPC ........ *H02M 3/1582* (2013.01); *H03F 1/0227* (2013.01); *H03F 3/245* (2013.01)

(58) Field of Classification Search
CPC .... H02M 1/007; H02M 1/0077; H02M 1/009; H02M 1/0093; H02M 1/0095; H02M 3/07; H02M 3/1566; H02M 3/158; H03F 1/0227; H03F 3/245
See application file for complete search history.

(56) References Cited

U.S. PATENT DOCUMENTS

| | | | | |
|---|---|---|---|---|
| 7,746,041 | B2 | 6/2010 | Xu et al. | |
| 7,777,459 | B2 | 8/2010 | Williams | |
| 7,782,027 | B2 | 8/2010 | Williams | |
| 7,786,712 | B2 | 8/2010 | Williams | |
| 7,812,579 | B2 | 10/2010 | Williams | |
| 7,977,927 | B2 | 7/2011 | Williams | |
| 8,026,763 | B2 | 9/2011 | Dawson et al. | |
| 8,164,384 | B2 | 4/2012 | Dawson et al. | |
| 8,212,541 | B2 | 7/2012 | Perreault et al. | |
| 8,824,978 | B2 | 9/2014 | Briffa et al. | |
| 8,829,993 | B2 | 9/2014 | Briffa et al. | |
| 8,830,709 | B2 | 9/2014 | Perreault et al. | |
| 8,830,710 | B2 | 9/2014 | Perreault et al. | |
| 8,860,396 | B2 | 10/2014 | Giuliano | |
| 8,957,645 | B2 * | 2/2015 | Glovinski | H02M 7/5387 323/259 |
| 8,957,727 | B2 | 2/2015 | Dawson et al. | |
| 9,020,453 | B2 | 4/2015 | Briffa et al. | |
| 9,160,287 | B2 | 10/2015 | Briffa et al. | |
| 9,166,536 | B2 | 10/2015 | Briffa et al. | |
| 9,172,336 | B2 | 10/2015 | Briffa et al. | |
| 9,209,758 | B2 | 12/2015 | Briffa et al. | |
| 9,444,329 | B2 | 9/2016 | Arno | |
| 9,490,752 | B2 | 11/2016 | Briffa et al. | |
| 9,531,291 | B2 | 12/2016 | Perreault | |
| 9,537,456 | B2 | 1/2017 | Briffa et al. | |
| 9,634,577 | B2 | 4/2017 | Perreault | |
| 9,755,672 | B2 | 9/2017 | Perreault et al. | |
| 9,768,731 | B2 | 9/2017 | Perreault et al. | |
| 9,768,732 | B2 | 9/2017 | Briffa et al. | |
| 9,917,517 | B1 | 3/2018 | Jiang et al. | |
| 9,979,421 | B2 | 5/2018 | Astrom et al. | |
| 9,991,913 | B1 | 6/2018 | Dinur et al. | |
| 10,075,080 | B1 * | 9/2018 | Scoones | H02M 3/07 |
| 10,164,577 | B2 | 12/2018 | Briffa et al. | |
| 10,193,441 | B2 | 1/2019 | Giuliano | |
| 10,291,126 | B1 * | 5/2019 | Wei | H02M 3/158 |
| 10,291,184 | B1 | 5/2019 | Sutskover et al. | |
| 10,389,235 | B2 | 8/2019 | Giuliano | |
| 10,658,981 | B2 | 5/2020 | Briffa et al. | |
| 10,727,747 | B2 * | 7/2020 | Macri | H02M 7/4837 |
| 10,749,476 | B2 | 8/2020 | Sutskover et al. | |
| 10,756,623 | B1 * | 8/2020 | Petersen | H02M 1/088 |
| 10,790,742 | B1 * | 9/2020 | Petersen | H02M 3/07 |
| 10,811,974 | B1 * | 10/2020 | Petersen | H02M 3/1582 |
| 10,840,805 | B2 | 11/2020 | Perreault et al. | |
| 10,862,428 | B2 | 12/2020 | Henzler et al. | |
| 10,992,265 | B2 | 4/2021 | Hoversten et al. | |
| 11,043,918 | B2 | 6/2021 | Tanaka et al. | |
| 11,191,028 | B2 | 11/2021 | Hoversten et al. | |
| 11,245,330 | B2 | 2/2022 | Giuliano et al. | |
| 11,245,367 | B2 * | 2/2022 | Garrett | H02M 1/0095 |
| 11,387,666 | B2 * | 7/2022 | Dalena | H02J 7/06 |
| 11,469,672 | B2 * | 10/2022 | Chang | H02M 3/1584 |
| 11,496,051 | B2 * | 11/2022 | Petersen | H02M 3/1582 |
| 11,558,014 | B2 | 1/2023 | Tanaka et al. | |
| 11,637,531 | B1 | 4/2023 | Perreault et al. | |
| 11,664,727 | B2 | 5/2023 | Giuliano et al. | |
| 11,728,727 | B2 * | 8/2023 | Muto | H02M 1/346 327/536 |
| 11,742,804 | B2 * | 8/2023 | Khlat | H03F 3/19 330/291 |
| 11,757,411 | B2 | 9/2023 | Tanaka et al. | |
| 11,764,681 | B2 * | 9/2023 | Cannillo | H02M 3/158 323/271 |
| 11,848,612 | B2 * | 12/2023 | Cannillo | H02M 1/0009 |
| 12,021,452 | B2 | 6/2024 | Ye et al. | |
| 2002/0118556 | A1 * | 8/2002 | Johnson, Jr. | H02M 1/10 363/123 |
| 2004/0245972 | A1 * | 12/2004 | Vire | H02M 3/07 323/282 |
| 2008/0019459 | A1 | 1/2008 | Chen et al. | |
| 2008/0055946 | A1 * | 3/2008 | Lesso | H02M 3/1582 363/63 |
| 2010/0073084 | A1 | 3/2010 | Hur et al. | |
| 2010/0188065 | A1 * | 7/2010 | Shiwaya | H02M 3/07 323/299 |
| 2010/0194359 | A1 * | 8/2010 | Notman | H02M 3/1588 323/267 |
| 2013/0301314 | A1 | 11/2013 | Fu et al. | |
| 2014/0070787 | A1 * | 3/2014 | Arno | H02M 3/02 323/304 |
| 2015/0048891 | A1 * | 2/2015 | Rozek | H03F 3/245 330/297 |
| 2016/0248327 | A1 * | 8/2016 | Li | H02M 3/1584 |
| 2016/0344214 | A1 * | 11/2016 | Petersen | H02M 3/07 |
| 2017/0163157 | A1 * | 6/2017 | Petersen | H02M 1/0095 |
| 2018/0198416 | A1 | 7/2018 | Hur et al. | |
| 2020/0212704 | A1 * | 7/2020 | Eftimie | H02J 50/05 |
| 2020/0304021 | A1 * | 9/2020 | Khlat | H02M 3/158 |
| 2020/0328680 | A1 * | 10/2020 | Giuliano | H02M 3/158 |
| 2020/0366120 | A1 * | 11/2020 | Yuan | H02J 50/12 |
| 2021/0288614 | A1 | 9/2021 | Hoversten et al. | |
| 2021/0385752 | A1 | 12/2021 | Hoversten et al. | |
| 2021/0391786 | A1 * | 12/2021 | Petersen | H02M 3/155 |
| 2021/0391787 | A1 | 12/2021 | Peterson | |
| 2021/0399621 | A1 * | 12/2021 | Liu | H02M 3/01 |
| 2022/0103066 | A1 * | 3/2022 | Chen | H02M 3/04 |
| 2022/0131463 | A1 | 4/2022 | Giuliano et al. | |
| 2022/0149725 | A1 | 5/2022 | Garrett et al. | |
| 2023/0037874 | A1 * | 2/2023 | Petersen | H02M 1/0095 |
| 2023/0039458 | A1 * | 2/2023 | Petersen | H02M 3/1582 |
| 2023/0045186 | A1 * | 2/2023 | Petersen | G06F 1/3206 |
| 2023/0054485 | A1 * | 2/2023 | Hoversten | H03F 1/32 |
| 2023/0056740 | A1 | 2/2023 | Perreault et al. | |
| 2023/0057037 | A1 * | 2/2023 | Hoversten | H02M 1/0006 |
| 2023/0066436 | A1 | 3/2023 | Rutkowski | |
| 2023/0238887 | A1 * | 7/2023 | Lim | H02M 3/1582 |
| 2023/0344348 | A1 * | 10/2023 | Somani | H02M 1/36 |
| 2023/0378872 | A1 * | 11/2023 | Choi | H02M 3/158 |
| 2023/0412073 | A1 * | 12/2023 | Ge | H02M 3/01 |
| 2024/0235370 | A1 * | 7/2024 | Liu | H02M 3/07 |
| 2024/0334142 | A1 * | 10/2024 | Mai | H02M 1/007 |
| 2024/0429818 | A1 * | 12/2024 | Perreault | H02M 1/0095 |
| 2025/0309769 | A1 * | 10/2025 | Perreault | H02M 1/0019 |
| 2025/0309829 | A1 * | 10/2025 | Cook | H03F 1/0227 |
| 2025/0309830 | A1 * | 10/2025 | Gazder | H02M 3/1584 |
| 2025/0309832 | A1 * | 10/2025 | Perreault | H02M 3/1582 |

OTHER PUBLICATIONS

U.S. Appl. No. 18/753,510, filed Jun. 25, 2024, Perreault et. al.
U.S. Appl. No. 18/753,506, filed Jun. 25, 2024, Perreault et. al.
U.S. Appl. No. 18/753,499, filed Jun. 25, 2024, Perreault et. al.
U.S. Appl. No. 18/753,494, filed Jun. 25, 2024, Perreault et. al.
U.S. Appl. No. 18/925,683, filed Oct. 24, 2024, Hoversten et al.
U.S. Appl. No. 18/796,757, filed Aug. 7, 2024, Perreault et al.
U.S. Appl. No. 18/796,715, filed Aug. 7, 2024, Perreault et al.
U.S. Appl. No. 18/924,197, filed Oct. 23, 2024, Cook et al.
U.S. Appl. No. 18/946,173, filed Nov. 13, 2024, Gazder et al.
U.S. Appl. No. 18/796,713, filed Aug. 7, 2024, Perreault et al.
Yousefzadeh et al., "Three-Level Buck Converter for Envelope Tracking Applications", IEEE Transactions on Power Electronics, vol. 21, No. 2, Mar. 2006; 4 pages.

(56) References Cited

OTHER PUBLICATIONS

F. Raab, "Average Efficiency of Class-G Power Amplifiers", IEEE Transactions on Consumer Electronics, vol. 32, No. 2, May 1986; 6 pages.
Redl and Sokal, "Near Optimum Dynamic Regulation of DC-DC Converters Using Feed-Forward of Output Current and Input Voltage with Current-Mode Control", IEEE Transactions on Power Electronics, vol. PE-1, No. 3, Jul. 1986; 12 pages.
Yeung, et al.; "Multiple and Fractional Voltage Conversion Ratios for Switched-capacitor Resonant Converters"; 2001 IEEE 32nd Annual Power Electronics Specialists Conference (IEEE Cat. No. 01CH37230); Jun. 17-21, 2001; 6 Pages.
Ma et al., "A Pseudo-CCM/DCM SIMO Switching Converter With Freewheel Switching", IEEE Journal of Solid-State Circuits, vol. 38, No. 6, Jun. 2003; 8 pages.
Shoyama, et al.; "Resonant Switched Capacitor Converter with High Efficiency"; 2004 $35^{th}$ Annual IEEE Power Electronics Specialists Conference; 2004; 7 Pages.
Sun, et al.; "High Power Density, High Efficiency System Two-Stage Power Architecture for Laptop Computers"; 2006 37th IEEE Power Electronics Specialists Conference; Jun. 18-22, 2006; 7 Pages.
Karppanen et al, "Dynamical Characterization of Peak-Current-Mode-Controlled Buck Converter with Output-Current Feedforward", IEEE Transactions on Power Electronics, vol. 22, No. 2, Mar. 2007; 8 pages.
Choi et al, "A ΔΣ-Digitized Polar RF Transmitter", IEEE Transactions on Microwave Theory and Techniques, vol. 55, No. 12, Dec. 2007; 12 pages.
Le et al., "A Single-Inductor Switching DC-DC Converter with Five Outputs and Ordered Power-Distributive Control", IEEE Journal of Solid-State Circuits, vol. 42, No. 12, Dec. 2007; 9 pages.
Seeman and Sanders, "Analysis and Optimization of Switched-Capacitor DC-DC Converters", IEEE Transactions on Power Electronics, vol. 23, No. 2, Mar. 2008; 11 pages.
Vasic et al., "Comparison of Two Multilevel Architectures for Envelope Amplifier", IEEE Industrial Electronics Conference, Feb. 2009; 7 pages.
Vasic et al., "Multilevel Power Supply for High Efficiency RF Amplifiers", IEEE Applied Power Electronics Conference, Feb. 2009; 6 pages.
Walling et al., "A Class-G Supply Modulator and Class-E PA in 130 nm CMOS", IEEE Journal of Solid-State Circuits, vol. 44, No. 9, Sep. 2009; 9 pages.
Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 pages.
Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.
Pilawa-Podgurski et al., "Merged Two-Stage Power Converter with Soft-Charging Switched-Capacitor Stage in 180 nm Cmos", IEEE Journal of Solid-State Circuits, vol. 47, No. 7, Jul. 2012; 11 pages.
Chen, et al; "A High Efficiency High Power Step-Up Resonant Switched-Capacitor"; 2012 IEEE Energy Conversion Congress and Exposition (ECCE); Sep. 15-20, 2012; 5 pages.
Godoy et al. "A 2.4-GHz, 27-dBm Asymmetric Multilevel Outphasing Power Amplifier in 65-nm CMOS", IEEE Journal of Solid-State Circuits, vol. 47, No. 10, Oct. 2012; 13 pages.
Park et al., "An 83% Peak Efficiency and $1.07W/mm^2$ Power Density Single Inductor 4-Output DC-DC Converter with Bang-Bang $Zero^{th}$-Order Control", IEEE Asian Solid-State Circuits Conference, 5-2, Nov. 10-12, 2014; 4 pages.
Schaef and Stauth, "A 3-Phase Resonant Switched Capacitor Converter Delivering 7.7 W at 85% efficiency using 1.1 nH PCB Trace Inductors", IEEE Journal of Solid-State Circuits, vol. 50, No. 12, Dec. 2015; 9 pages.
Schaef and Stauth, "A Highly-Integrated Series-Parallel Switched-Capacitor Converter with 12 V input and Quasi-Resonant Voltage-Mode Regulation", IEEE Journal of Emerging and Selected Topics in Power Electronics, vol. 6, No. 2, Oct. 11, 2017; 10 pages.
Unknown; "Fundamentals of Power Electronics"; Chapter 19: Resonant Conversion; Sep. 19, 2019; 87 pages.
PCT International Search Report and Written Opinion dated Jul. 25, 2025, for PCT International Application No. PCT/US2025/021280; 14 pages.
PCT International Search Report and Written Opinion dated Jul. 14, 2025, for PCT International Application No. PCT/US2025/021288; 12 pages.
U.S. Appl. No. 19/530,935, filed Feb. 5, 2026, Hoversten et al.
U.S. Appl. No. 19/530,971, filed Feb. 5, 2026, Perreault et al.
Office Action dated Mar. 11, 2026, for U.S. Appl. No. 18/796,715; 21 pages.
Restriction Requirement dated Mar. 2, 2026, for U.S. Appl. No. 18/796,713; 9 pages.
Response to Restriction Requirement dated Mar. 2, 2026, for U.S. Appl. No. 18/796,713; Response filed Apr. 28, 2026; 3 pages.
Office Action dated May 20, 2026, for U.S. Appl. No. 18/796,713; 23 pages.

* cited by examiner

600

NON-RIGHT-HALF-PLANE-ZERO POWER CONVERSION ARCHITECTURES WITH TRI-PHASE OPERATION AND RELATED CIRCUITS AND TECHNIQUES

CROSS-REFERENCE TO RELATED APPLICATIONS

This application claims the benefit under 35 U.S.C. § 119 of U.S. Provisional Patent Application No. 63/570,470, filed on Mar. 27, 2024, which is hereby incorporated by reference herein in its entirety.

BACKGROUND

The efficiency of radio-frequency (RF) power amplifiers (PAS) can be improved through "supply modulation" (or "drain modulation" or "collector modulation"), in which the power supply voltage provided to the PA is adjusted dynamically ("modulated") over time depending upon the RF signal being synthesized. For the largest efficiency improvements, supply voltage can be adjusted among discrete voltage levels or continuously on a short time scale that tracks or dynamically accommodates rapid variations in RF signal amplitude (or envelope). These rapid variations in the RF signal may occur, for example, as data is encoded in the RF signal or as the RF signal amplitude is desired to be changed with high envelope bandwidth (e.g., as in envelope tracking, envelope tracking advanced, polar modulation, "class G" power amplification, multilevel back-off, multilevel linear amplifier with nonlinear components (LINC), asymmetric multilevel out-phasing (AMO)). The power supply voltage (or voltage levels) provided to the PA may also be adapted to accommodate longer-term changes in a desired RF envelope. This is sometimes referred to as "adaptive bias." Such "longer term changes" may, for example, be associated with adapting transmitter output strength to reduce, and ideally minimize, errors in data transfer, or adapting transmitter output strength for RF "traffic" variations, etc.

"Continuous" supply modulation (e.g., "envelope tracking" or "adaptive bias") may be advantageously realized by dynamically selecting an intermediate voltage from among a set of discrete power supply voltages and then further regulating (e.g., stepping down) this intermediate voltage to create a continuously-variable supply voltage to be provided to the power amplifier. "Continuous" supply modulation may alternatively be realized by pulse-width modulating between two or more voltage levels and filtering the output to create a continuously varying waveform. Some RF amplifier systems utilize "discrete" supply modulation (or discrete "drain modulation") in which the supply voltage is switched among a set of discrete voltage levels. Some of these systems include additional filtering or modulation to shape the voltage transitions among levels. Systems of this type are known and include, for example, "class G" amplifiers, multi-level LINC (MLINC) power amplifiers, AMO power amplifiers, multilevel back-off amplifiers (including "asymmetric multilevel back-off" amplifiers) and digitized polar transmitters, among other types.

Hybrid systems which utilize a combination of continuous and discrete supply modulation may also be realized.

SUMMARY

Described herein are concepts, systems, system architectures, circuits, methods, and techniques for power management. In particular, described are concepts, systems, system architectures, circuits, methods, and techniques for power management involving power converters (or more simply "converters") that do not exhibit a right-half-plane-zero in their linearized, averaged control-to-output transfer functions, which are referred to herein as non-right-half-plane-zero (NRHPZ) converters. The concepts, systems, system architectures, circuits, methods, and techniques described herein may find use in a wide variety of applications including, but not limited to, mobile handset applications, as well as in numerous other power management applications.

In some embodiments, circuits are described that include NRHPZ converters and that have buck and boost functionality. For example, these circuits may include converters that have a switched-capacitor stage and a magnetic stage. In some embodiments, these circuits may include switches that are rated for voltages above the voltage of the input voltage from the energy source. In some embodiments, these circuits may include switches that are only rated as high as the voltages of the input voltage from the energy source. In some embodiments, these circuits may incorporate a flying capacitor for energy transfer to support voltages above the input voltage from the energy source. In some embodiments, these circuits may incorporate an interleaved switched-capacitor stage and a magnetic stage. In some embodiments, these circuits may incorporate a magnetic stage and a switched-capacitor multiple output stage. In some embodiments, these circuits may incorporate a magnetic stage and both an interleaved switched-capacitor stage and switched-capacitor multiple output stage.

In some embodiments, circuits are described that include NRHPZ converters that have buck and boost functionality and a reconfigurable front end. For example, these circuits may include converters that have a reconfigurable switched-capacitor stage and a magnetic stage. In some embodiments, these circuits may include an interleaved reconfigurable switched-capacitor stage and a magnetic stage. In some embodiments, these circuits may include a first magnetics-based front-end stage and a second magnetics stage. In some embodiments, these circuits may include switches that are rated for voltages above the voltage of the input voltage from the energy source. In some embodiments, these circuits may include switches that are only rated as high as the voltages of the input voltage from the energy source.

In some embodiments, circuits are described that include NRHPZ converters that have buck and boost functionality and that do not require a front-end stage. For example, these circuits may include converters that utilize a flying capacitor to provide switching voltage levels greater than the input voltage of the energy source. In some embodiments, these circuits may utilize an interleaved flying capacitor circuit to provide switching voltage levels greater than the input voltage of the energy source.

In some embodiments, circuits are described that include NRHPZ converters that have buck and boost functionality and that utilize multiple-output architectures. For example, these circuits may include converters that utilize multiple NRHPZ converters, with inputs of the NRHPZ converters connected to an energy source, and with each of the NRHPZ converters having an output connected to an input of a switched-capacitor converter. In some embodiments, these circuits may include multiple NRHPZ converters connected in cascade, with each of the NRHPZ converters having an output connected to an input of a switched-capacitor converter. In some embodiments, these circuits may include multiple NRHPZ converters that share a "boosting" switched-capacitor front-end stage or magnetic front-end stage. In some embodiments, these circuits may include multiple NRHPZ converters, each connected to a switched-capacitor multiple output converter. In some embodiments, these circuits may include an NRHPZ converter connected with a switched-capacitor multiple output converter. In some embodiments, these circuits may include an NRHPZ converter connected with a switched-capacitor front end and a switched-capacitor multiple output converter.

In some embodiments, circuits are described that include NRHPZ converters that have buck and boost functionality and that utilize tri-phase operation. In some embodiments, these circuits may transition between two-phase operation and three-phase operation.

In accordance with some embodiments, a power converter is provided. The power converter has a pair of input terminals configured to be connected to terminals of a voltage source and has a pair of output terminals configured to be coupled to a load. The power converter comprises an inductor, a plurality of switches, and one or more controllers. The one or more controllers are configured to control the switches to selectively couple a first end of the inductor to a first one of the pair of input terminals in a first switch state. The one or more controllers are also configured to control the switches to selectively couple the first end of the inductor to a second one of the pair of input terminals in a second switch state. The one or more controllers are further configured to control the switches to selectively couple the first end of the inductor to a first voltage level greater than a voltage at the input terminals in a third switch state.

In some embodiments, the power converter is configured to provide an output voltage at the output terminals that is between zero volts and twice the voltage at the input terminals.

In further embodiments, the power converter is configured to provide an output voltage at the output terminals without incurring a right-half-plane zero in a control-to-output transfer function of the power converter.

In still further embodiments, the one or more controllers are further configured to synthesize an output voltage at the output terminals by controlling the switches in accordance with the first switch state during a first phase of a switching cycle of the power converter, controlling the switches in accordance with the third switch state during a second phase of the switching cycle, and controlling the switches in accordance with the second switch state during a third phase of the switching cycle.

In some embodiments, the switching cycle is a first switching cycle of the power converter, and the one or more controllers are further configured to control the switches in only two phases of a second switching cycle of the power converter by controlling the switches in accordance with a first one of the first switch state, the second switch state, or the third switch state during a first phase of the two phases of the second switching cycle, and controlling the switches in accordance with a second one of the first switch state, the second switch state, or the third switch state during a second phase of the two phases of the second switching cycle, wherein the first one and the second one are different.

In further embodiments, the one or more controllers are further configured to synthesize an output voltage at the output terminals that is lower than the voltage at the input terminals by controlling the switches in accordance with the first switch state during a first phase of a switching cycle of the power converter, and controlling the switches in accordance with the second switch state during a second phase of the switching cycle of the power converter.

In still further embodiments, the one or more controllers are further configured to synthesize an output voltage at the output terminals that is higher than the voltage at the input terminals by controlling the switches in accordance with the third switch state during a first phase of a switching cycle of the power converter, and controlling the switches in accordance with the first switch state during a second phase of the switching cycle of the power converter.

In some embodiments, the power converter further comprises a front-end stage configured to generate the first voltage level.

In further embodiments, the front-end stage comprises at least one of an inductor or a capacitor.

In still further embodiments, the front-end stage is reconfigurable to provide the first voltage level at different voltage levels.

In some embodiments, the one or more controllers are further configured to receive one or more signals corresponding to a load current and to provide feedforward control to generate a desired output voltage level at the output terminals based on the one or more signals.

In further embodiments, the power converter further comprises an output stage. The output stage is configured to receive a current from a second end of the inductor, charge a first capacitor with the current during a first portion of a switching cycle of the output stage, charge a second capacitor with the current during a second portion of the switching cycle of the output stage, provide a first output voltage level at a first output terminal, and provide a second output voltage level at a second output terminal.

In still further embodiments, the one or more controllers are further configured to control the switches to selectively couple a second voltage level greater than the voltage at the input terminals to the first end of the inductor in a fourth switch state.

In some embodiments, the one or more controllers are further configured to control the plurality of switches to synthesize an output voltage by controlling the switches in accordance with the first switch state during a first phase of a first switching cycle of the power converter, controlling the switches in accordance with the third switch state during a second phase of the first switching cycle, controlling the switches in accordance with the second switch state during a third phase of the first switching cycle, controlling the switches in accordance with the first switch state during a first phase of a second switching cycle of the power converter, controlling the switches in accordance with the fourth switch state during a second phase of the second switching cycle, and controlling the switches in accordance with the second switch state during a third phase of the second switching cycle.

In further embodiments, the one or more controllers are further configured to determine which of the first switch state, the second switch state, or the third switch state to implement during each phase of a switching cycle of the power converter prior to the switching cycle.

In still further embodiments, the one or more controllers are further configured to determine which of the first switch state, the second switch state, or the third switch state to implement during a phase of a switching cycle of the power converter during the switching cycle.

Furthermore, in accordance with some embodiments, there is provided a method for controlling a power converter. The method comprises controlling, by one or more controllers, a plurality of switches to selectively couple a first end of an inductor to a first one of a pair of input terminals of a voltage source in a first switch state. The method also comprises controlling, by the one or more controllers, the switches to selectively couple the first end of the inductor to a second one of the pair of input terminals of the voltage source in a second switch state. The method further comprises controlling, by the one or more controllers, the switches to selectively couple the first end of the inductor to a first voltage level greater than a voltage at the input terminals in a third switch state.

In some embodiments, the method further comprises controlling, by the one or more controllers, the switches to provide an output voltage at output terminals of the power converter without incurring a right-half-plane zero in a control-to-output transfer function of the power converter.

In further embodiments, the method further comprises controlling, by the one or more controllers, the switches in accordance with the first switch state during a first phase of a switching cycle of the power converter. The method also comprises controlling, by the one or more controllers, the switches in accordance with the third switch state during a second phase of the switching cycle. The method still further comprises controlling, by the one or more controllers, the switches in accordance with the second switch state during a third phase of the switching cycle.

In still further embodiments, the switching cycle is a first switching cycle of the power converter and the one or more controllers further control the switches in only two phases of a second switching cycle of the power converter. The method further comprises controlling, by the one or more controllers, the switches in accordance with a first one of the first switch state, the second switch state, or the third switch state during a first phase of the two phases of the second switching cycle. The method still further comprises controlling, by the one or more controllers, the switches in accordance with a second one of the first switch state, the second switch state, or the third switch state during a second phase of the two phases of the second switching cycle, wherein the first one and the second one are different.

Before explaining example embodiments consistent with the present disclosure in detail, it is to be understood that the disclosure is not limited in its application to the details of constructions and to the arrangements set forth in the following description or illustrated in the drawings. The disclosure is capable of being practiced and carried out in various ways. Also, it is to be understood that the phraseology and terminology employed herein, as well as in the abstract, are for the purpose of description and should not be regarded as limiting.

It is to be understood that both the foregoing general description and the following detailed description are explanatory only and are not restrictive of the claimed subject matter.

BRIEF DESCRIPTION OF THE DRAWINGS

The accompanying drawings, which are incorporated in and constitute part of this specification, and together with the description, illustrate and serve to explain the principles of various example embodiments.

DETAILED DESCRIPTION

Figure 1A:
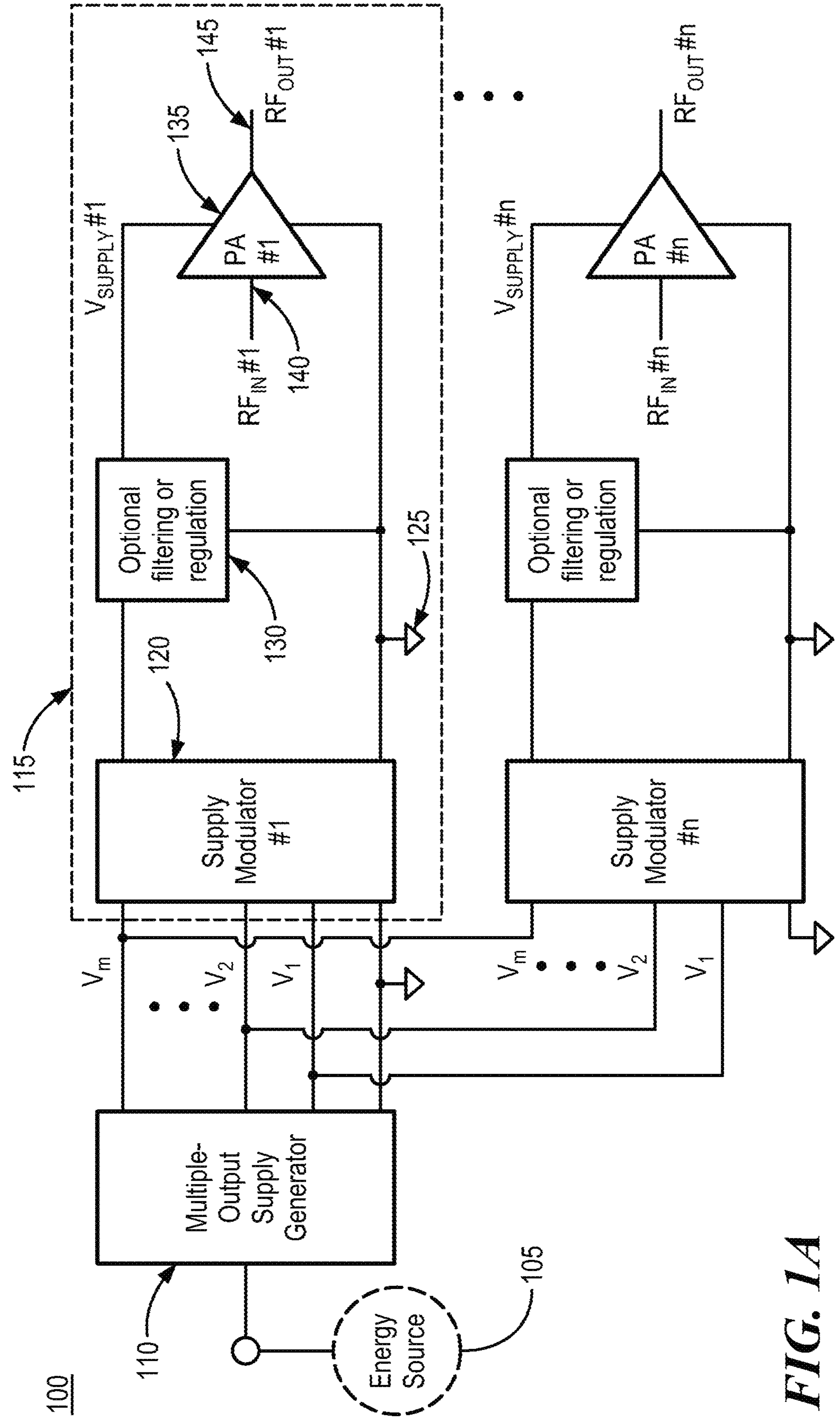
FIG. 1A is a block diagram of an example radio frequency (RF) power amplifier (PA) system utilizing multiple supply levels and supply modulators to select from the multiple supply levels.

Reference will now be made in detail to the embodiments of the disclosure, certain examples of which are illustrated in the accompanying drawings.

In the following description, numerous specific details are set forth regarding the concepts, circuits, systems, system architectures, methods, and techniques of the disclosed subject matter, and the environment in which such concepts, circuits, systems, system architectures, methods, and techniques operate, to provide a thorough understanding of the disclosed subject matter. After reading the descriptions provided herein, it will be apparent to one skilled in the art, however, that the disclosed subject matter may be practiced without such specific details. It will also be apparent to one skilled in the art that certain features, which are well known within the art, are not described in detail to avoid unnecessary complication of the description of the concepts, circuits, systems, system architectures, methods, and techniques described herein. In addition, it will be understood that the embodiments provided below are examples, and that it is contemplated that there are other concepts, circuits, systems, system architectures, methods, and techniques that are within the scope of the subject matter disclosed herein.

The disclosure herein includes discussion of certain concepts that would be understood by one of ordinary skill in the art, and so are not discussed in greater detail so as to avoid unnecessary complication of the description of the concepts, circuits, systems, system architectures, methods, and techniques described herein. For example, a person of ordinary skill in the art would recognize that connections between components (e.g., amplifiers, inductors, resistors, capacitors, switches, diodes, sources, subsystems) described herein may be realized with wires, circuit board traces on a printed circuit board (PCB) or any other way of electrically and/or mechanically connecting components together. A person of ordinary skill in the art will further understand that connection may mean an electrical connection, a mechanical connection or both an electrical and mechanical connection.

A person of ordinary skill in the art would further understand what is meant when discussing certain circuit components or subsystems herein, such as inductors, resistors, capacitors, switches, amplifiers, filters, and energy sources. For example, a switch may be implemented as a metal oxide semiconductor field effect transistor (MOSFET), bipolar junction transistor (BJT), silicon-controlled rectifier (SCR), insulated gate bipolar transistor (IGBT), diode, or any other component known by one skilled in the art to provide a switching function in electronics. A person of ordinary skill in the art would recognize how to drive (i.e., provide bias and/or control signals to) these components to switch between an "on" state in which current flows through the component and an "off" state in which current does not flow through the component. A person of ordinary skill in the art would understand that these circuit components have terminals for connection to wires or circuit board traces. Thus, the description below and/or the claims may make reference to one or more terminals of a component to convey how that component is connected in relation to other components of the circuit. The term "energy storage element" as used herein should be considered to include any type of energy storage element (such as a capacitor or an inductor as just two examples).

A person of ordinary skill in the art would further recognize that electrical components may be imperfect and may fail at certain levels of current and/or voltage. As a result, components may be provided with ratings (e.g., a voltage rating or a current rating of the component) indicating a maximum level of electric current or voltage a component is designed to withstand, and beyond which the component might fail. A person of ordinary skill in the art would also understand that losses may occur in circuit components and connections. As a result, a person of skill in the art would recognize that, when discussing voltages and currents herein, those voltages and currents may be approximate, and in practice may be off by some degree from the described value (e.g., 1%-30% off from a described or target or ideal value).

The concepts, circuits, systems, system architectures, methods, and techniques described herein relate to power management and conversion. A person of ordinary skill in the art would understand certain concepts related to this topic. For example, a person of ordinary skill in the art would understand what is meant when describing certain types of power converters, such as a linear regulator or switched-mode power supply (SMPS). A person of ordinary skill in the art would further understand what is meant when describing certain types of SMPS power converters, such as buck converters, boost converters, buck-boost converters, or flyback converters. A person of ordinary skill in the art would understand that one or more switches of a SMPS are typically operated by a controller at a certain operating frequency (e.g., kHz to MHz range). A person of ordinary skill in the art would understand that these SMPS converters typically operate in two distinct phases per cycle of their operating frequency, a first phase in which one or more switches may be on, and a second phase in which the one or more switches may be off. Output voltage or current may be controlled by changing the period for which the one or more switches are on or off per cycle. The percentage of on time per cycle may be referred to as a duty cycle.

A person of ordinary skill in the art would understand that SMPS converters may be operated in different modes, such as a continuous conduction mode where current in an inductor never falls to zero in a cycle, and a discontinuous mode where current in an inductor does fall to zero in a cycle. A person of ordinary skill in the art would recognize that controllers in SMPS converters may receive feedback regarding one or more characteristics of the converter, and may modify one or more aspects of the converter accordingly, to achieve a desired output.

An energy source, as used herein, may be any type of energy source that provides a direct current (DC) voltage. For example, an energy source may be any type of battery, one example of which is a lithium-ion battery. An energy source may also be a DC source converted from an alternating current (AC) source, such as a DC source created by rectifying an AC source. A person of ordinary skill in the art would recognize that a power converter may have input terminals that connect to opposing terminals of the energy source to draw power from the energy source. A person of ordinary skill in the art would also recognize that a power converter may have output terminals configured to be coupled to a load.

The power management and conversion techniques described herein are described herein with respect to mobile applications, such as for use in mobile phones. However, the disclosure is not so limited. The techniques described herein may be applicable to any type of electronic device that uses power (e.g., mobile devices, laptops, tablets, personal computers, servers, televisions, base stations).

FIG. 1A shows an example of a radio frequency (RF) power amplifier (PA) system utilizing multiple supply levels, and supply modulators to select from the multiple supply levels. System 100 may utilize supply modulation for providing power to one or more RF power amplifiers 135 (e.g., as may be used in a mobile device). System 100 includes a supply generator 110 having an input configured to be coupled to an energy source 105, such as a battery (energy source 105 is here shown in phantom since it is not properly a part of system 100). Supply generator 110 receives an input signal (e.g., an input voltage) from energy source 105 and in response thereto may output different voltage levels (e.g., 0V, $V_1$, $V_2$, . . . . $V_m$) on different voltage rails (e.g., connections, or signal paths each having a certain voltage-such as 0V, $V_1$, $V_2$, . . . . $V_m$ as illustrated in FIG. 1A).

System 100 further includes a subsystem 115, including a supply modulator 120, optional filtering or regulation circuit 130, and power amplifier 135, all of which may be connected to the different voltage rails. For example, supply modulator 120 (e.g., supply modulator #1) may be connected to the voltage rails and may be configured to switch among the multiple voltages of the voltage rails. A filtering or regulation circuit 130 may optionally be connected to supply modulator 120 to filter or regulate the voltage signal selected by the supply modulator 120. The result may be a voltage supply (e.g., $V_{SUPPLY}$ #1) for powering a power amplifier (PA) 135 (e.g., PA #1). Power amplifier 135 may amplify an RF input signal 140 (e.g., $RF_{IN}$ #1), and the amplified RF signal may be output as RF output signal 145 (e.g., $RF_{OUT}$ #1). RF input signal 140 may be, for example, an RF signal to be amplified in a mobile device for wireless transmission as RF output signal 145.

As shown in FIG. 1A, system 100 may include any number of subsystems connected to the voltage rails, and connected with their inputs in parallel with each other. For example, system 100 may include any number of supply modulators (e.g., supply modulator #1, . . . , supply modulator #n), optional filtering or regulation circuits (e.g., optional filtering or regulation circuit #1, . . . , optional filtering or regulation circuit #n), and power amplifiers (e.g., power amplifiers PA #1, . . . , PA #n). A ground rail 125 may also be connected to various components in system 100. Given the example topology of system 100, the multiple subsystems may supply, from the same energy source 105 and supply generator 110, different powers (e.g., $V_{SUPPLY}$ #1 . . . . $V_{SUPPLY}$ #n) to any number of power amplifiers (e.g., PA #1, . . . , PA #n) based on each power amplifier's supply needs.

Although FIG. 1A illustrates system 100 as having one supply generator 110 supporting multiple power amplifiers, and one supply modulator and optional filtering or regulation circuit for each power amplifier, the disclosure is not so limited. A person of ordinary skill in the art would recognize, for example, that multiple supply generators may be used to generate any number of voltage rails, and that a single supply modulator and/or filtering or regulation circuit may be used to provide a supply voltage to multiple power amplifiers.

Figure 1B:
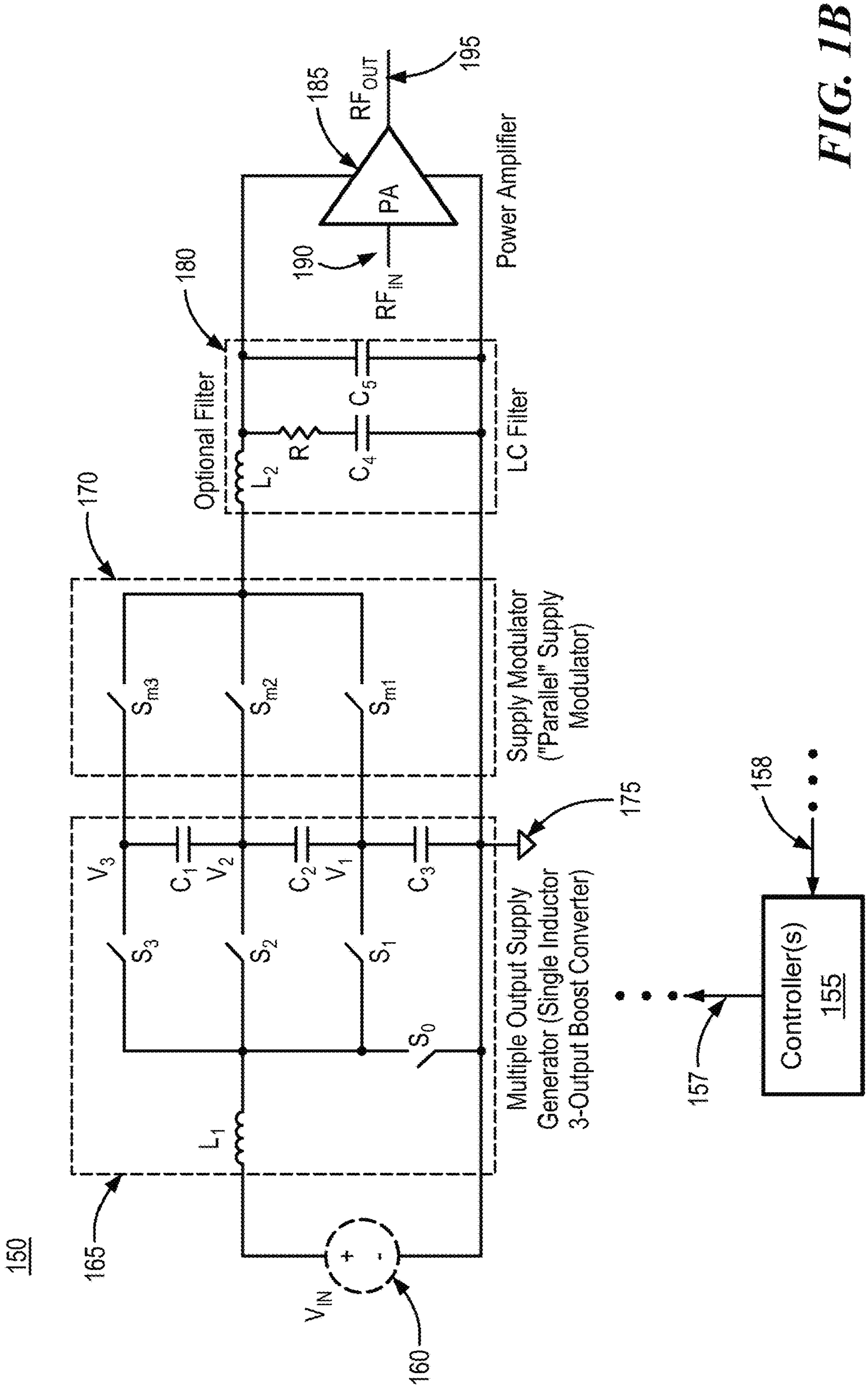
FIG. 1B is a block diagram of an example RF amplifier system including a multiple-output supply generator comprising a single-inductor multiple-output boost converter, a supply modulator and a filter.

FIG. 1B shows another example system 150 that may utilize supply modulation for providing power to a power amplifier 185 of an RF system. System 150 of FIG. 1B may include an energy source 160, supply generator 165, supply modulator 170, optional filter 180, and power amplifier 185. For example, supply generator 165 may be implemented with a boost converter circuit (e.g., single inductor 3-output boost converter) that includes a single inductor (e.g., $L_1$), three capacitors (e.g., $C_1$, $C_2$, $C_3$), and four switches (e.g., $S_0$, $S_1$, $S_2$, $S_3$). Supply modulator 170 may be implemented with 3 switches (e.g., $S_{m1}$, $S_{m2}$, $S_{m3}$) with one terminal of each switch connected in common. Optional filter circuit 180 may be implemented as an LC (inductor, capacitor) filter with an inductor (e.g., $L_2$) connected in series with the supply input to power amplifier 185, a resistor (e.g., R) and capacitor (e.g., $C_4$) connected in series with one another and in parallel with power amplifier 185, and a capacitor (e.g., $C_5$) connected in parallel with power amplifier 185. A ground rail 175 may be connected to various components in circuit 150. Power amplifier 185 may amplify an input RF signal 190 (e.g., $RF_{IN}$) and output the amplified RF signal as an output RF signal 195 (e.g., $RF_{OUT}$). Although FIG. 1B illustrates an example implementation of a circuit 150, the disclosure is not so limited. A person of skill in the art would recognize that there are additional ways to construct a supply generator 165, supply modulator 170, and filter circuit 180.

In some embodiments, the circuitry illustrated for system 150 may be used to implement at least portions of system 100 of FIG. 1A. For example, supply generator 165 of FIG. 1B may be used as supply generator 110, supply modulator 170 may be used as supply modulator 120, and optional filter 180 may be used as optional filtering or regulation circuit 130.

One or more controllers 155 may operate to control switches in system 100 and/or system 150. For example, a person of skill in the art would recognize that the one or more controllers may be used to control the on/off states and on/off timing of switches $S_0$-$S_3$ and $S_{m1}$-$S_{m3}$ via one or more signal lines (e.g., circuit connections) 157, for example at high frequency. A person of skill in the art would recognize that, although only one signal line 157 is shown in FIG. 1B, system 150 may include a separate line from controller(s) 155 for each switch in system 150, to control each of the switches individually. Alternatively, some of the switches in system 150 may be controlled together with a single signal line, while others may be controlled individually with separate signal lines.

Figure 18A:
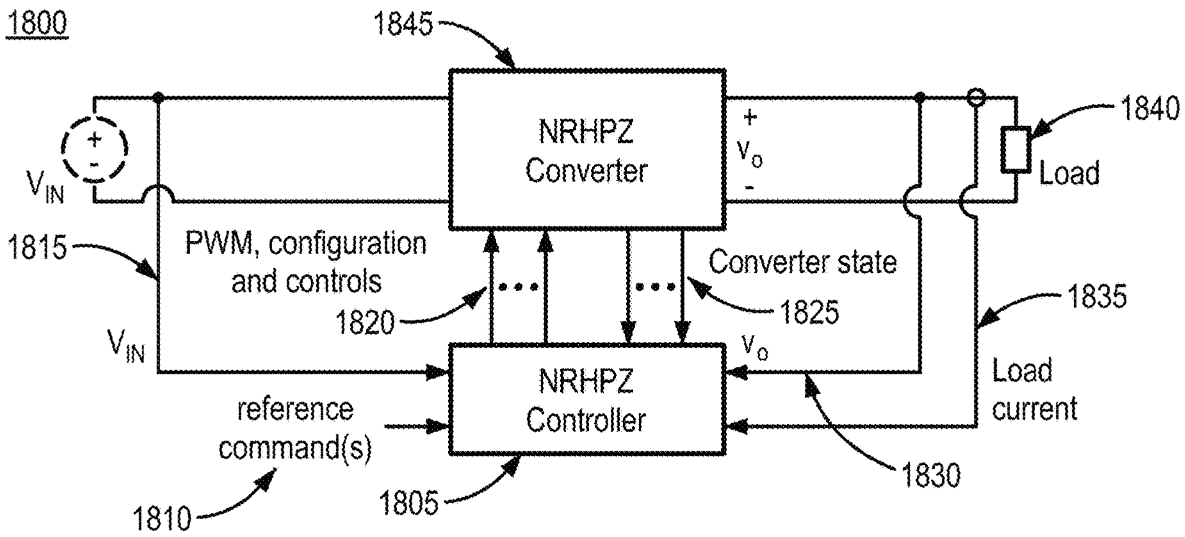
FIG. 18A is a block diagram of an example circuit showing how an NRHPZ controller may interact with and control an NRHPZ converter with various signaling and with various feedback and reference signals.
Figure 18B:
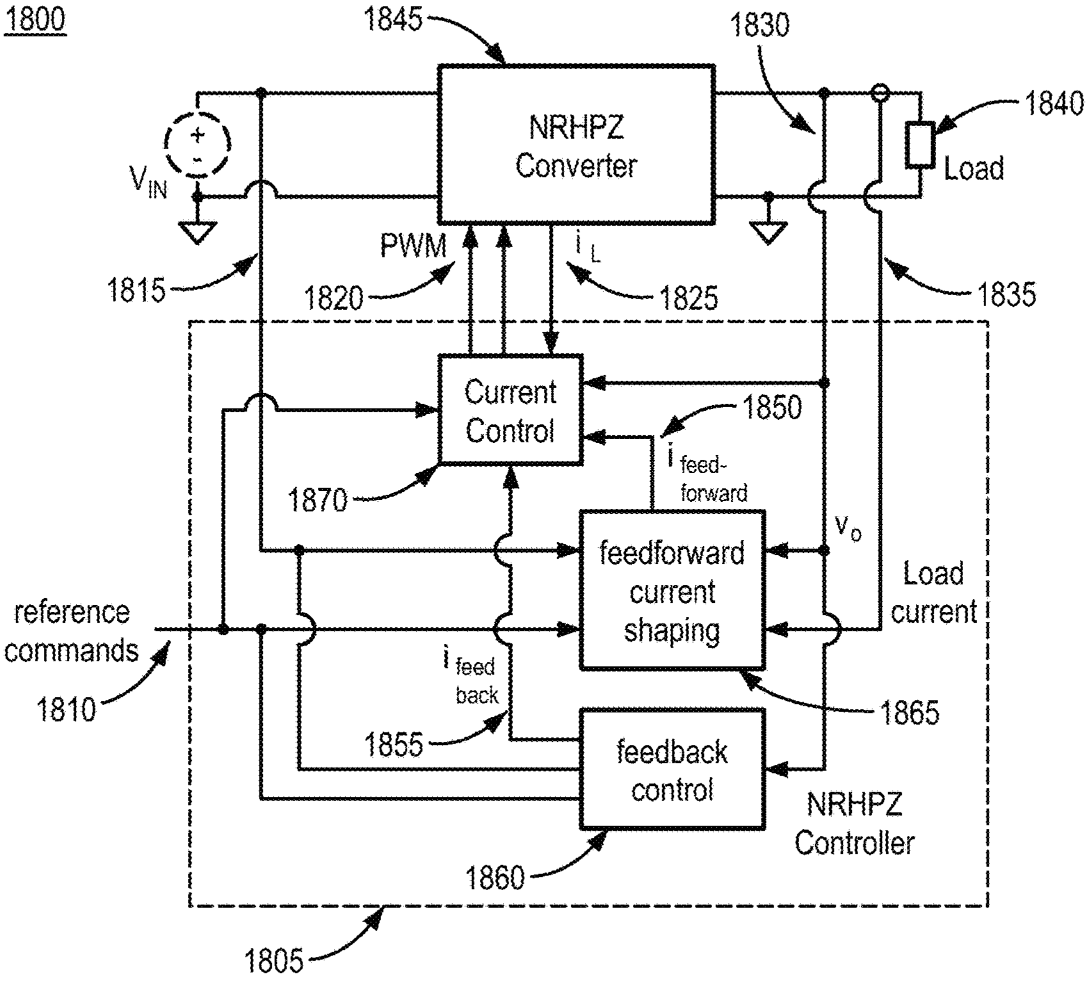
FIG. 18B is a block diagram of an example circuit showing in greater detailed inner workings of an NRHPZ converter.

Controller(s) 155 may be used to switch on/off states and timing of switches $S_0$-$S_3$ so as to charge 3 different capacitors $C_1$-$C_3$ to three different voltages $V_3$-$V_1$, respectively. Controller(s) may also be used to control on/off states and timing of switches $S_{m1}$-$S_{m3}$ to select from voltages $V_1$, $V_2$, $V_3$, respectively, for providing a selected voltage to optional filter 180 or power amplifier 185. A person of ordinary skill in the art would appreciate that controller(s) 155 may receive one or more input signals 158, such as feedback or feedforward signals, via one or more signal lines, for use in determining how to control switches $S_0$-$S_3$ and $S_{m1}$-$S_{m3}$. For example, controller(s) 155 may be connected to $V_{SUPPLY}$ to monitor the voltage at $V_{SUPPLY}$ or the current being supplied to power amplifier 185, and may change on/off states and/or timing of switches $S_0$-$S_3$ and/or $S_{m1}$-$S_{m3}$ to ensure a desired voltage or current is output. As another example, controller(s) 155 may monitor a RF signal amplitude of a RF signal (e.g., $RF_{IN}$ 190) and adjust on/off states and/or timing of switches $S_0$-$S_3$ and/or $S_{m1}$-$S_{m3}$ to adjust supply voltage or current to power amplifier 185 based on the RF signal amplitude. A person of skill in the art would recognize that any number of signals (e.g., input voltage $V_{IN}$, current drawn from energy source $I_{IN}$, inductor current ($i_{L1}$ and/or $i_{L2}$), voltages ($V_1$, $V_2$, $V_3$, and/or $V_{SUPPLY}$), current to PA 185) within circuit 150 may be monitored by controller(s) 155, and that controller(s) 155 may control the switches of circuit 150 based on these signals. In some embodiments, controller(s) 155 may comprise a feedforward current shaping controller, such as controller 1805 of FIG. 18A or 18B, and may connect to circuit 100 and/or circuit 150 as shown in FIG. 18A or 18B.

A person of ordinary skill in the art would further recognize that controller(s) 155 may include circuitry and/or subsystems. For example, controller(s) 155 may have internal components, such as resistors, capacitors, inductors, diodes, comparators, oscillators, clocks, digital logic components (e.g., latches, flip flops), and/or amplifiers, for use in controlling a frequency of operation of a converter and making determinations about how to control system 150 based on feedback/feedforward signal(s) 158. Controller(s) 155 may also include a voltage regulator or other power supply circuitry for powering controller(s) 155. Controller(s) may further include protection subsystems, such as voltage or current protection subsystems. These subsystems may, for example, prevent over voltage or under voltage conditions from occurring or over current or under current conditions from occurring, such as by sensing when a voltage or current is exceeding a predetermined value and by, for example, shutting the converter circuit down temporarily or otherwise mitigating such a condition in order to prevent destruction of components in the circuit.

In some embodiments, controller(s) 155 may include a processor and memory. The memory may be programmed with instructions, such that the processor, when executing the instructions, controls the switches of circuit 150 based on received feedback/feedforward signal(s) 158. In some embodiments, the components and/or subsystems of controller(s) 155 may be packaged together, such that controller(s) 155 is an integrated circuit (IC) containing these components/subsystems, for example.

Although not shown, controller(s) 155 may further receive an input command signal. For example, controller(s) 155 may be configured to receive commands from a user or other device that programs controller(s) 155 to perform certain functions, or to otherwise change the functioning of controller(s) 155.

A person of ordinary skill in the art would further recognize that subsystems within controller(s) 155 may themselves have circuitry. For example, subsystems within controller(s) 155 may have internal components, such as resistors, capacitors, inductors, diodes, comparators, oscillators, clocks, digital logic components (e.g., latches, flip flops), and/or amplifiers, for use in controlling a frequency of operation of a converter circuit and making determinations about how to control circuit 150 based on feedback/feedforward signal(s) 158. In some embodiments, a subsystem may itself include a processor and memory. The memory may be programmed with instructions, such that the processor, when executing the instructions, can output certain signals and/or commands based on certain input signals being received by the subsystem.

In some embodiments, one or more controllers may be used to operate some of the switches in a system, while one or more other controllers may be used to operate other switches in the system. For example, a first set of one or more controllers 155 may operate to control on/off states and on/off timing of switches $S_0$-$S_3$ via a first set of one or more signal lines (e.g., circuit connections) 157, thereby controlling supply generator 165. A second set of one or more controllers 155 may operate to control on/off states and on/off timing of switches $S_{m1}$-$S_{m3}$ via a second set of one or more signal lines (e.g., circuit connections) 157, thereby controlling supply modulator 170. In some embodiments, the first set of one or more controllers 155 may operate switches $S_0$-$S_3$ at a different frequency and/or duty cycle than the frequency and/or duty cycle at which the second set of one or more controllers 155 may operate switches $S_{m1}$-$S_{m3}$. In some embodiments, a first set of one or more controllers 155 may receive a first set of one or more feedback/feedforward signals 158 and a second set of one or more controllers 155 may receive a second set of feedback/feedforward signals 158 that may be different than the first set of feedback/feedforward signals 158.

The circuits illustrated in FIGS. 1A and 1B may be especially suitable for discrete supply modulation. As discussed above, the circuits illustrated in FIGS. 1A and 1B may include two subsystems: (a) a supply generator that synthesizes multiple power supply voltages from a single input source, and that possibly regulates one or more of those power supply voltages, and (b) one or more supply modulators that each rapidly switch among the power supply voltages provided by the supply generator to provide a modulated supply voltage to an RF power amplifier. How these two subsystems are best realized may depend upon the power level, voltage level, and application space of the RF amplifier system. For many applications where such a RF power amplifier system is used, such as in a mobile device (e.g., mobile phone), it may be desirable to monolithically integrate electronic elements of both the supply generator and the supply modulator on a single semiconductor die (e.g., in a complementary metal-oxide-semiconductor (CMOS) process). In some embodiments, it may be desirable to integrate electronics for the supply generator, supply modulator(s), and power amplifier(s) on a single die. In some embodiments (e.g., in high power applications), it may be desirable to implement the subsystems with discrete components connected on one or more printed circuit boards (PCBs).

Supply generators may be realized in a variety of different ways. For example, supply generators that provide a ratiometric set of output voltages may be realized through use of multiple separate converters, multiple-output magnetic converters, multiple-output switched-capacitor converters, and/or hybrid magnetic/switched-capacitor converters. Additionally, a multiple-output supply generator may be realized that creates two independently-controllable direct current (DC) voltages (e.g., with a magnetic conversion stage), and that further uses a differential capacitive energy transfer stage to realize one or more further DC supply voltages that are ratiometrically distributed between or around the two independently-controllable voltages. Each of these approaches may, however, have limitations that constrain the achievable size, cost, efficiency, and performance (e.g., modulation bandwidth) of supply-modulated RF amplifier systems.

Use of multiple separate power converters to generate multiple supply voltages is an approach that may yield a flexible solution, allowing each output voltage to be independently regulated to desired values independent of input voltage variations and providing the ability to continuously adjust output voltages over time (e.g., to provide for adaptive bias of the power amplifier). However, such a solution may be large and expensive, owing to the large numbers of physically large power supply components (e.g., magnetic components) that may be required. Single-inductor multiple-output converters, sometimes referred to as "SIMO" converters, may allow multiple output voltages to be independently regulated while only requiring a single magnetic component, somewhat mitigating the possible size challenges of multiple power converters. However, SIMO designs may utilize time-sharing of the inductor to supply the multiple outputs, such that performance and efficiency may degrade quickly and control complexity may increase quickly with increasing numbers of outputs. This characteristic may limit the efficacy of this approach in multi-level supply modulator systems, which may utilize between three and seven supply levels to achieve high performance (with even more levels potentially desirable in some cases).

Some types of power converters, such as multiple-output magnetic converters (e.g., multi-output flyback converters), multiple-output switched-capacitor converters, and hybrid magnetic/switched-capacitor converters, may yield multiple ratiometrically-related output voltages while reducing the numbers of magnetic components required as compared to using multiple independent power converters. Multiple-output magnetic converters may utilize transformers with scaled turns ratios to generate multiple ratiometrically-scaled output voltages. These designs may only regulate a single output, with the ratiometric relations of the other outputs approximately maintained by transformer turns ratios (unless additional "post regulation" is provided to the other outputs, such as through use of added linear regulators). The use of transformers may also hurt achievable efficiency in these designs (often to unacceptable levels), and such designs may suffer significant cross regulation among the outputs in practice (e.g., one output voltage may vary depending upon a load on a different output), which may result in undesirable performance in RF amplifier systems unless additional "post" regulation is used (which may further hurt performance).

Some limitations of these approaches to multiple-output supply generation may be resolved by using a hybrid magnetic/switched-capacitor circuit having ratiometrically-scaled outputs. In one example design, a magnetic regulation stage may independently regulate a single output voltage (independently of the system input voltage) with additional ratiometrically-related output voltages synthesized and enforced through the action of a switched-capacitor voltage balancer stage. For example, in a m-output supply generator, the magnetic stage may take an input voltage $V_X$ and regulate a single output voltage $V_Y$, with the switched capacitor voltage action synthesizing voltages $k_1*V_Y$, $k_2*V_Y$, . . . , $k_{m-1}*V_Y$, where constants $k_1$, . . . , $k_{m-1}$ are rational numbers determined by the circuit topology and/or switching pattern. Advantages of this approach may include relatively high efficiency and small size requirements for synthesizing multiple related output voltages and relative simplicity of control.

Another kind of hybrid capacitor/magnetic approach may utilize a magnetics-based power conversion system that can independently control two power supply voltages (e.g., $V_1$ and $V_m$), with an additional m−2 power supply voltages generated by a differentially-connected switched-capacitor converter. This may result in additional levels distributed in some prescribed relation to the two independently-controlled power supply voltages, such as spaced in an even fashion between them and/or around them (e.g., with adjacent voltage levels each separated by an approximate voltage $\Delta V$). For example, if a converter were to independently regulate $V_1$ and $V_m$ and space the other m−2 voltages provided to the power amplifier equally between them, this may result in m power supply voltages $V_k=V_1+(k-1)*(V_m-V_1)/(m-1)$ for k=1 . . . m.

While possibly not as flexible as providing truly independent control of all voltages, most of the practical benefits (e.g., in terms of power amplifier efficiency) may be gained using supply modulation, while avoiding the above-described limitations associated with truly independent voltage level control or ratiometric levels. Moreover, such a design may provide significant advantages in terms of size, cost, efficiency, and performance as compared with other approaches.

In another circuit variant, two regulated supply voltages may be generated and a hybrid supply generator/supply modulator may be exploited to provide more than two discrete voltage levels to a power amplifier. This may have the advantage of providing three or more voltage levels without the necessity of having a separate supply generator element generate these additional levels, cascaded with a supply modulator to select among the levels.

In some of the example circuits described above, it may be desirable to generate two independently-controlled outputs. Each of FIGS. 2A, 2B, and 2C shows an example circuit that may generate two independently-controlled outputs.

Figure 2A:
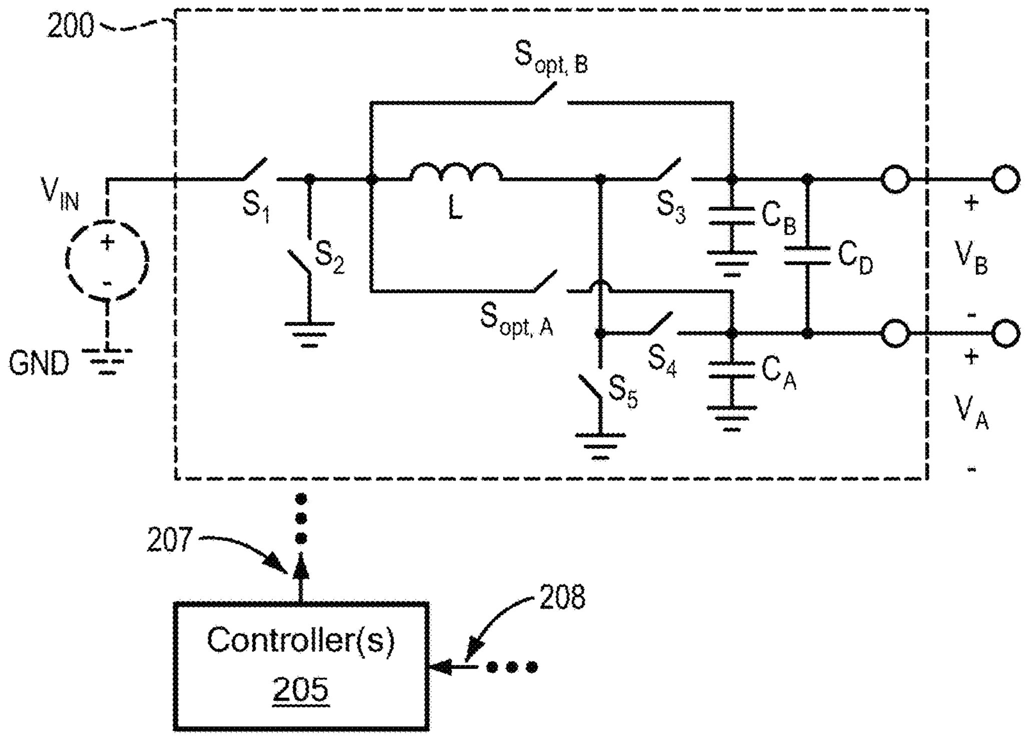
FIG. 2A is a schematic diagram of an example two-output single-input-multiple-output (SIMO) converter based on a 4-switch buck-boost converter.

FIG. 2A shows an example circuit 200, which may include a two-output single-input-multiple-output (SIMO) converter based on a 4-switch buck-boost converter. For example, inductor L, decoupling capacitor $C_B$, and switches $S_1$, $S_2$, $S_3$, and $S_5$ may operate together to form a 4-switch buck-boost converter with a first voltage output $V_B$ that may be higher or lower than $V_{IN}$. Inductor L, decoupling capacitor $C_A$, and switches $S_1$, $S_2$, $S_4$, and $S_5$ may operate together to form a 4-switch buck-boost converter with a second voltage output $V_A$ different than $V_B$ that may also be higher or lower than $V_{IN}$. A ground rail (GND) may be coupled to various components in the circuit. Additional optional switches (e.g., $S_{opt,A}$, $S_{opt,B}$) may be added to the circuit and coupled as shown to enable direct energy transfer from output $V_A$ to output $V_B$ or vice versa. In addition to individual output decoupling capacitors $C_A$ and $C_B$, a differential output decoupling capacitor $C_D$ may also be included.

One or more controller(s) 205 may control the switches (e.g., $S_1$, $S_2$, $S_3$, $S_4$, $S_5$, $S_{opt,\ A}$, $S_{opt,\ B}$) in circuit 200 to generate a desired output. Controller(s) 205 may be implemented as described for controller(s) 155 of FIG. 1B. It should be appreciated that although a single control line is illustrated in FIG. 2A, in embodiments two or more different signal line(s) 207 may be connected to switches $S_1$-$S_5$, $S_{opt,\ A}$, $S_{opt,\ B}$ for controlling the different switches of circuit 200. In embodiments, each switch may have its own control line connected thereto. Controller 205 may also receive one or more feedback/feedforward signals from circuit 200 via one or more feedback/feedforward signal line(s) 208 through which different feedback/feedforward signals may be received by controller 205. Such feedback/feedforward signals may be detected or otherwise measured or obtained by one or more sensors (e.g., current sensors and/or voltage sensors and/or impedance sensors and/or power sensors). Since such sensors and their methods of operation and use are well known to those of ordinary skill the art, for reasons of clarity, such sensors are not explicitly shown in FIG. 2A. The feedback/feedforward signals provided to controller 205 may thus correspond to sensed portions of voltage $V_A$, and/or voltage $V_B$, and/or current sensed at $V_A$, and/or current sensed at $V_B$, and/or current of inductor L ($i_L$), and/or input voltage $V_{IN}$, and/or current drawn from input energy source $I_{IN}$, as examples. The particular feedback/feedforward signal(s) to provide to controller 205 is selected based upon a variety of factors including, but not limited to the particular architecture of circuit 200. In some embodiments, controller(s) 205 may comprise a feedforward current shaping controller, such as controller 1805 of FIG. 18A or 18B, and may connect to circuit 200 as shown in FIG. 18A or 18B.

Figure 2B:
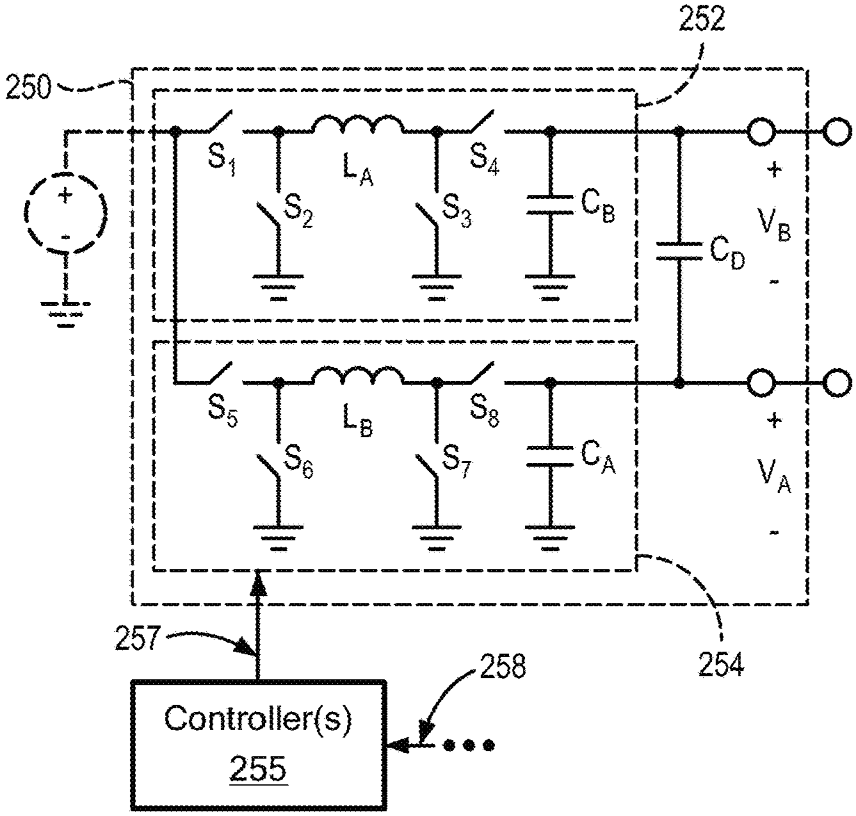
FIG. 2B is a schematic diagram of an example circuit where two outputs may be synthesized using two separate 4-switch buck-boost converters.
Figure 2C:
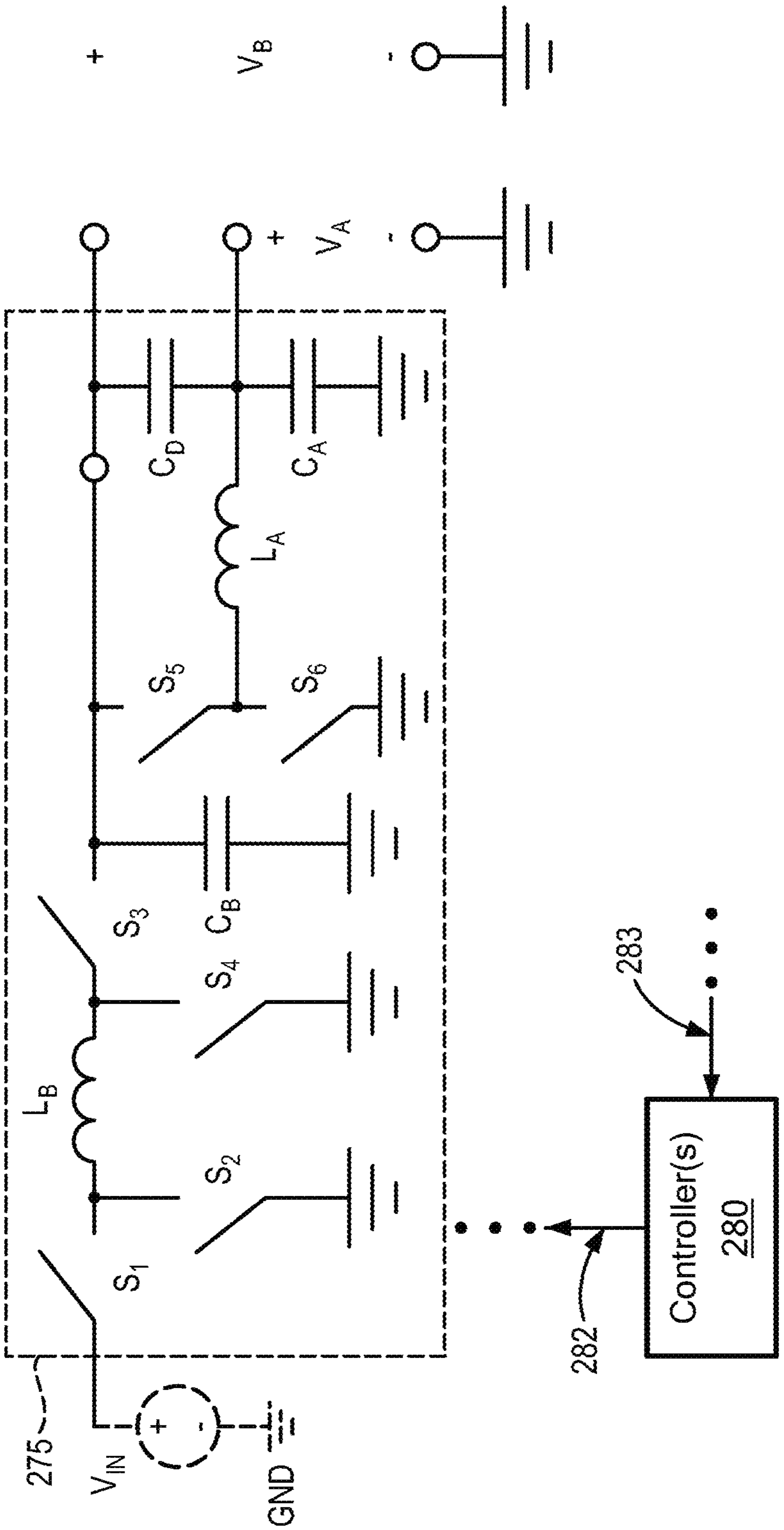
FIG. 2C is a schematic diagram of an example circuit where two outputs may be synthesized using two different types of power converters.

FIG. 2B shows an example circuit 250, where two outputs $V_A$ and $V_B$ may be synthesized using two separate 4-switch buck-boost converters 252, 254. For example, inductor $L_A$, capacitor $C_B$, and switches $S_1$, $S_2$, $S_3$ and $S_4$ may operate together to form a 4-switch buck-boost converter with a first voltage output $V_B$, and inductor $L_B$, capacitor $C_A$, and switches $S_5$, $S_6$, $S_7$, and $S_8$ may operate together to form a 4-switch buck-boost converter with a second voltage output $V_A$ different than $V_B$. A ground rail (GND) may be coupled to various components in the circuit. A differential output decoupling capacitor $C_D$ may also be included to provide output decoupling. One of ordinary skill in the art would appreciate that circuit 250 may be modified based on voltage range requirements in some designs. For example, in some designs, one converter may be implemented as a 4-switch buck-boost converter, while the other converter may be implemented either as a simple buck converter (e.g., to supply the smaller of the two voltages $V_A$ and $V_B$) or as a simple boost converter (e.g., to supply the larger of the two voltages $V_A$ and $V_B$).

One or more controller(s) 255 may control the switches (e.g., $S_1$, $S_2$, $S_3$, $S_4$, $S_5$, $S_6$, $S_7$, and $S_8$) in circuit 250 to generate a desired output. Controller(s) 255 may be implemented as described for controller(s) 155 of FIG. 1B, but with different signal line(s) 257 for controlling the different switches of circuit 250, and with different feedback/feedforward signal line(s) 258 for detecting different feedback/feedforward signals (e.g., voltage $V_A$, voltage $V_B$, current sensed at $V_A$, current sensed at $V_B$, current of inductor $L_A$ ($i_{LA}$), current of inductor $L_B$ ($i_{LB}$), input voltage $V_{IN}$, current drawn from input energy source $I_{IN}$) based on the different architecture of circuit 250. In some embodiments, controller(s) 255 may comprise a feedforward current shaping controller, such as controller 1805 of FIG. 18A or 18B, and may connect to circuit 250 as shown in FIG. 18A or 18B. Similar to control lines 207, as described above in conjunction with FIG. 2A, it should be appreciated that although a single control line 257 is illustrated in FIG. 2B, in embodiments two or more different signal line(s) 257 may be connected to switches $S_1$-$S_8$, for controlling the different switches of circuit 250.

In some embodiments, one or more controllers may be used to operate some of the switches in a circuit, while one or more other controllers may be used to operate other switches in the circuit. For example, a first set of one or more controllers 255 may operate to control on/off states and on/off timing of switches $S_1$-$S_4$ via a first set of one or more signal lines (e.g., circuit connections) 257, thereby controlling buck-boost converter 252. A second set of one or more controllers 255 may operate to control on/off states and on/off timing of switches $S_5$-$S_8$ via a second set of one or more signal lines (e.g., circuit connections) 257, thereby controlling buck-boost converter 254. In some embodiments, the first set of one or more controllers 255 may operate switches $S_1$-$S_4$ at a different frequency and/or duty cycle than the frequency and/or duty cycle at which the second set of one or more controllers 255 may operate switches $S_5$-$S_8$. In some embodiments, a first set of one or more controllers 255 may receive a first set of one or more feedback/feedforward signals 258 and a second set of one or more controllers 255 may receive a second set of feedback/feedforward signals 258 that may be different than the first set of feedback/feedforward signals 258.

FIG. 2C shows another example circuit 275 where two outputs $V_A$ and $V_B$ may be synthesized. In this example, output voltage $V_B$ may be a higher output voltage than output voltage $V_A$. Output voltage $V_B$ may be synthesized using a 4-switch buck-boost converter. For example, inductor $L_B$, capacitor $C_B$, and switches $S_1$, $S_2$, $S_3$, and $S_4$ may operate together to form a 4-switch buck-boost converter with a first voltage output $V_B$. A second independently regulated output voltage $V_A$ less than or equal to $V_B$ may then be synthesized using a buck converter powered from output voltage $V_B$. Inductor $L_A$, capacitor $C_A$, and switches $S_5$ and $S_6$ may operate together to form the buck converter powered by voltage $V_B$ to provide second voltage output $V_A$. A ground rail (GND) may be coupled to various components in the circuit. A differential output decoupling capacitor $C_D$ may also be included to provide output decoupling.

One or more controller(s) 280 may control the switches (e.g., $S_1$, $S_2$, $S_3$, $S_4$, $S_5$, and $S_6$) in circuit 275 to generate a desired output. Controller(s) 280 may be implemented as described for controller(s) 155 of FIG. 1B, but with different signal line(s) 282 for controlling the different switches of circuit 275, and with different feedback/feedforward signal line(s) 283 for detecting different feedback/feedforward signals (e.g., voltage $V_A$, voltage $V_B$, current sensed at $V_A$, current sensed at $V_B$, current of inductor $L_A$ ($i_{LA}$), current of inductor $L_B$ ($i_{LB}$) input voltage $V_{IN}$, current drawn from input energy source $I_{IN}$) based on the different architecture of circuit 275. In some embodiments, controller(s) 280 may comprise a feedforward current shaping controller, such as controller 1805 of FIG. 18A or 18B, and may connect to circuit 275 as shown in FIG. 18A or 18B.

In some embodiments, one or more controllers may be used to operate some of the switches in a circuit, while one or more other controllers may be used to operate other switches in the circuit. For example, a first set of one or more controllers 280 may operate to control on/off states and on/off timing of switches $S_1$-$S_4$ via a first set of one or more signal lines (e.g., circuit connections) 282, thereby controlling the 4-switch buck-boost converter. A second set of one or more controllers 282 may operate to control on/off states and on/off timing of switches $S_5$ and $S_6$ via a second set of one or more signal lines (e.g., circuit connections) 282, thereby controlling the buck converter. In some embodiments, the first set of one or more controllers 280 may operate switches $S_1$-$S_4$ at a different frequency and/or duty cycle than the frequency and/or duty cycle at which the second set of one or more controllers 280 may operate switches $S_5$ and $S_6$. In some embodiments, a first set of one or more controllers 280 may receive a first set of one or more feedback/feedforward signals 283 and a second set of one or more controllers 280 may receive a second set of feedback/feedforward signals 283 that may be different than the first set of feedback/feedforward signals 283.

As discussed above, it is often desired to realize power converters that generate one or more controllable DC output voltage levels from a DC voltage (e.g., battery) level input. The RF systems in which these converters are used may exhibit fast transient behavior, which may correspondingly place very rapid load transients on the power converter. Moreover, in systems where there are two independent supplies created, this may manifest as rapid load transitions between the two supplies (i.e., the load may quickly transfer back and forth between two generated outputs).

The above-mentioned load transients may have a large impact on the design of such power converters. In practice, the highest-frequency components of such load transitions may be absorbed by output capacitances of the converter (e.g., single-ended capacitances to ground or differential capacitances placed between converter outputs). At lower frequencies, such load transitions may be compensated for by converter control loop(s). It may be desirable that the converter control loop(s) yield low closed-loop output impedance for the converter(s), in order to reduce the magnitude and duration of output voltage deviations during a load transition.

Converters in some applications, such as converters used in mobile devices (e.g., mobile phones), may be extremely size constrained. As a result, the amount of converter output capacitance that is allowable may be quite limited. Moreover, to enable fast responses to output voltage change commands, it may be desirable to limit the amount of capacitance placed at a converter output. Providing converters with a wider closed-loop control bandwidth may help reduce the amount of output capacitance needed to suppress the amplitude of the voltage deviation caused by load transitions. As a result, there may be a strong motivation to provide converters with the widest possible closed-loop control bandwidth.

It may be easiest to achieve high control bandwidth relative to switching frequency (and a broad bandwidth over which closed-loop output impedance remains low) for converters that can respond to a load change by increasing (or decreasing) energy delivered from the input (or another energy reserve) to the output quickly (e.g., within a single switching cycle or two switching cycles), rather than have to transiently reduce (or increase) the energy delivered to the output during a transition when the load increases (or decreases) or when one targets an increase (or decrease) in the output voltage. Converters capable of providing a single-cycle response typically do not exhibit a right-half-plane zero in their linearized, averaged control-to-output transfer function. Converters that do not exhibit a right-half-plane zero in their linearized, averaged control-to-output transfer function (i.e., are free of right-half-plane zeros in their control-to-output transfer function) will be referred to as "non-right-half-plane-zero" or "NRHPZ" converters herein. By way of example, a buck converter is an NRHPZ converter, while most other converters, including conventional boost converters and four-switch buck-boost converters, are not NRHPZ converters.

NRHPZ converters may also be amenable to load-current feedforward control over a much wider bandwidth than other converters that do have right-half-plane zeros. Load current feedforward control may provide a way for a converter to quickly compensate for load-current transitions by sensing variations in load current and providing feedforward control to a current-control loop. This may be done without modification of the converter's closed-loop pole locations (of the linearized-averaged model) or of the control-to-output dynamics. This may also change the location of zeros or cancel the effect of zeros in the converter output impedance, thus providing a wider frequency range over which output impedance is low. However, if a converter has a right-half-plane-zero, the impact of this zero may not be able to be cancelled (e.g., with an introduced pole), limiting the bandwidth over which load-current feedforward control can be used to reduce converter closed-loop output impedance for these converters. Nevertheless, load-current feedforward control may be an effective approach for achieving low closed-loop output impedance over a wide bandwidth in an NRHPZ converter.

Given the above, for voltage-step-down-only applications, a buck converter may be a good type of converter to use for an RF application, because it does not have a right-hand-plane-zero and can achieve low output impedance over a wide frequency range, including through use of load-current feedforward control. In some applications, however, a converter may still need to provide voltage step-up functionality for some operating conditions. It may thus be desirable to realize NRHPZ converters capable of providing at least some degree of voltage step-up operation. The required voltage step-up conversion ratio may depend upon a particular application system and operating conditions. In some systems, a voltage step-up conversion ratio may not need to be more than a factor of 1.5 or 2. In other applications, the voltage step-up conversion ratio may need to be more than a factor of 2. Furthermore, in some applications, the converter may have to provide voltage step up conversion under some conditions and voltage step-down conversion under other conditions (e.g. "buck and boost" operation). Disclosed herein are concepts, systems, system architectures, circuits, methods, and techniques capable of NRHPZ conversion for providing one or more outputs, while still providing the capability to provide a degree of boost functionality for the one or more outputs.

Non-Right-Half-Plane-Zero (NRHPZ) Converter Circuits

Figure 3A:
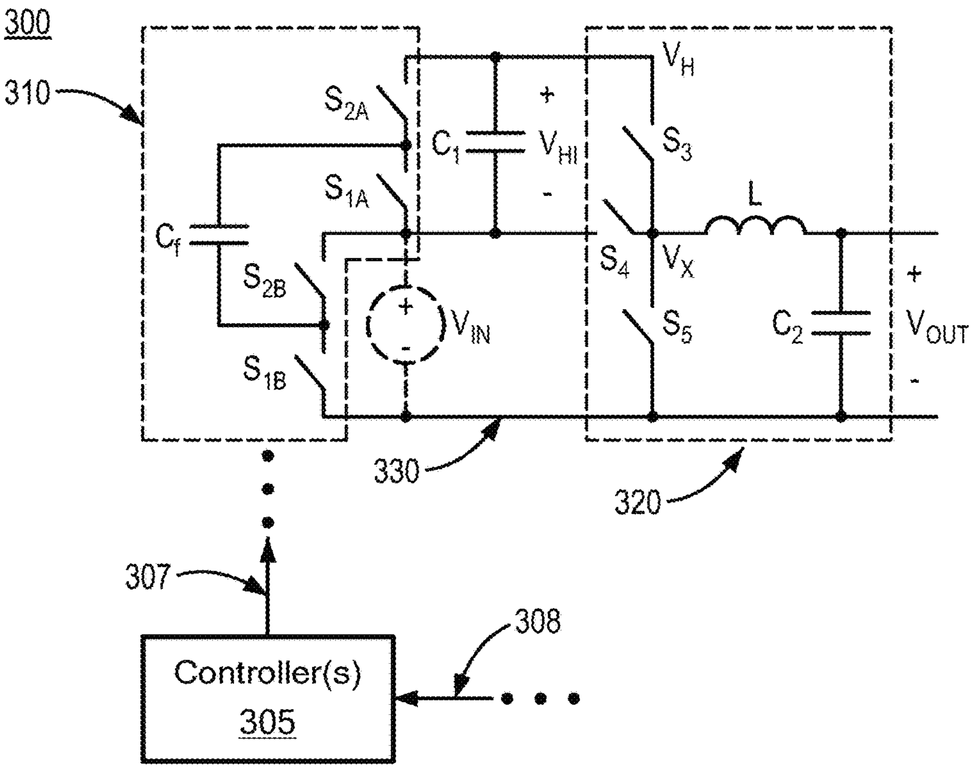
FIG. 3A is a schematic diagram of an example circuit capable of non-right-half-plane-zero (NRHPZ) conversion with boost functionality.

FIG. 3A shows an example power converter circuit 300 (or more simply power converter) capable of NRHPZ conversion to provide voltage outputs along with some degree of boost functionality. Power converter circuit 300 may be coupled to an input energy source (e.g., $V_{IN}$) at input terminals (shown as nodes connected to the energy source providing $V_{IN}$ shown in phantom in FIG. 3A), and to a load at output terminals (shown as nodes across which a voltage $V_{OUT}$ is generated). Circuit 300 is an example of a hybrid magnetic/switched-capacitor converter that provides NRHPZ conversion. Circuit 300 may include a front-end stage 310 (e.g., switched-capacitor (SC) stage here shown as a SC doubler stage) with a network of switches and at least one energy storage element, and a magnetic stage 320. Front-end stage 310 may include a switched-capacitor circuit that is connected to the input energy source (e.g., $V_{IN}$) and that may synthesize a voltage $V_H$ that is substantially a multiple of (in this example embodiment, approximately twice) an input voltage $V_{IN}$ (with voltages $V_{IN}$, $V_H$ measured with respect to a reference potential which in this example embodiment corresponds to a common ground 330).

In some embodiments, front-end stage 310 of circuit 300 may be operated at a first frequency. During the first half of a cycle at the first frequency, (in response to control signals provided thereto) switches $S_{1A}$ and $S_{1B}$ may be biased or otherwise controlled or otherwise placed in their "on" state (also referred to as the switch being "closed" or "in a conducting state such that a low impedance signal path exists between the terminals of the switch"), and switches $S_{2A}$ and $S_{2B}$ may be biased, controlled or otherwise placed in their "off" state (also referred to as the switch being "open" or "in a conducting state such that a high impedance signal path exists between the terminals of the switch"). This configuration of switches $S_{1A}$, $S_{1B}$, $S_{2A}$, and $S_{2B}$ may allow an energy storage element, such as capacitor $C_f$ (e.g., flying capacitor), to charge up to a voltage $V_{IN}$.

During the second half of the cycle at the first frequency, switches $S_{2A}$ and $S_{2B}$ may be on, and switches $S_{1A}$ and $S_{1B}$ may be off. This may allow capacitor $C_f$ to discharge energy to the output of the front-end stage and voltage $V_{HI}$ on capacitor $C_1$ to charge up to $V_{IN}$ ($2*V_{IN}$-$V_{IN}$ (source)=$V_{IN}$). As a result, voltage $V_H$ (voltage on capacitor $C_1$ with respect to common ground) may be $2*V_{IN}$ (voltage $V_{IN}$ of source+ voltage $V_{HI}$ across capacitor $C_1$).

In this example embodiment, magnetic stage 320 is illustrated as a three-level buck-derived magnetic converter (herein referred to as a 3-level buck converter) that has an inductor L with a first end (e.g., component terminal) that may be connected to any of 3 voltages: $V_H$ (e.g., as output from front-end stage 310), $V_{IN}$, and common 330 (e.g., common ground or 0V), and a second end (e.g., component terminal) connected to the output $V_{OUT}$. For example, inductor L, capacitor $C_2$, and switches $S_3$-$S_5$ may act together to operate as a 3-level buck converter.

Switches $S_3$, $S_4$, and $S_5$ may be operated at a second frequency of operation. In some embodiments, the second frequency of operation may be different (e.g., higher, lower) than the first frequency of operation at which switches $S_{1A}$, $S_{1B}$, $S_{2A}$, and $S_{2B}$ are operated. For example, front-end stage 310 of circuit 300 may be operated at a first frequency independently of magnetic stage 320 of circuit 300, which may be operated at a second frequency. However, the disclosure is not so limited and, in some embodiments, the first frequency of operation may be the same as the second frequency of operation.

When switch $S_3$ is on and switches $S_4$ and $S_5$ are off, the buck converter may receive an input voltage of $V_H$ at $V_X$. Because front-end stage 310 (e.g., switched-capacitor doubler) has charged capacitor $C_1$ to $V_{IN}$ (such that $V_{HI}$ is equal to $V_{IN}$), when switch $S_3$ is on and switches $S_4$ and $S_5$ are off, voltage $V_H$ seen at $V_X$ may be $2*V_{IN}$ ($V_{HI}$+$V_{IN}$, where $V_{HI}$=$V_{IN}$). When switch $S_3$ is off and switch $S_4$ is on, the buck converter may receive an input voltage of $V_{IN}$ at $V_X$, from the energy source voltage $V_{IN}$. When switches $S_3$ and $S_4$ are off, and switch $S_5$ is on, the buck converter may receive an input voltage of common (e.g., common ground or 0V) from common 330.

To synthesize a low output voltage $V_{OUT}$ (below $V_{IN}$), the input voltage to the buck converter at $V_X$ may be alternately switched between phases of each cycle at the second frequency between $V_{IN}$ and 0V. To synthesize a high output voltage $V_{OUT}$ (between $V_{IN}$ and $V_H$), the input voltage to the buck converter at $V_X$ may be alternately switched between phases of each cycle at the second frequency between $V_H$ and $V_{IN}$. There may be several possibilities for synthesizing output voltages $V_{OUT}$ near $V_{IN}$. As one example, the input voltage to the buck converter at $V_X$ may be alternately switched between phases of each cycle at the second frequency between $V_H$ and 0V. As another example, the input voltage to the buck converter at $V_X$ may be alternately switched between three phases in each cycle at the second frequency, in a pattern between $V_{IN}$, $V_H$, and 0V (e.g., using tri-phase operation as described herein below, among other possibilities). Using the above-described options, output voltage $V_{OUT}$ may be controlled between 0V and near $2*V_{IN}$ without incurring a right-half-plane zero in the magnetics stage.

One or more controller(s) 305 may control the switches (e.g., $S_{1A}$, $S_{1B}$, $S_{2A}$, $S_{2B}$, $S_3$, $S_4$, and $S_5$) in circuit 300 to generate a desired output voltage $V_{OUT}$. Controller(s) 305 may be implemented as described for controller(s) 155 of FIG. 1B, but with different signal line(s) 307 for controlling the different switches of circuit 300, and with different feedback/feedforward signal line(s) 308 for detecting different feedback/feedforward signals (e.g., voltage $V_{OUT}$, voltage $V_X$, voltage $V_H$, voltage $V_{HI}$, current to load sensed at $V_{OUT}$, current of inductor L ($i_L$), input voltage $V_{IN}$, current drawn from input energy source IN) based on the different architecture of circuit 300. Other feedback/feedforward signals may also be used. After reading the disclosure provided herein, one of ordinary skill in the art will appreciate how to select an appropriate feedback/feedforward signal (or an appropriate characteristic of the system to use as a feedback/feedforward quantity) for use in a particular application. In some embodiments, controller(s) 300 may comprise a feedforward current shaping controller, such as controller 1805 of FIG. 18A or 18B, and may connect to circuit 300 as shown in FIG. 18A or 18B.

In some embodiments, one or more controllers may be used to operate some of the switches in a circuit, while one or more other controllers may be used to operate other switches in the circuit. For example, a first set of one or more controllers 305 may operate to control on/off states and on/off timing of switches $S_{1A}$, $S_{1B}$, $S_{2A}$, and $S_{2B}$ via a first set of one or more signal lines (e.g., circuit connections) 307, thereby controlling front-end stage 310 of the circuit. A second set of one or more controllers 305 may operate to control on/off states and on/off timing of switches $S_3$, $S_4$, and $S_5$ via a second set of one or more signal lines (e.g., circuit connections) 307, thereby controlling magnetic stage 320. In some embodiments, the first set of one or more controllers 305 may operate switches $S_{1A}$, $S_{1B}$, $S_{2A}$, and $S_{2B}$ at a different frequency and/or duty cycle than the frequency and/or duty cycle at which the second set of one or more controllers 305 may operate switches $S_3$, $S_4$, and $S_5$. For example, a duty cycle at which the switches of front-end stage 310 are controlled may depend on the detailed topology and operating regime (e.g., slow-switching limit versus fast switching limit). In some embodiments, the first set of one or more controllers 305 may control switches $S_{1A}$, $S_{1B}$, $S_{2A}$, and $S_{2B}$ at approximately a 50% duty ratio. In some embodiments, the switches (e.g., $S_{1A}$, $S_{1B}$, $S_{2A}$, $S_{2B}$) of the first stage may be operated independently of the switches (e.g., $S_3$, $S_4$, $S_5$) of the second stage. In some embodiments, a first set of one or more controllers 305 may receive a first set of one or more feedback/feedforward signals 308 and a second set of one or more controllers 305 may receive a second set of feedback/feedforward signals 308 that may be different than the first set of feedback/feedforward signals 308.

Implementing the 3-level magnetic converter of circuit 300 may require two unidirectional voltage-blocking switches ($S_3$, $S_5$) and one bidirectional blocking switch ($S_4$). Switches $S_3$ and $S_5$ may each be rated for $2*V_{IN}$ blocking voltage (given that, depending on switch configuration, they could each incur a voltage drop of $2*V_{IN}$ across them), while switch $S_4$ may be rated for $+/-V_{IN}$ blocking voltage (given that, depending on switch configuration, it could incur a voltage drop of $V_{IN}$ across it in either direction).

In a metal-oxide-semiconductor (MOS) process, the switches may be realized as N-channel or P-channel field-effect transistors (FETs). For example, switches $S_3$ and $S_5$ may both comprise N-channel MOSFETs and switch $S_4$ may comprise a N-channel MOSFET with body switching. The switches may also comprise a combination of P-channel and N-channel MOSFETs. For example, switch $S_3$ may comprise a P-channel MOSFET, switch $S_5$ may comprise an N-channel MOSFET, and switch $S_4$ may comprise an N-channel MOSFET with body switching.

Figure 3B:
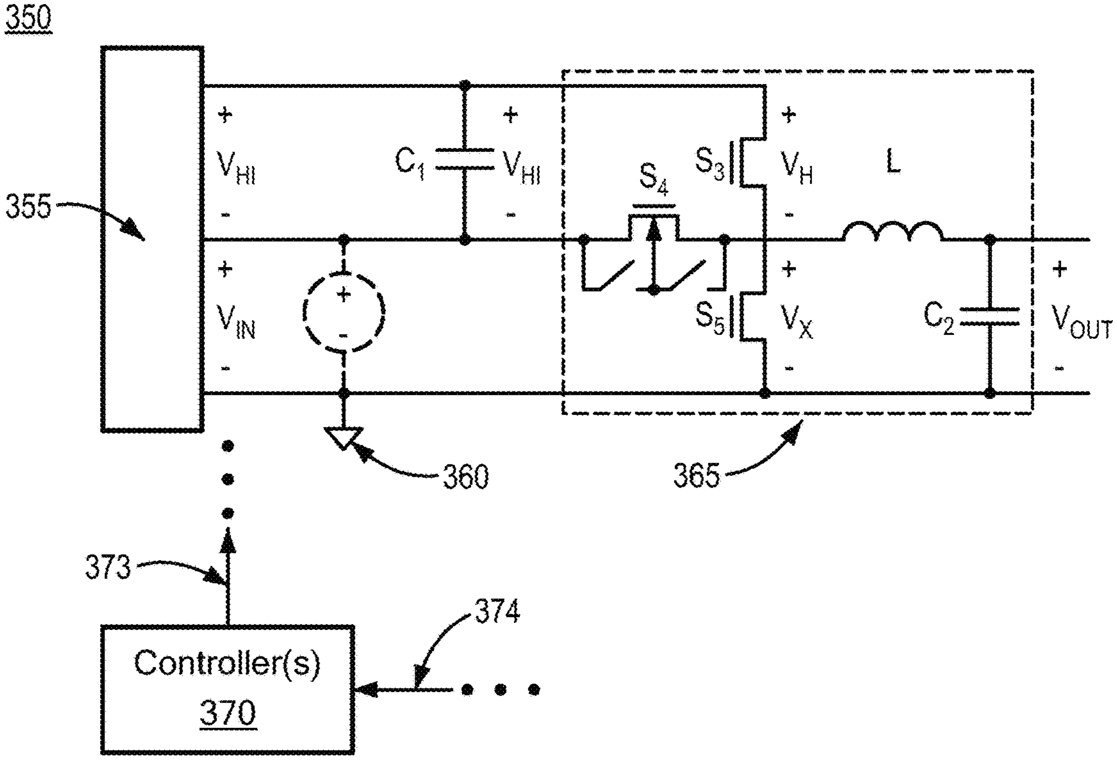
FIG. 3B is a schematic diagram of an example circuit where switches are implemented as metal-oxide-semiconductor field effect transistors (MOSFETs).

FIG. 3B shows an example circuit 350 where switches $S_3$ and $S_5$ are implemented as MOSFETs, each rated with a blocking voltage of $2*V_{IN}$, and where switch $S_4$ is implemented as a MOSFET rated with a bidirectional (+/−) blocking voltage of $V_{IN}$. Front-end stage 355 of FIG. 3B may be constructed as described for front-end stage 310 of FIG. 3A, or alternatively may comprise a magnetics-based front-end boost stage (see, e.g., FIGS. 9, 10). Switches $S_3$, $S_4$, and $S_5$ of magnetic stage 365 may be controlled as described above with respect to FIG. 3A to provide a voltage $V_X$ substantially equal to voltage $V_H$ (e.g., $2*V_{IN}$), $V_{IN}$, or 0V. Additionally, output voltages $V_{OUT}$ between $V_{IN}$ and $V_H$, between 0V and $V_{IN}$, and around $V_{IN}$ may be synthesized using the alternating switching schemes described above with respect to FIG. 3A.

One or more controller(s) 370 may control the switches (e.g., $S_3$, $S_4$, $S_5$) and the switches inside front-end stage 355 (see, e.g., FIG. 3A) in circuit 350 to generate a desired output voltage $V_{OUT}$. Controller(s) 370 may be implemented as described for controller(s) 155 of FIG. 1B, but with different signal line(s) 373 for controlling the different switches of circuit 350, and with different feedback/feedforward signal line(s) 374 for detecting different feedback/feedforward signals (e.g., voltage $V_{OUT}$, voltage $V_X$, voltage $V_H$, voltage $V_{HI}$, current to load sensed at $V_{OUT}$, current of inductor L ($i_L$), input voltage $V_{IN}$, current drawn from input energy source $I_{IN}$) based on the different architecture of circuit 350. In some embodiments, controller(s) 370 may comprise a feedforward current shaping controller, such as controller 1805 of FIG. 18A or 18B, and may connect to circuit 350 as shown in FIG. 18A or 18B.

In some embodiments, one or more controllers may be used to operate some of the switches in a circuit, while one or more other controllers may be used to operate other switches in the circuit. For example, a first set of one or more controllers 370 may operate to control on/off states and on/off timing of switches in front-end stage 355 via a first set of one or more signal lines (e.g., circuit connections) 373, thereby controlling front-end stage 355. A second set of one or more controllers 370 may operate to control on/off states and on/off timing of switches $S_3$, $S_4$, and $S_5$ via a second set of one or more signal lines (e.g., circuit connections) 373, thereby controlling magnetic stage 365. In some embodiments, the first set of one or more controllers 370 may operate switches in first stage 355 at a different frequency and/or duty cycle than the frequency and/or duty cycle at which the second set of one or more controllers 370 may operate switches $S_3$, $S_4$, and $S_5$. For example, a duty cycle at which the switches of the first stage are controlled may depend on the detailed topology and operating regime (e.g., slow-switching limit versus fast switching limit). In some embodiments, the first set of one or more controllers 370 may control switches of front-end stage 355 at approximately a 50% duty ratio. In some embodiments, the switches of front-end stage 355 may be operated independently of the switches (e.g., $S_3$, $S_4$, $S_5$) of magnetic stage 365. In some embodiments, a first set of one or more controllers 370 may receive a first set of one or more feedback/feedforward signals 374 and a second set of one or more controllers 370 may receive a second set of feedback/feedforward signals 374 that may be different than the first set of feedback/feedforward signals 374.

In some embodiments, it may be desirable to implement switches in a circuit by using MOSFETs that are rated with a lower blocking voltage than $2*V_{IN}$.

Figure 4:
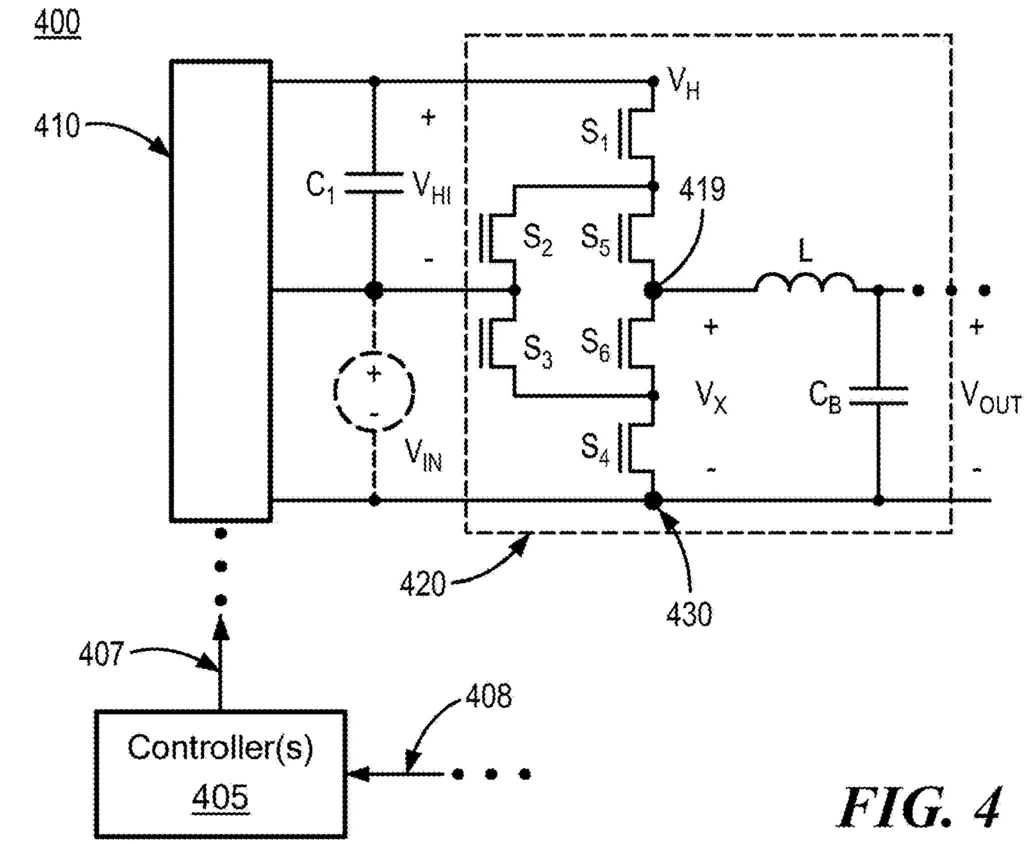
FIG. 4 is a schematic diagram of an example circuit for realizing a 3-level magnetic converter with MOSFETs rated with a blocking voltage lower than the highest possible output voltage.

FIG. 4 shows an example embodiment of a circuit 400 for realizing a 3-level buck converter, as discussed above, but with MOSFETs rated with a lower blocking voltage than in the previous examples. The arrangement of the switches shown in magnetic stage 420 may be used in any circuit providing three voltage levels from which a magnetic stage can switch. For example, the arrangement of the switches shown in FIG. 3A or 3B may be replaced with the arrangement of the switches shown in FIG. 4 to utilize reduced-voltage devices.

Like the example circuits previously discussed, example circuit 400 includes a front-end stage 410 and a magnetic stage 420. Front-end stage 410 may be implemented as previously discussed (see, e.g., front-end stage 310 of FIG. 3A, magnetics-based front-end stage (see, e.g., FIGS. 9, 10)). Magnetic stage 420 may be implemented as a 3-level buck converter which includes an inductor L having a first terminal (e.g., a first component terminal or first end) connected to a node 419 at which any of 3 voltages may be provided and a second terminal (e.g., second component terminal or a second end) connected to an output of circuit 400. In this example embodiment, the 3 voltages correspond to: (1) a voltage $V_H$ (e.g., as an output voltage from front-end stage 410 (with front-end stage 410 here corresponding to an SC doubler); (2) a voltage $V_{IN}$ (e.g. corresponding to an input voltage); and a reference potential at node 430 (also sometimes referred to as common 430) with the reference potential here corresponding to a common ground or 0V.

Inductor L, capacitor $C_B$, and switches $S_1$ through $S_6$ may be operated (i.e., switched between conducting and non-conducting states) so as to act as a 3-level buck converter. When switches $S_1$ and $S_5$ are on (i.e., biased into their conducting states) and switches $S_2$, $S_4$, and $S_6$ are off (i.e., biased into their non-conducting states), the 3-level buck converter may receive an input voltage of $V_H$ at node 419 in which case voltage $V_X$ equals voltage $V_H$.

Front-end stage 410 may be configured as an SC doubler as discussed above in conjunction with FIGS. 3A and 3B such that a charged capacitor (e.g., $C_1$) taking on a voltage (e.g., voltage $V_{HI}$) of approximately $V_{IN}$ may be connected with voltage $V_{IN}$, making voltage $V_H$ near $2*V_{IN}$ with respect to common ground. With such a configuration, when switches $S_1$ and $S_5$ of magnetic stage 420 are on and switches $S_2$, $S_4$, and $S_6$ of magnetic stage 420 are off, voltage $V_H$ seen at node 419 (designated $V_X$ in FIG. 4) will be near $2*V_{IN}$.

Further, when switches $S_1$ and $S_4$ of magnetic stage 420 are off and switches $S_2$ and $S_5$ and/or switches $S_3$ and $S_6$ of magnetic stage 420 are on, the voltage at node 419 (designated $V_X$ in FIG. 4) is substantially equal to voltage $V_{IN}$ and thus the buck converter may receive an input voltage of $V_{IN}$ (i.e., $V_X$=$V_{IN}$).

When switches $S_4$ and Se are on and switches $S_3$ and $S_3$ are off, the buck converter may receive an input voltage of common (e.g., a reference potential which may, for example, be common ground or 0V).

Accordingly, by operation of switches $S_1$-$S_6$, a low output voltage (below $V_{IN}$), may be established at node 419 such that a voltage having a value below $V_{IN}$ may be provided as an input voltage $V_X$ to the 3-level buck converter. That is, to synthesize a low output voltage (below $V_{IN}$), the input voltage to the 3-level buck converter at $V_X$ may be alternately switched in each phase of a cycle between $V_{IN}$ volts and some reference potential below $V_{IN}$ volts (with such a reference potential being shown as 0 volts (or ground) in the example embodiment of FIG. 4.

Similarly, by operation of switches $S_1$-$S_6$, to synthesize a high output voltage (e.g., a voltage between $V_{IN}$ and $V_H$) at the output of magnetic stage 420, the input voltage $V_X$ to the 3-level buck converter at node 419 may be alternately switched between each phase of a cycle between $V_H$ and $V_{IN}$.

There may be several possibilities to synthesize output voltages near or equal to $V_{IN}$. As one example, the input voltage $V_X$ to the 3-level buck converter at node 419 may be alternately switched between each phase of a cycle between $V_H$ and 0V. As another example, the input voltage to the 3-level buck converter at node 419 may be alternately switched in a three-phase pattern per cycle, between $V_{IN}$, $V_H$, and 0V (e.g., using tri-phase operation as described herein below, among other possibilities). Using the above-described options, output voltage $V_{OUT}$ may be controlled between a voltage of about the reference potential (here, 0V) and about (or near) a voltage corresponding to 2*$V_{IN}$, without incurring a right-half-plane zero for the magnetics stage.

The arrangement of switches in circuit 400 may allow for use of components/devices having voltage and/or current ratings which are reduced as compared with the ratings required of components/devices used in circuit 300 and circuit 350 (sometimes referred to herein as "reduced-voltage components/devices" or reduced "reduced-current components/devices"). For example, each switch (e.g., $S_1$, $S_2$, $S_3$, $S_4$, $S_5$, and $S_6$) in circuit 400 may have a voltage rating of $V_{IN}$, despite voltage $V_H$ having a voltage value of about 2*$V_{IN}$. That is, in the example embodiment of FIG. 4, switches $S_1$, $S_2$, $S_3$, $S_4$, $S_5$, and $S_6$ may synthesize voltages at the output of the converter that are greater than the voltage rating of the switches.

Circuit 400 may be described as including an "active neutral-point clamp" or ANPC configuration of switches. The voltage $V_X$ at node 419 for different configurations of switches $S_1$, $S_2$, $S_3$, $S_4$, $S_5$, and $S_6$ is shown below in Table 1. In Table 1, a "1" listed in a column for a switch means that the switch on, a "0" listed in a column for a switch means that the switch is off, and an "X" listed in a column for a switch means that the switch could be on or off. The voltage listed in the "$V_X$" column indicates the voltage at $V_X$ for the configuration of the six switches shown in same row. The "Notes" column describes whether the switch arrangement in that row is a preferred switch arrangement for outputting the voltage $V_X$ listed in the "$V_X$" column, or is an alternative switch arrangement for outputting that voltage.

TABLE 1

| $S_1$ Switch Position | $S_2$ Switch Position | $S_3$ Switch Position | $S_4$ Switch Position | $S_5$ Switch Position | $S_6$ Switch Position | Voltage ($V_X$) at Node 419 | Notes |
|---|---|---|---|---|---|---|---|
| 1 | 0 | 1 | 0 | 1 | 0 | $V_H$ | Preferred |
| 0 | 1 | 1 | 0 | 1 | 1 | $V_{IN}$ | Preferred |
| 0 | 1 | 1 | 0 | 1 | X | $V_{IN}$ | Alternative |
| 0 | 1 | 1 | 0 | X | 1 | $V_{IN}$ | Alternative |
| 0 | 1 | 0 | 1 | 0 | 1 | 0 | Preferred |

One or more controller(s) 405 may control the switches (e.g., $S_1$, $S_2$, $S_3$, $S_4$, $S_5$, $S_6$) and the switches inside front-end stage 410 (see, e.g., FIG. 3A) in circuit 400 to generate a desired output voltage $V_{OUT}$. Controller(s) 405 may be implemented as described for controller(s) 155 of FIG. 1B, but with different signal line(s) 407 for controlling the different switches of circuit 400, and with different feedback/feedforward signal line(s) 408 for detecting different feedback/feedforward signals (e.g., voltage $V_{OUT}$, voltage $V_X$, voltage $V_H$, voltage $V_{HI}$, current to load sensed at $V_{OUT}$, current of inductor L ($i_L$), input voltage $V_{IN}$, current drawn from input energy source $I_{IN}$) based on the different architecture of circuit 400. In some embodiments, controller(s) 405 may comprise a feedforward current shaping controller, such as controller 1805 of FIG. 18A or 18B, and may connect to circuit 400 as shown in FIG. 18A or 18B.

In some embodiments, one or more controllers may be used to operate some of the switches in a circuit, while one or more other controllers may be used to operate other switches in the circuit. For example, a first set of one or more controllers 405 may operate to control on/off states and on/off timing of switches in front-end stage 410 via a first set of one or more signal lines (e.g., circuit connections) 407, thereby controlling front-end stage 410. A second set of one or more controllers 405 may operate to control on/off states and on/off timing of switches $S_1$-$S_6$ via a second set of one or more signal lines (e.g., circuit connections) 407, thereby controlling magnetic stage 420. In some embodiments, the first set of one or more controllers 405 may operate switches in front-end stage 410 at a different frequency and/or duty cycle than the frequency and/or duty cycle at which the second set of one or more controllers 405 may operate switches $S_1$-$S_6$. For example, a duty cycle at which the switches of front-end stage 410 are controlled may depend on the detailed topology and operating regime (e.g., slow-switching limit versus fast switching limit). In some embodiments, the first set of one or more controllers 405 may control switches of front-end stage 410 at approximately a 50% duty ratio. In some embodiments, the switches of front-end stage 410 may be operated independently of the switches (e.g., $S_1$-$S_6$) of magnetic stage 420. In some embodiments, a first set of one or more controllers 405 may receive a first set of one or more feedback/feedforward signals 408 and a second set of one or more controllers 405 may receive a second set of feedback/feedforward signals 408 that may be different than the first set of feedback/feedforward signals 408.

In some embodiments, it may be desirable to reduce the energy requirements of the front-end stage (e.g., front-end stage 310 of FIGS. 3A and 3B, front-end stage 410 of FIG. 4).

Figure 5:
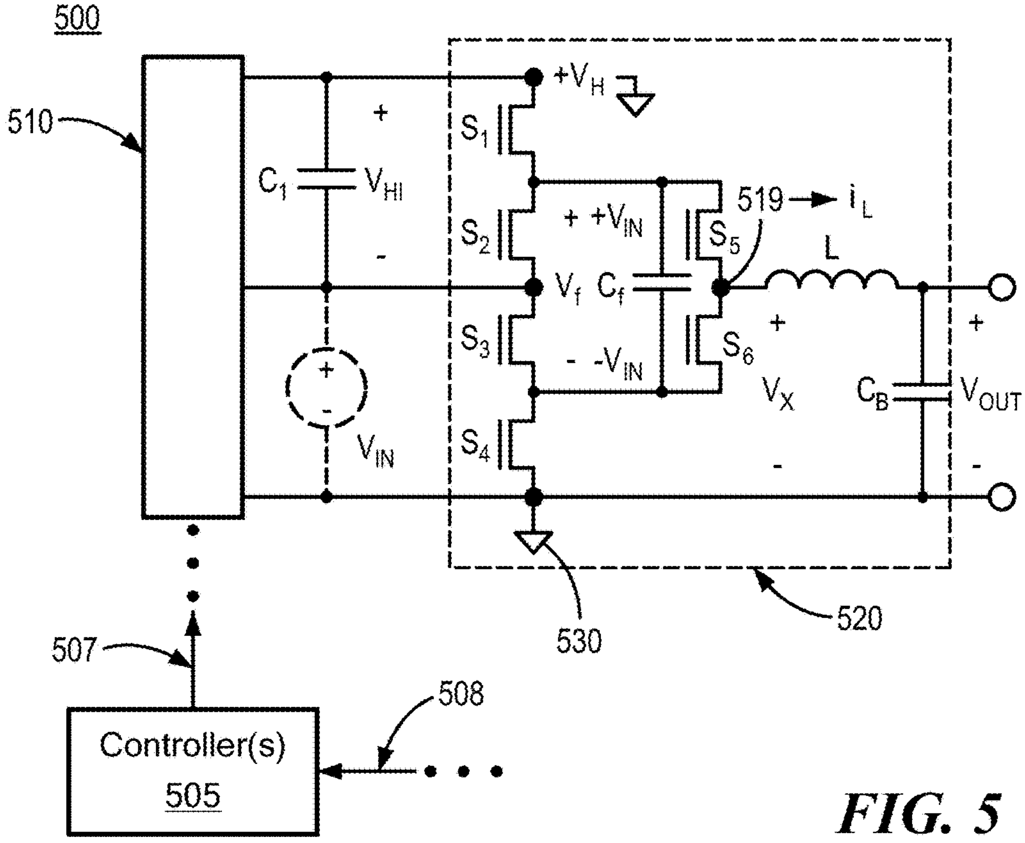
FIG. 5 is a schematic diagram of an example circuit for realizing a 3-level magnetic converter utilizing a flying capacitor.

FIG. 5 shows an example circuit 500 comprising a front-end stage 510 (e.g., an SC doubler (see, e.g., FIG. 3A), magnetics-based front-end stage (see, e.g., FIGS. 9, 10)) coupled to a magnetic stage 520 to form a 3-level magnetic converter, as discussed above, but with a flying capacitor $C_f$ incorporated into magnetic stage 520. Front-end stage 510 may be configured as an SC doubler as discussed above in conjunction with FIGS. 3A and 3B such that a charged capacitor (e.g., $C_1$) takes on a voltage (e.g., voltage $V_{HI}$) of approximately $V_{IN}$, making voltage $V_H$ near $2*V_{IN}$ with respect to common ground. Magnetic stage 520 may be a flying capacitor multilevel buck converter having an inductor L with a first end (e.g., a first component terminal) that may be connected to any of a plurality of voltages, here 3 voltages, at node 519. In this example embodiment the three voltages correspond to: (1) $V_H$ (e.g., as output from front-end stage 510); (2) $V_{IN}$; and (3) reference potential or common 530 (e.g., common ground or 0V). A second end (e.g., a second component terminal) of inductor L is connected to an output terminal at which an output voltage $V_{OUT}$ may be provided.

The flying capacitor $C_f$ may be used to provide energy transfer from $V_{IN}$ to $V_{HI}$, reducing the energy transfer requirements of SC stage 510. That is, the flying capacitor $C_f$ may be used to transfer voltage from $V_{IN}$ to charge capacitor $C_1$ to $V_{HI}$. Energy transfer from voltage $V_{IN}$ to $V_{HI}$ on capacitor $C_1$ may be guaranteed, for example, by alternating between the two switching configurations for creating voltage $V_{IN}$ at $V_X$ shown in Table 2. In this example, capacitor $C_1$ may be charged in two different ways. One way is through switching in front-end stage 510, as previously discussed. The other way is through use of capacitor $C_f$. That is, in this second way, capacitor $C_f$ may be charged from $V_{IN}$ when switches $S_2$ and $S_4$ are on, and capacitor $C_f$ may discharge to charge capacitor $C_1$ when switches $S_1$ and $S_3$ are on. Voltage $V_X$ at node 519 for different configurations of switches $S_1$, $S_2$, $S_3$, $S_4$, $S_5$, and $S_6$ is shown below in Table 2. In Table 2, a "1" listed in a column for a switch means that the switch is on and a "0" listed in a column for a switch means that the switch is off. The voltage listed in the "$V_X$" column indicates the voltage $V_X$ achieved with the configuration of the six switches shown in same row. The "Notes" column describes how the energy transfers for the switch arrangement in that row.

TABLE 2

| $S_1$ Switch Position | $S_2$ Switch Position | $S_3$ Switch Position | $S_4$ Switch Position | $S_5$ Switch Position | $S_6$ Switch Position | Voltage ($V_X$) at Node 519 | Notes |
|---|---|---|---|---|---|---|---|
| 1 | 0 | 1 | 0 | 1 | 0 | $V_H$ | $C_f/V_{HI}$ energy transfer |
| 1 | 0 | 1 | 0 | 0 | 1 | $V_{IN}$ | $C_f/V_{HI}$ energy transfer |
| 0 | 1 | 0 | 1 | 1 | 0 | $V_{IN}$ | $C_f/V_{IN}$ energy transfer |
| 0 | 1 | 0 | 1 | 0 | 1 | 0 | $C_f/V_{IN}$ energy transfer |

In some cases, front-end stage 510 may be eliminated, with all energy transfer to create voltage $V_H$ realized through $C_f$. For example, with switches $S_2$ and $S_4$ on and switches $S_1$ and $S_3$ off, capacitor $C_f$ may be charged to a voltage of $V_f$ substantially equal to voltage $V_{IN}$. Then, with switches $S_3$ and $S_5$ on and switches $S_2$ and $S_4$ off, voltage $V_{IN}$ may be connected with the voltage $V_f$ of capacitor $C_f$, which has been charged to a voltage $V_{IN}$, resulting in a voltage $V_H$ input to the buck converter corresponding to a voltage of $2*V_{IN}$. If front-end stage 510 is eliminated, switch $S_1$ may no longer be necessary and may also be eliminated.

One or more controller(s) 505 may control the switches (e.g., $S_1$, $S_2$, $S_3$, $S_4$, $S_5$, $S_6$) and the switches of front-end stage 510 (see, e.g., FIG. 3A) in circuit 500 to generate a desired output voltage $V_{OUT}$. For example, controller(s) 505 may alternate between two switch configurations per cycle (for two-phase operation) or three switch configurations per cycle (for tri-phase operation) to synthesize a desired output voltage $V_{OUT}$, as previously discussed. Controller(s) 505 may be implemented as described for controller(s) 155 of FIG. 1B, but with different signal line(s) 507 for controlling the different switches of circuit 500, and with different feedback/feedforward signal line(s) 508 for detecting different feedback/feedforward signals (e.g., voltage $V_{OUT}$, voltage $V_X$, voltage $V_H$, voltage $V_{HI}$, current to load sensed at $V_{OUT}$, current of inductor L ($i_L$), input voltage $V_{IN}$, current drawn from input energy source $I_{IN}$) based on the different architecture of circuit 500. In some embodiments, controller(s) 505 may comprise a feedforward current shaping controller, such as controller 1805 of FIG. 18A or 18B, and may connect to circuit 500 as shown in FIG. 18A or 18B.

In some embodiments, one or more controllers may be used to operate some of the switches in a circuit, while one or more other controllers may be used to operate other switches in the circuit. For example, a first set of one or more controllers 505 may operate to control on/off states and on/off timing of switches in front-end stage 510 via a first set of one or more signal lines (e.g., circuit connections) 507, thereby controlling front-end stage 510. A second set of one or more controllers 505 may operate to control on/off states and on/off timing of switches $S_1$-$S_6$ via a second set of one or more signal lines (e.g., circuit connections) 507, thereby controlling magnetic stage 520. In some embodiments, the first set of one or more controllers 505 may operate switches in front-end stage 510 at a different frequency and/or duty cycle than the frequency and/or duty cycle at which the second set of one or more controllers 505 may operate switches $S_1$-$S_6$. For example, a duty cycle at which the switches of the first stage are controlled may depend on the detailed topology and operating regime (e.g., slow-switching limit versus fast switching limit). In some embodiments, the first set of one or more controllers 505 may control switches of front-end stage 510 at approximately a 50% duty ratio. In some embodiments, the switches of front-end stage 510 may be operated independently of the switches (e.g., $S_1$-$S_6$) of magnetic stage 520. In some embodiments, a first set of one or more controllers 505 may receive a first set of one or more feedback/feedforward signals 508 and a second set of one or more controllers 505 may receive a second set of feedback/feedforward signals 508 that may be different than the first set of feedback/feedforward signals 508.

In some embodiments, it may be desired to reduce the total amount of capacitance needed to implement a converter. For example, it may be desired to reduce the total amount of capacitance needed to hold up voltage $V_H$.

Figure 6A:
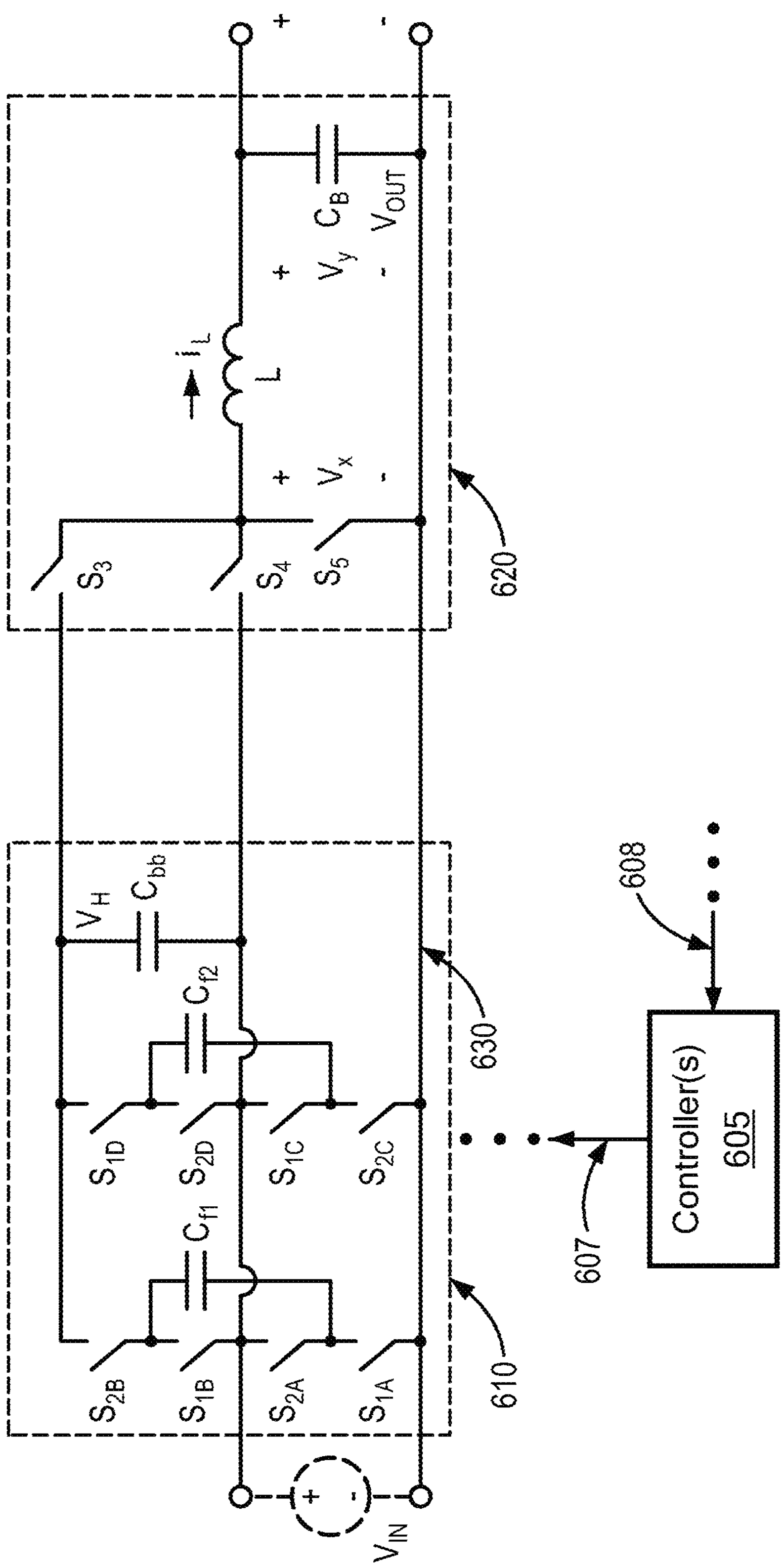
FIG. 6A is a schematic diagram of an example circuit that utilizes an interleaved switched-capacitor front-end stage.

FIG. 6A shows an example circuit 600 that may use a front-end stage 610 that is an interleaved switched-capacitor voltage doubler rather than the non-interleaved version previously discussed (see, e.g., front-end stage 310 of FIG. 3A). That is, FIG. 6A shows an example circuit 600 for realizing a 3-level magnetic converter, as discussed above, but with a front-end stage 610 implemented as an interleaved switched-capacitor stage.

Magnetic stage 620 may be a 3-level buck converter comprising an inductor L, capacitor $C_B$, and switches $S_3$-$S_5$. A first end of the buck converter may be connected to any of 3 voltages: $V_H$ (e.g., as output from front-end 610), $V_{IN}$, and common 630 (e.g., common ground or 0V), and a second end may be connected to the output $V_{OUT}$. Like front-end 310 of FIG. 3A, front-end 610 may synthesize a voltage $V_H$ that is approximately twice the input voltage $V_{IN}$ (with respect to common ground 630).

For example, one or more controllers 605 may operate switches $S_{1A}$, $S_{1B}$, $S_{1C}$, $S_{1D}$, $S_{2A}$, $S_{2B}$, $S_{2C}$, $S_{2D}$, $S_3$, $S_4$, and $S_5$. Switches $S_{1A}$, $S_{1B}$, $S_{1C}$, $S_{1D}$, $S_{2A}$, $S_{2B}$, $S_{2C}$, and $S_{2D}$ of front-end stage 610 may be operated at a first frequency and switches $S_3$, $S_4$, and $S_5$ of magnetic stage 620 may be operated at a second frequency. In some embodiments, the first frequency of operation of the front-end stage 610 may be different (e.g., lower, higher) than the second frequency of operation of the magnetic stage 620, and the two stages may be operated independently. However, the disclosure is not so limited and the first and second frequencies may be the same. During the first half of a cycle at the first frequency, switches $S_{1A}$, $S_{1B}$, $S_{1C}$, and $S_{1D}$ may be on, and switches $S_{2A}$, $S_{2B}$, Sec, and $S_{2D}$ may be off. This switch configuration may allow capacitor $C_{f1}$ to be charged to a voltage of $V_{IN}$, and may charge capacitor $C_{bb}$ to a voltage of $V_{IN}$ (2*$V_{IN}$ with respect to common ground) assuming capacitor $C_{f1}$ was previously charged to a voltage of $V_{IN}$. During the second half of the cycle at that frequency, switches $S_{2A}$, $S_{2B}$, $S_{2C}$, and $S_{2D}$ may be on, and switches $S_{1A}$, $S_{1B}$, $S_{1C}$, and $S_{1D}$ may be off. This switch configuration may allow capacitor $C_{f2}$ to be charged to a voltage of $V_{IN}$, and may charge capacitor $C_{bb}$ to a voltage of $V_{IN}$ (2*$V_{IN}$ with respect to common ground) assuming capacitor $C_{f2}$ was previously charged to a voltage of $V_{IN}$. One of ordinary skill in the art would recognize that the switch configuration described above for the second half of the cycle could instead be used in the first half of the cycle, with the switch configuration described above for the first half of the cycle then being used for the second half of the cycle.

The 3-level buck converter of magnetic stage 620 may then receive an input voltage $V_H$ having a voltage level corresponding to a voltage of 2*$V_{IN}$ when switch $S_3$ is on and switches $S_4$ and $S_5$ are off, an input voltage corresponding to a voltage of $V_{IN}$ when switch $S_4$ is on and switches $S_3$ and $S_5$ are off, or an input voltage of 0V when switch $S_5$ is on and switches $S_3$ and $S_4$ are off. As discussed above, one benefit of using an interleaved switched-capacitor doubler 610, as shown in FIG. 6A, may be that it reduces the amount of capacitance needed to implement the converter, such as the capacitance needed for the capacitor $C_{bb}$ holding up voltage $V_H$. Another benefit may be that operation of two half cycle switch configurations discussed above can be used together to realize “soft” discharge of the flying capacitors by the second magnetic stage, and hence the loss of the switched-capacitor stage may be reduced.

One or more controller(s) 605 may control the switches (e.g., $S_{1A}$, $S_{1B}$, $S_{1C}$, $S_{1D}$, $S_{2A}$, $S_{2B}$, $S_{2C}$, $S_{2D}$, $S_3$, $S_4$, $S_5$) in circuit 600 to generate a desired output voltage $V_{OUT}$. For example, controller(s) 605 may alternate between two switch configurations per cycle (for two-phase operation) or three switch configurations per cycle (for tri-phase operation) to synthesize a desired output voltage $V_{OUT}$, as previously discussed. Controller(s) 605 may be implemented as described for controller(s) 155 of FIG. 1B, but with different signal line(s) 607 for controlling the different switches of circuit 600, and with different feedback/feedforward signal line(s) 608 for detecting different feedback/feedforward signals (e.g., voltage $V_{OUT}$, voltage $V_X$, voltage $V_H$, current sensed at $V_{OUT}$, current of inductor L ($i_L$), input voltage $V_{IN}$, current drawn from input energy source $I_{IN}$) based on the different architecture of circuit 600. In some embodiments, controller(s) 605 may comprise a feedforward current shaping controller, such as controller 1805 of FIG. 18A or 18B, and may connect to circuit 600 as shown in FIG. 18A or 18B.

In some embodiments, one or more controllers may be used to operate some of the switches in a circuit, while one or more other controllers may be used to operate other switches in the circuit. For example, a first set of one or more controllers 605 may operate to control on/off states and on/off timing of switches $S_{1A}$, $S_{1B}$, $S_{1C}$, $S_{1D}$, $S_{2A}$, $S_{2B}$, Sec, and $S_{2D}$ in front-end stage 610 via a first set of one or more signal lines (e.g., circuit connections) 607, thereby controlling front-end stage 610 (e.g., interleaved SC doubler stage). A second set of one or more controllers 605 may operate to control on/off states and on/off timing of switches $S_3$, $S_4$, and $S_3$ via a second set of one or more signal lines (e.g., circuit connections) 607, thereby controlling magnetic stage 620 of the circuit. In some embodiments, the first set of one or more controllers 605 may operate switches $S_{1A}$, $S_{1B}$, $S_{1C}$, $S_{1D}$, $S_{2A}$, $S_{2B}$, $S_{2C}$, and $S_{2D}$ in front-end stage 610 at a different frequency and/or duty cycle than the frequency and/or duty cycle at which the second set of one or more controllers 505 may operate switches $S_3$, $S_4$, and $S_5$. For example, a duty cycle at which switches $S_{1A}$, $S_{1B}$, $S_{1C}$, $S_{1D}$, $S_{2A}$, $S_{2B}$, $S_{2C}$, and $S_{2D}$ of the first stage are controlled may depend on the detailed topology and operating regime (e.g., slow-switching limit versus fast switching limit). In some embodiments, the first set of one or more controllers 605 may control switches $S_{1A}$, $S_{1B}$, $S_{1C}$, $S_{1D}$, $S_{2A}$, $S_{2B}$, $S_{2C}$, and $S_{2D}$ of front-end stage 610 at approximately a 50% duty ratio. In some embodiments, switches $S_{1A}$, $S_{1B}$, SIC, $S_{1D}$, $S_{2A}$, $S_{2B}$, $S_{2C}$, and $S_{2D}$ of front-end stage 610 may be operated independently of the switches (e.g., $S_3$, $S_4$, $S_5$) of magnetic stage 620. In some embodiments, a first set of one or more controllers 605 may receive a first set of one or more feedback/feedforward signals 608 and a second set of one or more controllers 605 may receive a second set of feedback/feedforward signals 608 that may be different than the first set of feedback/feedforward signals 608.

In some embodiments, a converter may provide two different output voltages. For example, circuit 640 of FIG. 6B may include a front-end stage 650 and a magnetic stage 660. Front-end stage 650 may be implemented as previously described front-end stage 310 of FIG. 3A or may be a magnetics-based front-end stage (see, e.g., FIGS. 9, 10). Magnetic stage 660 may be configured as a multiple input, multiple output, buck converter with an inductor L, capacitors $C_{B1}$ and $C_{B2}$, and switches $S_3$, $S_4$, and $S_5$. A first end of the buck converter may be connected to any of 3 voltages: $V_H$ (e.g., as output from front-end stage 650), $V_{IN}$, and common 655 (e.g., common ground or 0V). For example, when switch $S_3$ is on and switches $S_4$ and $S_5$ are off, the multi-level buck converter may receive an input voltage of $V_H$ (e.g., $2*V_{IN}$). When switch $S_4$ is on and switches $S_3$ and $S_5$ are off, the multi-level buck converter may receive an input voltage of $V_{IN}$. When switch $S_5$ is on and switches $S_3$ and $S_4$ are off, the multi-level buck converter may receive an input voltage of 0V. The multi-level buck converter in circuit 640 may also include two output voltage options. For example, the multi-level multiple-output buck converter may have capacitors $C_{B1}$ and $C_{B2}$ with different capacitance values and holding two different values of $V_{OUT}$. When switch $S_6$ is on and switch $S_7$ is off, charge may be provided from the converter to support an output voltage $V_{OUT2}$ on capacitor $C_{B2}$. When switch $S_7$ is on and switch $S_6$ is off, charge may be provided from the converter to support an output voltage $V_{OUT1}$ may be provided over capacitor $C_{B1}$. Thus, the same multi-level buck converter may be capable of providing two different output voltages.

One or more controller(s) 612 may control the magnetic stage switches (e.g., $S_3$, $S_4$, $S_5$, $S_6$, $S_7$) and the switches inside front-end stage 650 (see, e.g., FIG. 3A) in circuit 640 to generate a desired output voltage $V_{OUT}$. For example, controller(s) 612 may alternate between two switch configurations per cycle (for two-phase operation) or three switch configurations per cycle (for tri-phase operation) to synthesize a desired output voltage $V_{OUT}$, as previously discussed. Controller(s) 612 may be implemented as described for controller(s) 155 of FIG. 1B, but with different signal line(s) 613 for controlling the different switches of circuit 640, and with different feedback/feedforward signal line(s) 614 for detecting different feedback/feedforward signals (e.g., voltage $V_{OUT1}$, voltage $V_{OUT2}$, voltage $V_X$, voltage $V_H$, voltage $V_{HI}$, current to load sensed at $V_{OUT1}$, current to load sensed at $V_{OUT2}$, current of inductor L ($i_L$), input voltage $V_{IN}$, current drawn from input energy source $I_{IN}$) based on the different architecture of circuit 640. In some embodiments, controller(s) 612 may comprise a feedforward current shaping controller, such as controller 1805 of FIG. 18A or 18B, and may connect to circuit 640 as shown in FIG. 18A or 18B.

In some embodiments, one or more controllers may be used to operate some of the switches in a circuit, while one or more other controllers may be used to operate other switches in the circuit. For example, a first set of one or more controllers 612 may operate to control on/off states and on/off timing of switches in front-end stage 650 via a first set of one or more signal lines (e.g., circuit connections) 613, thereby controlling front-end stage 650 (e.g., SC doubler stage). A second set of one or more controllers 612 may operate to control on/off states and on/off timing of switches $S_3$, $S_4$, and $S_5$ via a second set of one or more signal lines (e.g., circuit connections) 613, thereby controlling magnetic stage 660 of the circuit. In some embodiments, the first set of one or more controllers 612 may operate the switches in front-end stage 650 at a different frequency and/or duty cycle than the frequency and/or duty cycle at which the second set of one or more controllers 612 may operate switches $S_3$, $S_4$, and $S_5$. For example, a duty cycle at which switches of first stage 650 are controlled may depend on the detailed topology and operating regime (e.g., slow-switching limit versus fast switching limit). In some embodiments, the first set of one or more controllers 612 may control the switches of front-end stage 650 at approximately a 50% duty ratio. In some embodiments, the switches of front-end stage 650 may be operated independently of the switches (e.g., $S_3$, $S_4$, $S_5$) of magnetic stage 660. In some embodiments, a first set of one or more controllers 612 may receive a first set of one or more feedback/feedforward signals 614 and a second set of one or more controllers 612 may receive a second set of feedback/feedforward signals 614 that may be different than the first set of feedback/feedforward signals 614.

Figure 6B:
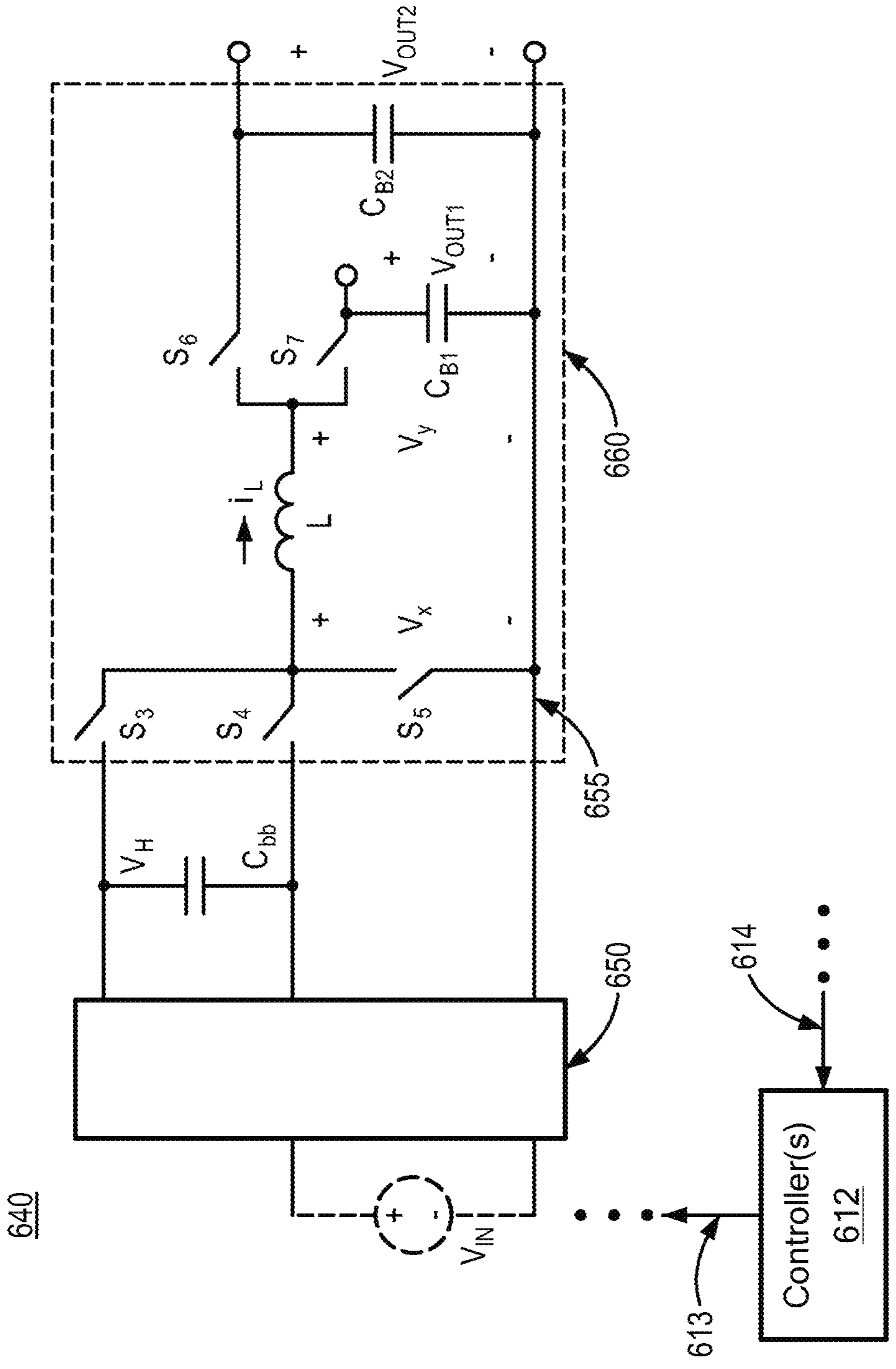
FIG. 6B is a schematic diagram of an example circuit that utilizes multiple input, multiple output buck converter.
Figure 6C:
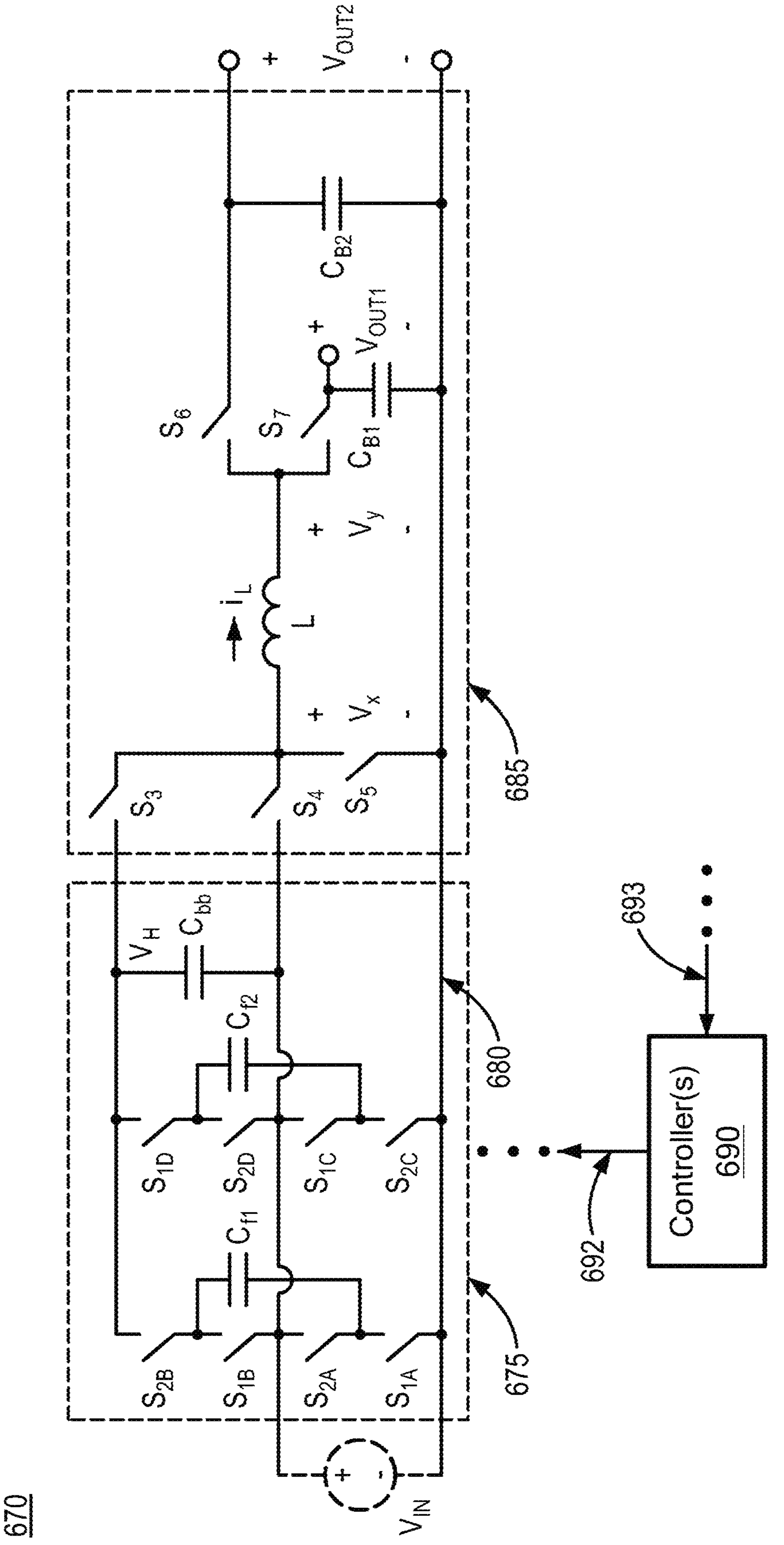
FIG. 6C is a schematic diagram of an example circuit that utilizes an interleaved switched-capacitor front-end stage and a multiple input, multiple output buck converter.

In some embodiments, front-end stage 610 (e.g., interleaved switched-capacitor voltage doubler) of circuit 600 and the multi-level multiple output buck converter of circuit 650 may be combined. For example, FIG. 6C shows a circuit 670 that may have a front-end stage 675 that includes an interleaved SC voltage doubler and a magnetic stage 685 with a multi-level multiple output buck converter. Front-end stage 675 may operate as described with respect to front-end stage 610 of FIG. 6A, and magnetic stage 685 may be operated as discussed above with respect to magnetic stage 660 of FIG. 6B.

One or more controller(s) 690 may control the switches (e.g., $S_{1A}$, $S_{1B}$, $S_{1C}$, $S_{1D}$, $S_{2A}$, $S_{2B}$, $S_{2C}$, $S_{2D}$, $S_3$, $S_4$, $S_5$, $S_6$, $S_7$) in circuit 670 to generate a desired output voltage $V_{OUT}$. For example, controller(s) 690 may alternate between two switch configurations per cycle (for two-phase operation) or three switch configurations per cycle (for tri-phase operation) to synthesize a desired output voltage $V_{OUT}$, as previously discussed. Controller(s) 690 may be implemented as described for controller(s) 155 of FIG. 1B, but with different signal line(s) 692 for controlling the different switches of circuit 670, and with different feedback/feedforward signal line(s) 693 for detecting different feedback/feedforward signals (e.g., voltage $V_{OUT1}$, voltage $V_{OUT2}$, voltage $V_X$, voltage $V_H$, current sensed at $V_{OUT1}$, current sensed at $V_{OUT2}$, current of inductor L ($i_L$), input voltage $V_{IN}$, current drawn from input energy source $I_{IN}$) based on the different architecture of circuit 670. In some embodiments, controller(s) 690 may comprise a feedforward current shaping controller, such as controller 1805 of FIG. 18A or 18B, and may connect to circuit 670 as shown in FIG. 18A or 18B.

In some embodiments, one or more controllers may be used to operate some of the switches in a circuit, while one or more other controllers may be used to operate other switches in the circuit. For example, a first set of one or more controllers 690 may operate to control on/off states and on/off timing of switches $S_{1A}$, $S_{1B}$, $S_{1C}$, $S_{1D}$, $S_{2A}$, $S_{2B}$, Sec, and $S_{2D}$ in front-end stage 675 via a first set of one or more signal lines (e.g., circuit connections) 692, thereby controlling front-end stage 675 (e.g., interleaved SC doubler stage). A second set of one or more controllers 690 may operate to control on/off states and on/off timing of switches $S_3$, $S_4$, and $S_3$ via a second set of one or more signal lines (e.g., circuit connections) 692, thereby controlling magnetic stage 685 of the circuit. In some embodiments, the first set of one or more controllers 690 may operate switches $S_{1A}$, $S_{1B}$, $S_{1C}$, $S_{1D}$, $S_{2A}$, $S_{2B}$, $S_{2C}$, and $S_{2D}$ in front-end stage 675 at a different frequency and/or duty cycle than the frequency and/or duty cycle at which the second set of one or more controllers 690 may operate switches $S_3$, $S_4$, and $S_5$. For example, a duty cycle at which switches $S_{1A}$, SIB, $S_{1C}$, $S_{1D}$, $S_{2A}$, $S_{2B}$, Sec, and $S_{2D}$ of the first stage are controlled may depend on the detailed topology and operating regime (e.g., slow-switching limit versus fast switching limit). In some embodiments, the first set of one or more controllers 690 may control switches $S_{1A}$, $S_{1B}$, $S_{1C}$, $S_{1D}$, $S_{2A}$, $S_{2B}$, $S_{2C}$, and $S_{2D}$ of front-end stage 675 at approximately a 50% duty ratio. In some embodiments, switches $S_{1A}$, $S_{1B}$, $S_{1C}$, $S_{1D}$, $S_{2A}$, $S_{2B}$, $S_{2C}$, and $S_{2D}$ of front-end stage 675 may be operated independently of the switches (e.g., $S_3$, $S_4$, $S_5$) of magnetic stage 685. In some embodiments, a first set of one or more controllers 690 may receive a first set of one or more feedback/feedforward signals 693 and a second set of one or more controllers 690 may receive a second set of feedback/feedforward signals 693 that may be different than the first set of feedback/feedforward signals 693.

Figure 7:
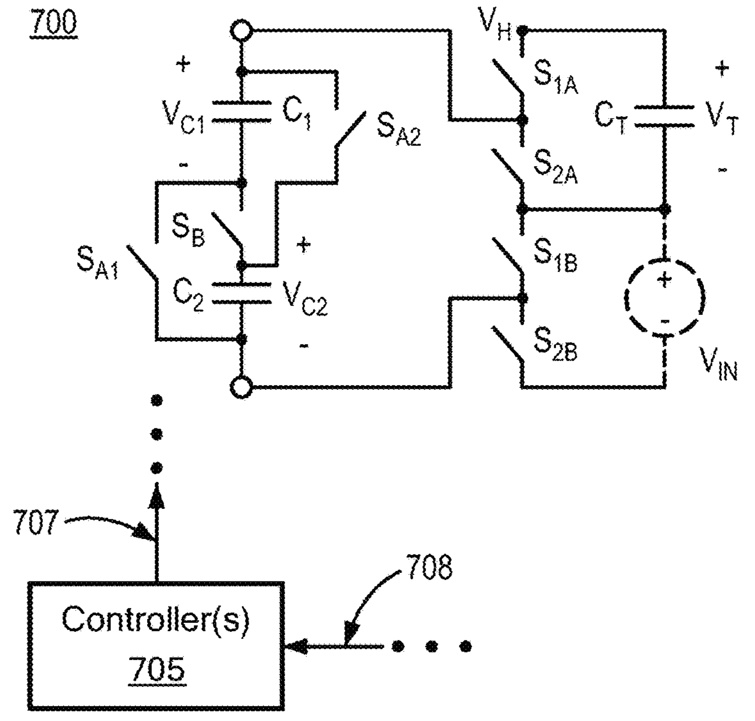
FIG. 7 is a schematic diagram of an example circuit that may be used as a reconfigurable switched-capacitor front-end stage.

In some embodiments, the voltage $V_H$ in the front-end stage implementations discussed above with respect to FIGS. 3A-6C may become undesirably large when $V_{IN}$ is at the upper portion of its range. For example, if $V_{IN}$ is provided by a battery that discharges over time, $V_H$ may be undesirably high when the battery is fully charged or near fully charged. This limitation may be solved through use of a reconfigurable front-end (e.g., reconfigurable switched-capacitor converter, reconfigurable magnetics-based front-end) capable of converting voltages at multiple conversion ratios, and by selecting a conversion ratio that yields a voltage $V_H$ in a desirable range. FIG. 7 shows a circuit 700 that may be used as a reconfigurable switched-capacitor front-end stage. Circuit 700 may be used to provide a voltage $V_T$ that is near either $V_{IN}$ or $0.5*V_{IN}$, and hence a voltage $V_H$ that is close to one of $2*V_{IN}$ or $1.5*V_{IN}$ depending upon operating mode. Voltage $V_T$ may then be used as voltage $V_H$ to the magnetic stage in the circuits previously described with respect to FIGS. 3A-6C.

In circuit 700, when switches $S_{A1}$ and $S_{A2}$ are on and switch $S_B$ is off, capacitors $C_1$ and $C_2$ may be placed in parallel. When switch $S_B$ is on and switches $S_{A1}$ and $S_{A2}$ are off, capacitors $C_1$ and $C_2$ may be placed in series. When it is desired to provide a voltage $V_H$ that is close to $2*V_{IN}$, one or more operation modes may be used where either switches $S_{A1}$ and $S_{A2}$ may be held on continuously and switch $S_B$ held off, or where switch $S_B$ may be held on continuously and switches $S_{A1}$ and $S_{A2}$ held off, and the converter may then alternate between a first configuration where switches $S_{1A}$ and $S_{1B}$ are on and switches $S_{2A}$ and $S_{2B}$ are off and a second configuration where switches $S_{2A}$ and $S_{2B}$ are on and switches $S_{1A}$ and $S_{1B}$ are off.

When it is desired to provide a voltage $V_H$ close to $1.5*V_{IN}$, one or more operation modes may be used where the converter may be alternated between a configuration where switches $S_B$, $S_{2A}$, and $S_{2B}$ are on and switches $S_{A1}$, $S_{A2}$, $S_{1A}$, and SIB are off, and a second configuration where switches $S_{A1}$, $S_{A2}$, $S_{1A}$, and $S_{1B}$ are on and switches $S_B$, $S_{2A}$, and $S_{2B}$ are off. This alternating may provide for charging of capacitors $C_1$ and $C_2$ in series from $V_{IN}$ and for discharging capacitors $C_1$ and $C_2$ in parallel to voltage $V_T$. Although voltages of $2*V_{IN}$ and $1.5*V_{IN}$ are described with respect to FIG. 7, the disclosure is not so limited. One of ordinary skill in the art would recognize that the reconfigurable converter system architecture 700 of FIG. 7 may be expanded to a greater number of available conversion ratios between $V_{IN}$ and $V_H$, or between $V_{IN}$ and $V_T$, through use of additional configuration switches and energy transfer capacitors. Providing even more available conversion ratios may provide for finer control over the voltage $V_H$ provided with respect to variations in $V_{IN}$.

One or more controller(s) 705 may control the switches (e.g., $S_{A1}$, $S_{A2}$, $S_B$, $S_{1A}$, $S_{1B}$, $S_{2A}$, $S_{2B}$) in circuit 700 to generate a desired output voltage $V_T$. For example, controller(s) 705 may select (e.g. alternate between) switch configurations to synthesize a desired voltage $V_T$, as previously discussed. Controller(s) 705 may be implemented as described for controller(s) 155 of FIG. 1B, but with different signal line(s) 707 for controlling the different switches of circuit 700, and with different feedback/feedforward signal line(s) 708 for detecting different feedback/feedforward signals (e.g., voltage $V_H$, voltage $V_T$, voltage $V_{C1}$, voltage $V_{VC2}$, input voltage $V_{IN}$, current drawn from input energy source $I_{IN}$) based on the different architecture of circuit 700.

Figure 8:
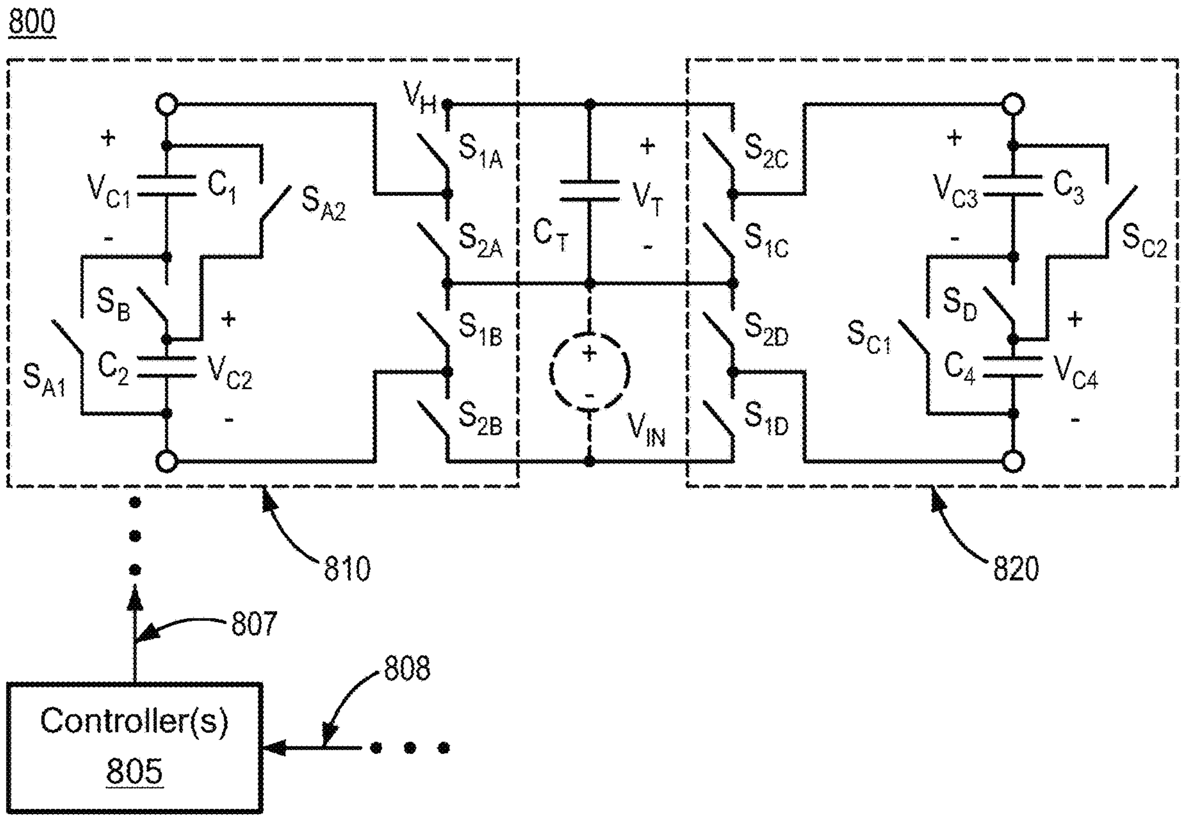
FIG. 8 is a schematic diagram of an example circuit that may be used as an interleaved reconfigurable switched-capacitor front-end stage.

In some embodiments, it may be desirable to utilize a reconfigurable front-end with a reduced total amount of capacitance needed to implement the reconfigurable front-end. FIG. 8 shows an example circuit 800 that may be used as an interleaved reconfigurable front-end. Circuit 800 may include a first reconfigurable front-end circuit 810 and a second reconfigurable front-end circuit 820. Such a converter may be implemented with a reduced total amount of capacitance (e.g., reduced capacitance for capacitor $C_T$) for holding up voltage $V_H$. Another benefit is that operation of first reconfigurable front-end circuit 810 and second reconfigurable front-end circuit 820 may be merged to realize soft "discharge" of the flying capacitors by a magnetic stage, and hence the loss of the reconfigurable front-end circuit may be reduced. Thus, similar benefits are provided as those described above with respect to the interleaved front-end of FIGS. 6A and 6C, but with the added benefit of additional resolution being available for controlling voltage $V_H$. Circuit 800 may be capable of providing an interleaved front-end converter that may provide a voltage $V_H$ that is close to one of $2*V_{IN}$ or $1.5*V_{IN}$, depending upon a selected operating mode. Circuit 800 may also be capable of providing an interleaved front-end converter that may provide a voltage $V_H$ that is close to $3*V_{IN}$, depending upon a selected operating mode.

Using circuit 800, when it is desired to provide a voltage $V_H$ close to $2*V_{IN}$, one or more operating modes may be used where switches $S_{A1}$ and $S_{A2}$ may be on (with switch $S_B$ off) and where switches $S_{C1}$ and $S_{C2}$ may be on (with switch $S_0$ off) (such that capacitors $C_1$ and $C_2$ are in parallel and capacitors $C_3$ and $C_4$ are in parallel) continuously, or where switch $S_B$ may be on (with switches $S_{A1}$ and $S_{A2}$ off) and where switch $S_0$ may be on (with switches $S_{C1}$ and $S_{C2}$ off) (such that capacitors $C_1$ and $C_2$ are in series and capacitors $C_3$ and $C_4$ are in series) continuously. The circuit may then be alternated between turning switches $S_{1A}$, $S_{1B}$, $S_{1C}$, and $S_{1D}$ on (with switches $S_{2A}$, $S_{2B}$, Sec, and $S_{2D}$ off) and turning switches $S_{2A}$, $S_{2B}$, Sec, and $S_{2D}$ on (with switches $S_{1A}$, $S_{1B}$, $S_{1C}$, and Sip off) in different portions of a switching cycle of the front-end. When it is desired to provide a voltage $V_H$ close to $1.5*V_{IN}$, one or more operating modes may be used where the circuit alternates between having switches $S_B$, $S_{C1}$, $S_{C2}$, $S_{2A}$, $S_{2B}$, Sec, and $S_{2D}$ on (with switches $S_{A1}$, $S_{A2}$, $S_D$, $S_{1A}$, $S_{1B}$, $S_{1C}$, and $S_{1D}$ off) and having switches $S_{A1}$, $S_{A2}$, $S_D$, $S_{1A}$, SIB, $S_{1C}$, and $S_{1D}$ on (with switches $S_B$, $S_{C1}$, $S_{C2}$, $S_{2A}$, $S_{2B}$, $S_{2C}$, and $S_{2D}$ off) in different portions of a switching cycle of the front-end. When it is desired to provide a voltage $V_H$ close to $3*V_{IN}$, one or more operating modes may be used where the circuit alternates between having switches $S_{A1}$, $S_{A2}$, $S_{2A}$, $S_{2B}$, $S_{2C}$, $S_{2D}$, and $S_D$ on (with switches $S_{C1}$, $S_{C2}$, $S_{1A}$, $S_{1B}$, $S_{1C}$, $S_{1D}$, and $S_B$ off) and having switches $S_{C1}$, $S_{C2}$, $S_{1A}$, $S_{1B}$, $S_{1C}$, $S_{1D}$, and $S_B$ on (with switches $S_{A1}$, $S_{A2}$, $S_D$, $S_{2A}$, $S_{2B}$, Sec, and $S_{2D}$ off) in different portions of a switching cycle of the front-end.

One or more controller(s) 805 may provide control signals to control the switches (e.g., $S_{A1}$, $S_{A2}$, $S_B$, $S_{1A}$, $S_{1B}$, $S_{1C}$, $S_{1D}$, $S_{2A}$, $S_{2B}$, $S_{2C}$, $S_{2D}$, $S_{C1}$, $S_{C2}$, $S_D$) in circuit 800 between on and off states to generate a desired output voltage $V_T$. For example, controller(s) 805 may select (or alternate between) switch configurations to synthesize a desired voltage $V_T$, as previously discussed. Controller(s) 805 may be implemented as described for controller(s) 155 of FIG. 1B, but with different signal line(s) 807 for controlling the different switches of circuit 800, and with different feedback/feedforward signal line(s) 808 for detecting different feedback/feedforward signals (e.g., voltage $V_H$, voltage $V_T$, voltage $V_{C1}$, voltage $V_{VC2}$, voltage $V_{C3}$, voltage $V_{C4}$, input voltage $V_{IN}$, current drawn from input energy source $I_{IN}$) based on the different architecture of circuit 800.

Figure 9:
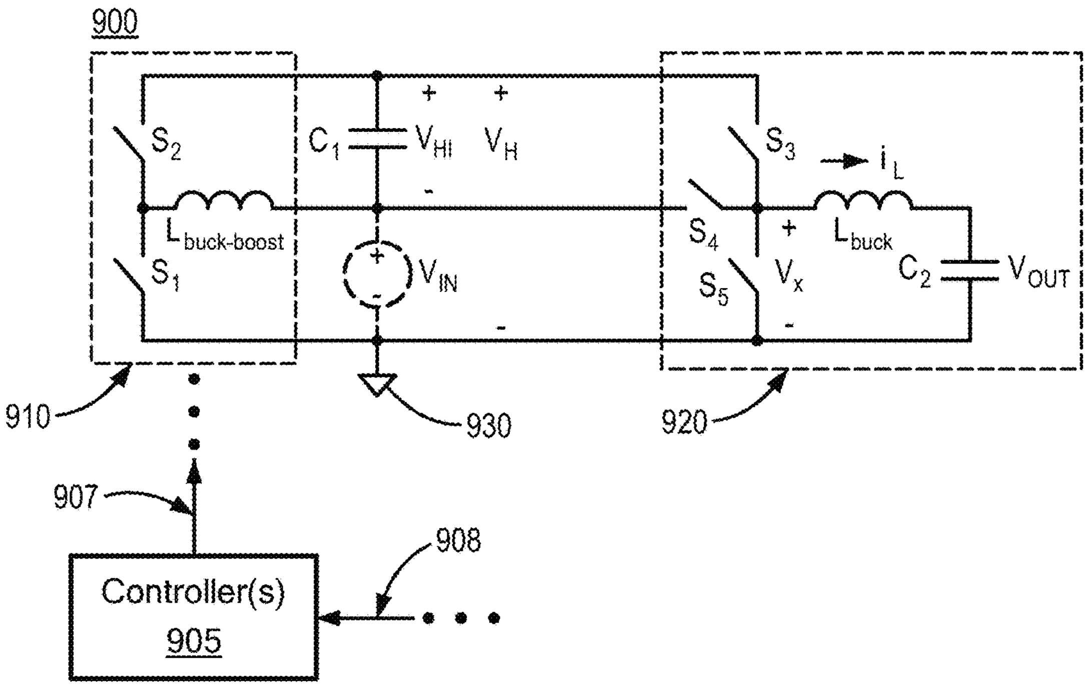
FIG. 9 is a schematic diagram of an example circuit that includes a NRHPZ converter with a magnetics-based front-end stage based on a buck-boost converter.

Switched-capacitor front-end stages, examples of which were described with respect to FIGS. 3A-8, may only be highly efficient near specific ratios of $V_H$ to $V_{IN}$, thereby constraining the values of $V_H$ that may be used. One alternative may be to use a magnetics-based front-end stage, which may allow $V_H$ to be set to a desirable value independent of $V_{IN}$. One example of an NRHPZ converter with a magnetics-based front-end stage based on a buck-boost converter is shown in FIG. 9. Circuit 900 includes a first magnetic stage 910 that is a magnetics-based front-end stage. Switches $S_1$, $S_2$, and an energy storage element (e.g., inductor $L_{buck\text{-}boost}$) together form a buck-boost converter to regulate $V_{HI}$ on capacitor $C_1$, and voltage $V_H$. In this converter, switches $S_1$ and $S_2$ may be operated in a complementary fashion, with a duty ratio of $S_1$ used to control $V_H$ to any desired value greater than $V_{IN}$ (or, equivalently, to control $V_{HI}$ to any desired value having the same polarity as $V_{IN}$). A second magnetics stage 920 may be implemented as a 3-level buck converter with three possible inputs (e.g., $V_H$, $V_{IN}$, 0V), as discussed previously. That is, inductor $L_{buck}$, capacitor $C_2$, and switches $S_3$-$S_5$ may operate together as a 3-level buck converter. When switch $S_3$ is on and switches $S_4$ and $S_3$ are off, the 3-level buck converter may receive an input voltage of $V_H$. When switch $S_4$ is on and switches $S_3$ and $S_3$ are off, the 3-level buck converter may receive an input voltage of $V_{IN}$. When switch $S_5$ is on and switches $S_3$ and $S_4$ are off, the 3-level buck converter may receive an input voltage of 0V (e.g., voltage of common ground 930).

One or more controller(s) 905 may control the switches (e.g., $S_1$, $S_2$, $S_3$, $S_4$, $S_5$) in circuit 900 to generate a desired output voltage $V_{OUT}$. For example, controller(s) 905 may alternate between two switch configurations (for two-phase operation) or three switch configurations (for tri-phase operation) to synthesize a desired output voltage $V_{OUT}$, as previously discussed. Controller(s) 905 may be implemented as described for controller(s) 155 of FIG. 1B, but with different signal line(s) 907 for controlling the different switches of circuit 900, and with different feedback/feedforward signal line(s) 908 for detecting different feedback/feedforward signals (e.g., voltage $V_{OUT}$, voltage $V_X$, voltage $V_H$, voltage $V_{HI}$, current to load sensed at $V_{OUT}$, current of inductor $L_{buck\text{-}boost}$ ($i_{Lbuck\text{-}boost}$), current of inductor $L_{buck}$ ($i_{Lbuck}$), input voltage $V_{IN}$, current drawn from input energy source $I_{IN}$) based on the different architecture of circuit 900. In some embodiments, controller(s) 905 may comprise a feedforward current shaping controller, such as controller 1805 of FIG. 18 or controller 1900 of FIG. 19, and may connect to circuit 900 as shown in FIG. 18A or 18B.

In some embodiments, one or more controllers may be used to operate some of the switches in a circuit, while one or more other controllers may be used to operate other switches in the circuit. For example, a first set of one or more controllers 905 may operate to control on/off states and on/off timing of switches $S_1$ and $S_2$ in first magnetic stage 910 (e.g., magnetic front-end stage) via a first set of one or more signal lines (e.g., circuit connections) 907, thereby controlling first magnetic stage 910 (e.g., magnetic front-end stage). A second set of one or more controllers 905 may operate to control on/off states and on/off timing of switches $S_3$, $S_4$, and S via a second set of one or more signal lines (e.g., circuit connections) 907, thereby controlling second magnetic stage 920 of the circuit. In some embodiments, the first set of one or more controllers 905 may operate switches $S_1$ and $S_2$ in first magnetic stage 910 at a different frequency and/or duty cycle than the frequency and/or duty cycle at which the second set of one or more controllers 905 may operate switches $S_3$, $S_4$, and $S_5$ of second magnetic stage 920. In some embodiments, switches $S_1$ and $S_2$ of first magnetic stage 910 may be operated independently of the switches (e.g., $S_3$, $S_4$, $S_5$) of second magnetic stage 920. In some embodiments, a first set of one or more controllers 905 may receive a first set of one or more feedback/feedforward signals 908 and a second set of one or more controllers 905 may receive a second set of feedback/feedforward signals 908 that may be different than the first set of feedback/feedforward signals 908.

Figure 10:
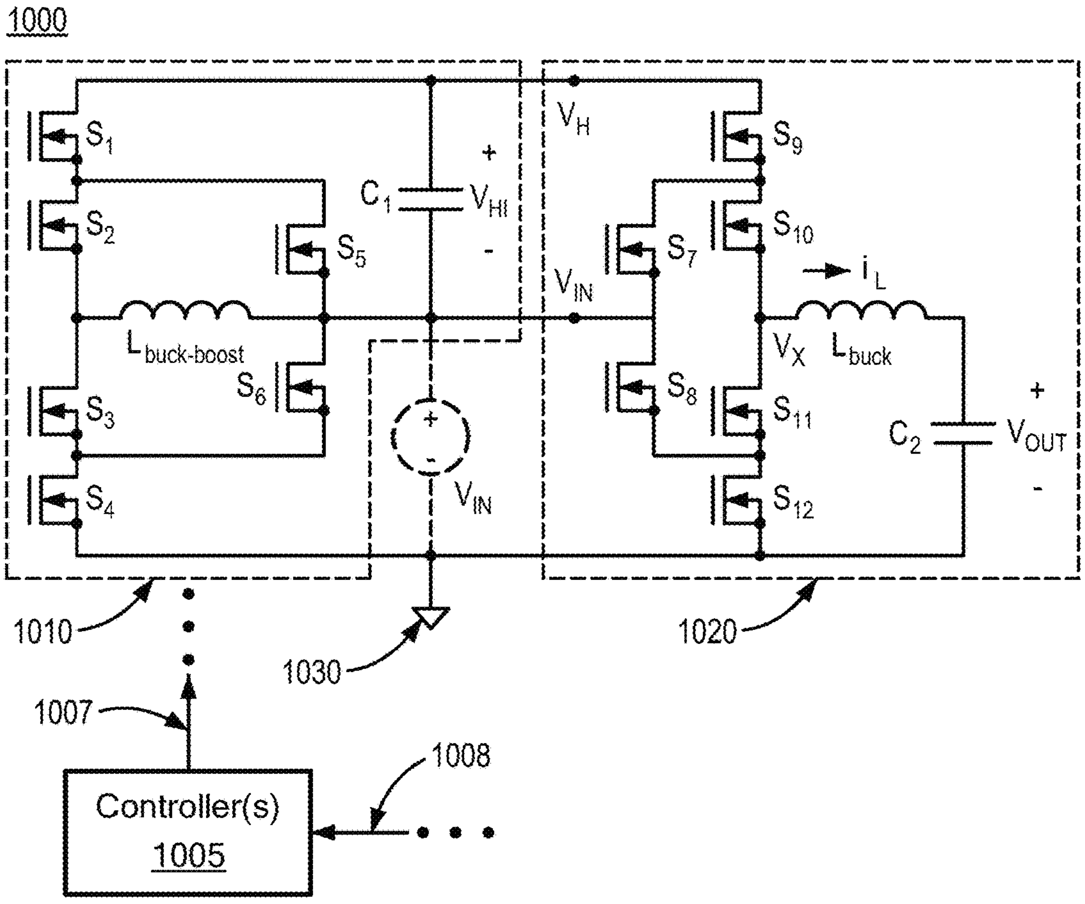
FIG. 10 is a schematic diagram of an example circuit that includes a NRHPZ converter with a magnetic front-end stage based on a buck-boost converter and that uses an active clamp structure.

In some embodiments, it may be desirable to select a range for $V_H$ that enables good utilization of the voltage ratings of semiconductor switches in a CMOS process. It may further be desirable to cascode switches, or use active clamp techniques or topologies to enable reduced-voltage switches to be employed in realizing a converter. FIG. 10 shows a circuit 1000 with an NRHPZ converter that has a first magnetic stage 1010 that is a magnetics-based front-end stage based on a buck-boost converter and using an active clamp structure, similar to that of an active neutral-point clamp converter. Circuit 1000 may also have a second magnetic stage 1020 that is a 3-level magnetic regulation stage based on a buck converter. Like in circuit 900, first magnetic stage 1010 may allow $V_H$ to be set to a desirable value independent of $V_{IN}$. Circuit 1000 may allow for use of reduced-voltage switches and for active clamping of off-state switch voltages. The active clamping structure may also allow the voltage across inductor $L_{buck\text{-}boost}$ to be actively clamped at zero volts, which can be valuable in discontinuous conduction mode. The active clamp on front-end converter 1010 may also allow both ends of inductor $L_{buck\text{-}boost}$ to be actively clamped at $V_{IN}$, which may be valuable, including for limiting ringing in discontinuous-conduction-mode operation. For voltages $V_{HI}$ regulated to, at, or below $V_{IN}$, circuit 1000 may only require individual switches rated for voltage $V_{IN}$.

One or more controller(s) 1005 may control the switches (e.g., $S_1$, $S_2$, $S_3$, $S_4$, $S_5$, $S_6$, $S_7$, $S_8$, $S_9$, $S_{10}$, $S_{11}$, $S_{12}$) in circuit 1000 to generate a desired output voltage $V_{OUT}$. For example, controller(s) 1005 may alternate between two switch configurations per cycle (for two-phase operation) or three switch configurations per cycle (for tri-phase operation) to synthesize a desired output voltage $V_{OUT}$, as previously discussed. Controller(s) 1005 may be implemented as described for controller(s) 155 of FIG. 1B, but with different signal line(s) 1007 for controlling the different switches of circuit 1000, and with different feedback/feedforward signal line(s) 1008 for detecting different feedback/feedforward signals (e.g., voltage $V_{OUT}$, voltage $V_X$, voltage $V_H$, voltage $V_{HI}$, current to load sensed at $V_{OUT}$, current of inductor $L_{buck\text{-}boost}$ ($i_{Lbuck\text{-}boost}$), current of inductor $L_{buck}$ ($i_{Lbuck}$), input voltage $V_{IN}$, current drawn from input energy source $I_{IN}$) based on the different architecture of circuit 1000. In some embodiments, controller(s) 1005 may comprise a feedforward current shaping controller, such as controller 1805 of FIG. 18A or 18B, and may connect to circuit 1000 as shown in FIG. 18A or 18B.

In some embodiments, one or more controllers may be used to operate some of the switches in a circuit, while one or more other controllers may be used to operate other switches in the circuit. For example, a first set of one or more controllers 1005 may operate to control on/off states and on/off timing of switches $S_1$, $S_2$, $S_3$, $S_4$, $S_5$, and $S_6$ in first magnetic stage 1010 (e.g., magnetic front-end stage) via a first set of one or more signal lines (e.g., circuit connections) 1007, thereby controlling first magnetic stage 1010 (e.g., magnetic front-end stage). A second set of one or more controllers 1005 may operate to control on/off states and on/off timing of switches $S_7$, $S_8$, $S_9$, $S_{10}$, $S_{11}$, and $S_{12}$ via a second set of one or more signal lines (e.g., circuit connections) 1007, thereby controlling second magnetic stage 1020 of the circuit. In some embodiments, the first set of one or more controllers 1005 may operate switches $S_1$, $S_2$, $S_3$, $S_4$, $S_5$, and $S_6$ in first magnetic stage 1010 at a different frequency and/or duty cycle than the frequency and/or duty cycle at which the second set of one or more controllers 1005 may operate switches $S_7$, $S_8$, $S_9$, $S_{10}$, $S_{11}$, and $S_{12}$ of second magnetic stage 1020. In some embodiments, switches $S_1$, $S_2$, $S_3$, $S_4$, $S_5$, and $S_6$ of first magnetic stage 1010 may be operated independently of the switches (e.g., $S_7$, $S_8$, $S_9$, $S_{10}$, $S_{11}$, and $S_{12}$) of second magnetic stage 1020. In some embodiments, a first set of one or more controllers 1005 may receive a first set of one or more feedback/feedforward signals 1008 and a second set of one or more controllers 1005 may receive a second set of feedback/feedforward signals 1008 that may be different than the first set of feedback/feedforward signals 1008.

Figure 11:
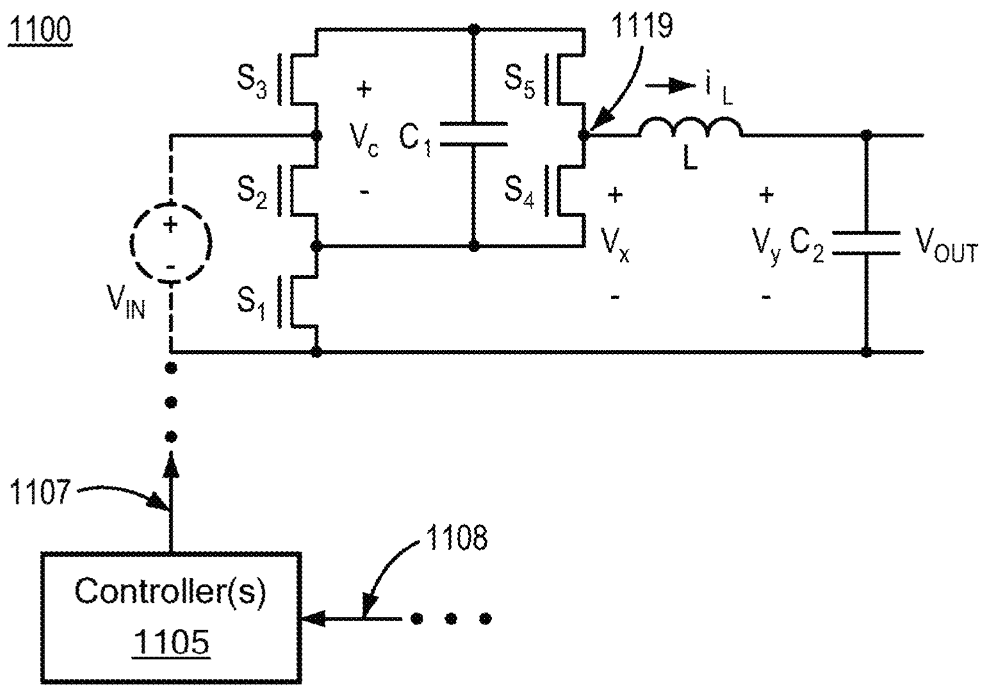
FIG. 11 is a schematic diagram of an example circuit that utilizes a flying capacitor to provide switching voltage levels greater than an input voltage.

In some embodiments, a 3-level NRHPZ converter may be realized without requiring a front-end stage that generates a higher DC voltage, such as $V_H$ as described with respect to FIGS. 3A-10. This may have the added benefit of simplicity as compared with the previously discussed approaches. FIG. 11 shows one example of such a converter. Circuit 1100 of FIG. 11 may be thought of as merging the functions of the first magnetic stage and the second magnetic stage previously discussed into one circuit. Circuit 1100 may utilize a flying capacitor $C_1$ to provide switching voltage levels greater than an input voltage. The voltage $V_X$ for different configurations of switches $S_1$, $S_2$, $S_3$, $S_4$, and $S_5$ is shown below in Table 3. In Table 3, the "state" column lists the various switch configurations for circuit 1100. A "1" listed in a column for a switch means that the switch is on and a "0" listed in a column for a switch means that the switch is off. The voltage listed in the "$V_X$" column indicates the voltage $V_X$ output for the configuration of the five switches shown in the same row. The "Notes" column describes what is happening to the voltage $V_{C1}$ over capacitor $C_1$ with the switch arrangement in that row.

TABLE 3

| State | $S_1$ Switch State | $S_2$ Switch State | $S_3$ Switch State | $S_4$ Switch State | $S_5$ Switch State | Voltage ($V_X$) at Node 1119 | Notes |
|---|---|---|---|---|---|---|---|
| A | 1 | 0 | 0 | 1 | 0 | 0 | $V_C$ static |
| B | 0 | 0 | 1 | 0 | 1 | $V_{IN}$ | $V_C$ static |
| C | 0 | 1 | 0 | 1 | 0 | $V_{IN}$ | $V_C$ static |
| D | 0 | 1 | 0 | 0 | 1 | $V_{IN}+V_C \approx 2{*}V_{IN}$ | $V_C$ soft discharges via $i_L$ |
| E | 0 | 0 | 1 | 1 | 0 | $V_{IN} - V_C \approx 0$ | $V_C$ soft charges via $i_L$ |
| F | 1 | 0 | 1 | 1 | 0 | 0 | $V_C$ hard charges to $V_{IN}$ |
| G | 1 | 0 | 1 | 0 | 1 | $V_{IN}$ | $V_C$ hard charges to $V_{IN}$ |

By modulating among the switch states shown above in Table 3 (e.g., 2 states per switching cycle, or for tri-phase operation 3 states per switching cycle), the local average value of $V_X$ may be controlled, and thus a desired local average at $V_Y$ may be generated. Voltage $V_Y$ may then be used as an output $V_{OUT}$ (e.g., with a capacitive filter $C_2$) or in a single input, multiple output (SIMO) system with additional switches that direct it among multiple outputs. Voltage $V_X$ may be modulated between a $V_{IN}$ state and a $2{*}V_{IN}$ state to provide a desired average voltage $V_Y>V_{IN}$. Voltage $V_X$ may also be modulated between a $V_{IN}$ state and a 0V state to synthesize a desired average voltage $V_Y<V_{IN}$. Triphase control may be used to realize voltages $V_Y$ near $V_{IN}$. Other methods, such as modulating between a $2{*}V_{IN}$ state and a 0V state may also be used to realize voltages $V_Y$ near $V_{IN}$. State E may be used to transiently make $V_X$ near zero (e.g., of a magnitude of less than 10% of $V_{IN}$).

One or more controller(s) 1105 may control the switches (e.g., $S_1$, $S_2$, $S_3$, $S_4$, $S_5$) in circuit 1100 to generate a desired average voltage $V_Y$ or output voltage $V_{OUT}$. For example, controller(s) 1105 may alternate between two switch configurations per cycle (for two-phase operation) or three switch configurations per cycle (for tri-phase operation) to synthesize a desired average voltage $V_Y$ or output voltage $V_{OUT}$, as previously discussed. Controller(s) 1105 may be implemented as described for controller(s) 155 of FIG. 1B, but with different signal line(s) 1107 for controlling the different switches of circuit 1100, and with different feedback/feedforward signal line(s) 1108 for detecting different feedback/feedforward signals (e.g., voltage $V_{OUT}$, voltage $V_X$, voltage $V_Y$, voltage $V_C$, current to load sensed at $V_{OUT}$, current of inductor L ($i_L$), input voltage $V_{IN}$, current drawn from input energy source $I_{IN}$) based on the different architecture of circuit 1100. In some embodiments, controller(s)

1105 may comprise a feedforward current shaping controller, such as controller 1805 of FIG. 18A or 18B, and may connect to circuit 1100 as shown in FIG. 18A or 18B.

Figure 12:
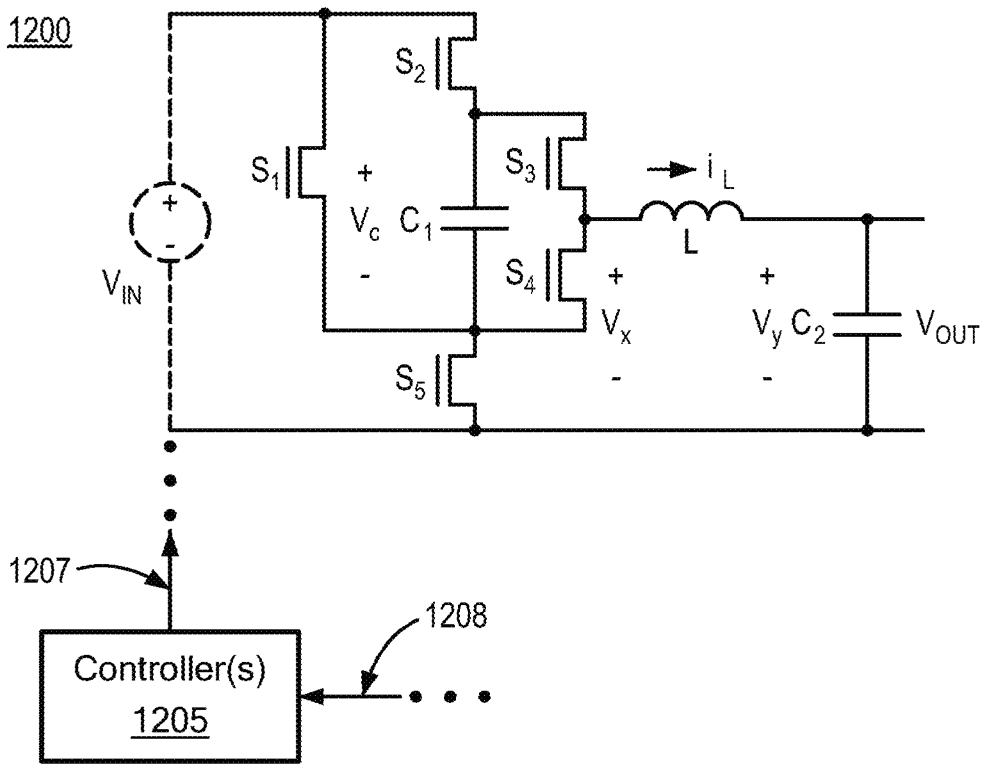
FIG. 12 is a schematic diagram of an example circuit with another topology for generating desired switching levels.

A person of skill in the art would recognize that other topologies may be realized that may likewise generate the desired switching levels. One such example topology is shown in FIG. 12. One or more controller(s) 1205 may control the switches (e.g., $S_1$, $S_2$, $S_3$, $S_4$, $S_5$) in circuit 1200 to generate a desired average voltage $V_Y$ or output voltage $V_{OUT}$. For example, controller(s) 1205 may alternate between two switch configurations per cycle (for two-phase operation) or three switch configurations per cycle (for tri-phase operation) to synthesize a desired average voltage $V_Y$ or output voltage $V_{OUT}$, as previously discussed. Controller(s) 1205 may be implemented as described for controller(s) 155 of FIG. 1B, but with different signal line(s) 1207 for controlling the different switches of system architecture 1200, and with different feedback/feedforward signal line(s) 1208 for detecting different feedback/feedforward signals (e.g., voltage $V_{OUT}$, voltage $V_X$, average voltage $V_Y$, voltage $V_{C1}$, current to load sensed at $V_{OUT}$, current of inductor L ($i_L$), input voltage $V_{IN}$, current drawn from input energy source $I_{IN}$) based on the different architecture of circuit 1200. In some embodiments, controller(s) 1205 may comprise a feedforward current shaping controller, such as controller 1800 of FIG. 18A or 18B, and may connect to system architecture 1205 as shown in FIG. 18A or 18B.

While the circuits described with respect to FIGS. 9-12 may have the benefit of simplicity, they may have high loss when synthesizing output voltages near $2*V_{IN}$, owing to limitations on time for charge transfer to the flying capacitor $C_1$. This problem may be addressed by using an interleaved version of the circuit in which two flying capacitors may be alternately connected to synthesize voltage $V_X$ above $V_{IN}$. One converter capable of this is circuit 1300, shown in FIG. 13. In circuit 1300, switches $S_1$, $S_{1A}$, $S_{1B}$, $S_2$, $S_{2A}$, and $S_{2B}$ may be rated for $V_{IN}$. Switches $S_{M1}$ and $S_{M2}$ may be rated for $+/-V_{IN}$ (bidirectional blocking). Switch $S_{M3}$ may be rated for $2*V_{IN}$. Switch $S_{M3}$ may also be realized as a series connection of lower-voltage switches or as a 3-switch structure allowing a clamp to $V_{IN}$.

The voltage $V_X$ for different configurations of switches $S_1$, $S_{1A}$, $S_{1B}$, $S_2$, $S_{2A}$, $S_{2B}$, $S_{M1}$, $S_{M2}$, and $S_{M3}$ is shown below in Table 4. In Table 4, the "state" column lists various switch configurations for circuit 1300. The "Switches on" column lists the switches that are on for the state in a row. Switches not listed as being on may be assumed to be off in that state. The "$V_X$" column indicates the voltage $V_X$ output for the configuration of switches shown in the same row.

TABLE 4

| State | Switches on | Voltage ($V_X$) at Node 1319 |
|---|---|---|
| 1 | $S_{1A}$, $S_{1B}$, $S_{2A}$, $S_{2B}$, $S_{M3}$ | 0 |
| 2 | $S_{1A}$, $S_{1B}$, $S_{2A}$, $S_{2B}$, $S_{M1}$, $S_{M2}$ | $V_{IN}$ |
| 3 | $S_1$, $S_{2A}$, $S_{2B}$, $S_{M1}$ | $V_{IN} + V_{C1} \approx 2*V_{IN}$ |
| 4 | $S_{1A}$, $S_{1B}$, $S_2$, $S_{M2}$ | $V_{IN} + V_{C2} \approx 2*V_{IN}$ |

To synthesize a voltage above $V_{IN}$, the converter may be switched between states 3 and 2 in a first cycle, and between states 4 and 2 in a second cycle, alternating between first and second cycles. To synthesize a voltage below $V_{IN}$, the converter may be switched between states 2 and 1 each cycle. To synthesize voltage outputs near $V_{IN}$, the converter may be used with tri-phase switching among states 2, 3, and 1 in a first cycle and between states 2, 4, and 1 in a second cycle, alternating between first and second cycles.

One or more controller(s) 1305 may control the switches (e.g., $S_{1A}$, $S_{1B}$, $S_1$, $S_{2A}$, $S_{2B}$, $S_2$, $S_{M1}$, $S_{M2}$, $S_{M3}$) in circuit 1300 to generate a desired average voltage $V_Y$ or output voltage $V_{OUT}$. For example, controller(s) 1305 may alternate between two switch configurations (for two-phase operation) or three switch configurations (for tri-phase operation) to synthesize a desired average voltage $V_Y$ or output voltage $V_{OUT}$, as previously discussed. Controller(s) 1305 may be implemented as described for controller(s) 155 of FIG. 1B, but with different signal line(s) 1307 for controlling the different switches of circuit 1300, and with different feedback/feedforward signal line(s) 1308 for detecting different feedback/feedforward signals (e.g., voltage $V_{OUT}$, voltage $V_X$, average voltage $V_Y$, voltage $V_{C1}$, voltage $V_{C2}$, current to load sensed at $V_{OUT}$, current of inductor L ($i_L$), input voltage $V_{IN}$, current drawn from input energy source $I_{IN}$) based on the different architecture of circuit 1300. In some embodiments, controller(s) 1305 may comprise a feedforward current shaping controller, such as controller 1805 of FIG. 18A or 18B, and may connect to circuit 1300 as shown in FIG. 18A or 18B.

Multi-Output Architectures with NRHPZ Converter Circuits

In discrete supply modulation systems, multiple voltages (e.g., $V_A$, $V_B$, $V_C$, . . . ) may be generated (e.g., with a multiple-output supply generator), from which a supply modulator may select a desired input voltage. There are a variety of ways by which multiple voltage outputs may be realized with NRHPZ conversion. One way may be to generate two or more levels using a SIMO converter based on an NHRPZ structure, such as illustrated in FIGS. 6B and 6C. Given two outputs, such as shown in FIGS. 6B and 6C, additional outputs may be generated using a switched-capacitor converter or differential switched capacitor converter connected to one or both the outputs.

Figure 14A:
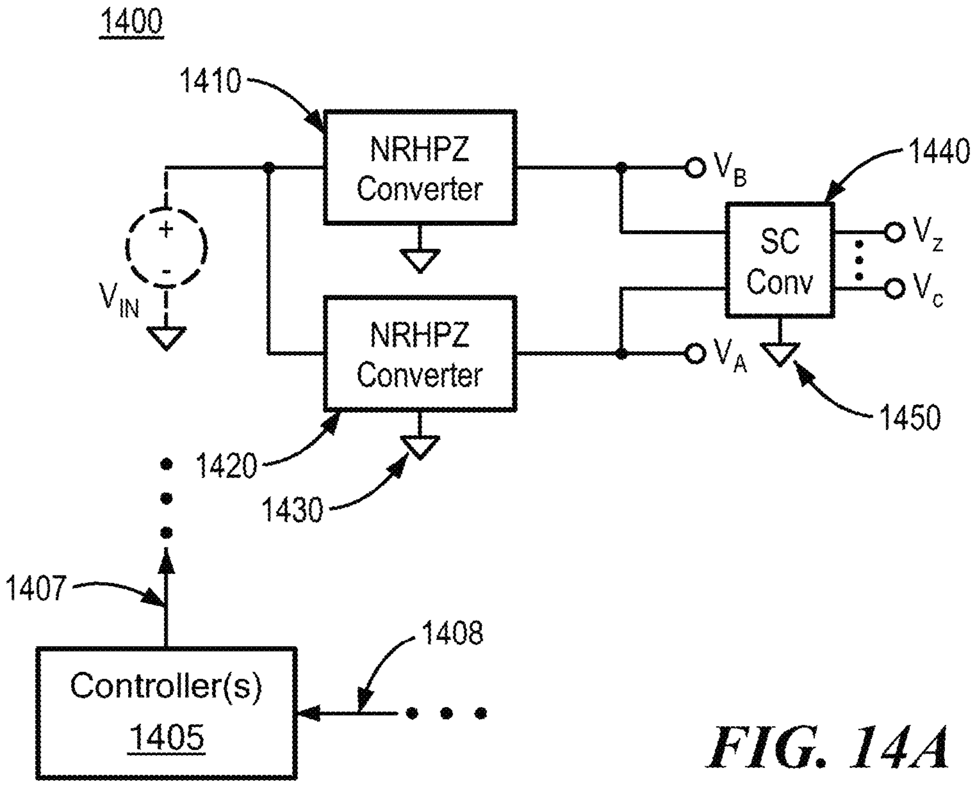
FIG. 14A is a block diagram of an example circuit that incorporates two NRHPZ converters with their inputs connected to an energy source and with their outputs connected to inputs of a switched-capacitor converter.
Figure 14B:
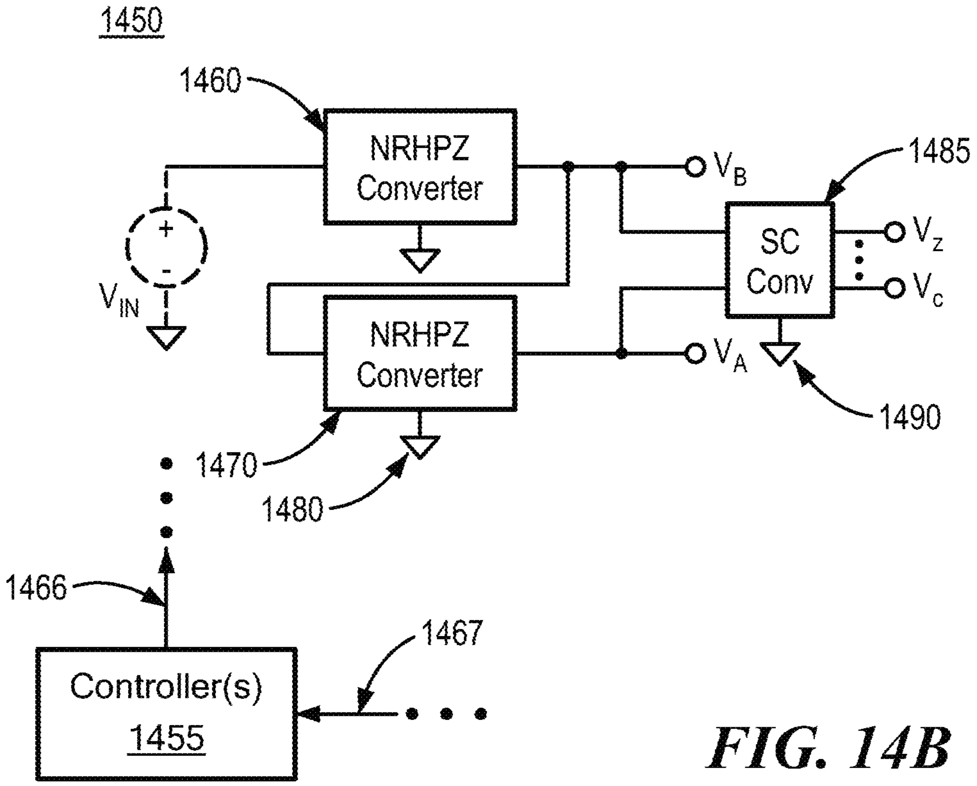
FIG. 14B is a block diagram of an example circuit that incorporates two NRHPZ converters in cascade with their outputs connected to inputs of a switched-capacitor converter.

Another way of synthesizing multiple outputs may be to use two or more NRHPZ converters, including in any of the configurations suggested in FIG. 2A, 2B, or 2C. FIGS. 14A and 14B show example circuits 1400 and 1450, respectively, each of which incorporates two NRHPZ converters. For example, circuit 1400 of FIG. 14A includes an NRHPZ converter 1410 and an NRHPZ converter 1420, both connected to a voltage source $V_{IN}$ and a common ground 1430. A switched-capacitor (SC) stage 1440 may be connected to the outputs of the two NRHPZ converters 1410, 1420 and may be used to generate additional outputs based on the outputs of the NRHPZ converters. SC stage 1440 may also optionally have a common ground with the NRHPZ converters 1410, 1420. For example, SC stage 1440 may be implemented with a common-referenced or differential SC converter structure. In some embodiments, one or more additional NRHPZ converters may be introduced into the architecture to generate even more voltage outputs.

One or more controller(s) 1405 may control switches in NRHPZ converters 1410, 1420 and in SC stage 1440 in circuit 1400 to generate desired output voltages $V_A$, $V_B$, and $V_C$. For example, controller(s) 1405 may alternate between two switch configurations per cycle (for two-phase operation) or three switch configurations per cycle (for tri-phase operation) to synthesize a desired output voltage $V_A$, $V_B$, and/or $V_C$, as previously discussed. Controller(s) 1405 may be implemented as described for controller(s) 155 of FIG. 1B, but with different signal line(s) 1407 for controlling the different switches of circuit 1400, and with different feedback/feedforward signal line(s) 1408 for detecting different feedback/feedforward signals (e.g., voltage $V_A$, voltage $V_B$, voltage $V_C$, voltage $V_{IN}$, current to load sensed at $V_A$, current to load sensed at $V_B$, current to load sensed at $V_C$, current of inductors (in NRHPZ converters 1410, 1420), voltage levels held up by capacitors in SC stage 1440, current drawn from input energy source $I_{IN}$) based on the different architecture of circuit 1400. In some embodiments, controller(s) 1405 may comprise a feedforward current shaping controller, such as controller 1805 of FIG. 18A or 18B, and may connect to circuit 1400 as shown in FIG. 18A or 18B.

In some embodiments, one or more controllers may be used to operate some of the switches in a circuit, while one or more other controllers may be used to operate other switches in the circuit. For example, a first set of one or more controllers 1405 may operate to control on/off states and on/off timing of switches in NRHPZ converter 1410 via a first set of one or more signal lines (e.g., circuit connections) 1407, thereby controlling NRHPZ converter 1410. A second set of one or more controllers 1405 may operate to control on/off states and on/off timing of switches in NRHPZ converter 1420 via a second set of one or more signal lines (e.g., circuit connections) 1407, thereby controlling NRHPZ converter 1420. A third set of one or more controllers 1405 may operate to control on/off states and/or on/off timing of switches in SC converter 1440 via a third set of one or more signal lines (e.g., circuit connections) 1407, thereby controlling SC converter 1440. In some embodiments, the first set of one or more controllers 1405 may operate switches in NRHPZ converter 1410 at a different frequency and/or duty cycle than the frequency and/or duty cycle at which the second set of one or more controllers 1405 may operate switches in NRHPZ converter 1420 and/or than the frequency and/or duty cycle at which the third set of one or more controllers 1405 may operate switches in SC converter 1440. In some embodiments, the third set of one or more controllers 1405 may operate switches in SC converter 1450 at a different frequency and/or duty cycle than the frequency and/or duty cycle at which the first set of one or more controllers 1405 may operate switches in NRHPZ converter 1410 and/or than the frequency and/or duty cycle at which the second set of one or more controllers 1405 may operate switches in NRHPZ converter 1420. For example, a duty cycle at which switches in SC converter 1440 operate may depend on the detailed topology and operating regime (e.g., slow-switching limit versus fast switching limit). In some embodiments, the third set of one or more controllers 1405 may control the switches of SC converter 1440 at approximately a 50% duty ratio. In some embodiments, the switches of NRHPZ converter 1410 may be operated independently of the switches of NRHPZ converter 1420 and/or SC converter 1440. In some embodiments, the switches of SC converter 1440 may be operated independently of the switches of NRHPZ converter 1410 and/or NRHPZ converter 1420. In some embodiments, a first set of one or more controllers 1405 may receive a first set of one or more feedback/feedforward signals 1408, a second set of one or more controllers 1405 may receive a second set of feedback/feedforward signals 1408 that may be different than the first set of feedback/feedforward signals 1408, and the third set of one or more controllers 1405 may receive a third set of feedback/feedforward signals 1408 different than the first and second sets of feedback/feedforward signals 1408.

Circuit 1450 of FIG. 14B includes an NRHPZ converter 1460 and an NRHPZ converter 1470, both connected to a voltage source $V_{IN}$ and a common ground 1480. The two NRHPZ converters 1460, 1470 may be connected with a cascaded interconnection, as shown. A SC stage 1485 may be connected to the voltage outputs (e.g., $V_A$, $V_B$) of the two NRHPZ converters 1460, 1470 and may be used to generate additional voltage outputs (e.g., $V_C$, . . . , $V_Z$) based on the voltage outputs of the NRHPZ converters 1460, 1470. SC stage 1485 may also optionally have a common ground with the NRHPZ converters 1460, 1470. For example, SC stage 1485 may be implemented with a common-referenced or differential SC converter structure. In some embodiments, one or more additional NRHPZ converters may be introduced into the circuit to generate even more voltage outputs.

One or more controller(s) 1455 may control switches in NRHPZ converters 1460, 1470 and in SC stage 1485 in circuit 1450 to generate desired output voltages $V_A$, $V_B$, and $V_C$. For example, controller(s) 1455 may alternate between two switch configurations per cycle (for two-phase operation) or three switch configurations per cycle (for tri-phase operation) to synthesize a desired output voltage $V_A$, $V_B$, and/or $V_C$, as previously discussed. Controller(s) 1455 may be implemented as described for controller(s) 155 of FIG. 1B, but with different signal line(s) 1466 for controlling the different switches of circuit 1400, and with different feedback/feedforward signal line(s) 1467 different for detecting feedback/feedforward signals (e.g., voltage $V_A$, voltage $V_B$, voltage $V_C$, voltage $V_{IN}$, current to load sensed at $V_A$, current to load sensed at $V_B$, current to load sensed at $V_C$, current of inductors (in NRHPZ converters 1460, 1470), voltage levels held up by capacitors in SC stage 1485, current drawn from input energy source $I_{IN}$) based on the different architecture of circuit 1450. In some embodiments, controller(s) 1455 may comprise a feedforward current shaping controller, such as controller 1805 of FIG. 18A or 18B, and may connect to circuit 1450 as shown in FIG. 18A or 18B.

In some embodiments, one or more controllers may be used to operate some of the switches in a circuit, while one or more other controllers may be used to operate other switches in the circuit. For example, a first set of one or more controllers 1455 may operate to control on/off states and on/off timing of switches in NRHPZ converter 1460 via a first set of one or more signal lines (e.g., circuit connections) 1466, thereby controlling NRHPZ converter 1460. A second set of one or more controllers 1455 may operate to control on/off states and on/off timing of switches in NRHPZ converter 1470 via a second set of one or more signal lines (e.g., circuit connections) 1466, thereby controlling NRHPZ converter 1470. A third set of one or more controllers 1405 may operate to control on/off states and/or on/off timing of switches in SC converter 1485 via a third set of one or more signal lines (e.g., circuit connections) 1466, thereby controlling SC converter 1440. In some embodiments, the first set of one or more controllers 1455 may operate switches in NRHPZ converter 1460 at a different frequency and/or duty cycle than the frequency and/or duty cycle at which the second set of one or more controllers 1455 may operate switches in NRHPZ converter 1470 and/or than the frequency and/or duty cycle at which the third set of one or more controllers 1455 may operate switches in SC converter 1485. In some embodiments, the third set of one or more controllers 1455 may operate switches of SC converter 1485 at a different frequency and/or duty cycle than the frequency and/or duty cycle at which the first set of one or more controllers 1455 may operate switches in NRHPZ converter 1460 and/or at a different frequency and/or duty cycle than the frequency and/or duty cycle at which the second set of one or more controllers 1455 may operate switches in NRHPZ converter 1470. For example, a duty cycle at which switches in SC converter 1485 operate may depend on the detailed topology and operating regime (e.g., slow-switching limit versus fast switching limit). In some embodiments, the third set of one or more controllers 1455 may control the switches of SC converter 1485 at approximately a 50% duty ratio. In some embodiments, the switches of NRHPZ converter 1460 may be operated independently of the switches of NRHPZ converter 1470 and/or SC converter 1485. In some embodiments, the switches of SC converter 1485 may be operated independently of the switches of NRHPZ converter 1460 and/or NRHPZ converter 1470. In some embodiments, a first set of one or more controllers 1455 may receive a first set of one or more feedback/feedforward signals 1467, a second set of one or more controllers 1455 may receive a second set of feedback/feedforward signals 1467 that may be different than the first set of feedback/feedforward signals 1467, and the third set of one or more controllers 1455 may receive a third set of feedback/feedforward signals 1467 different than the first and second sets of feedback/feedforward signals 1467.

Figure 15:
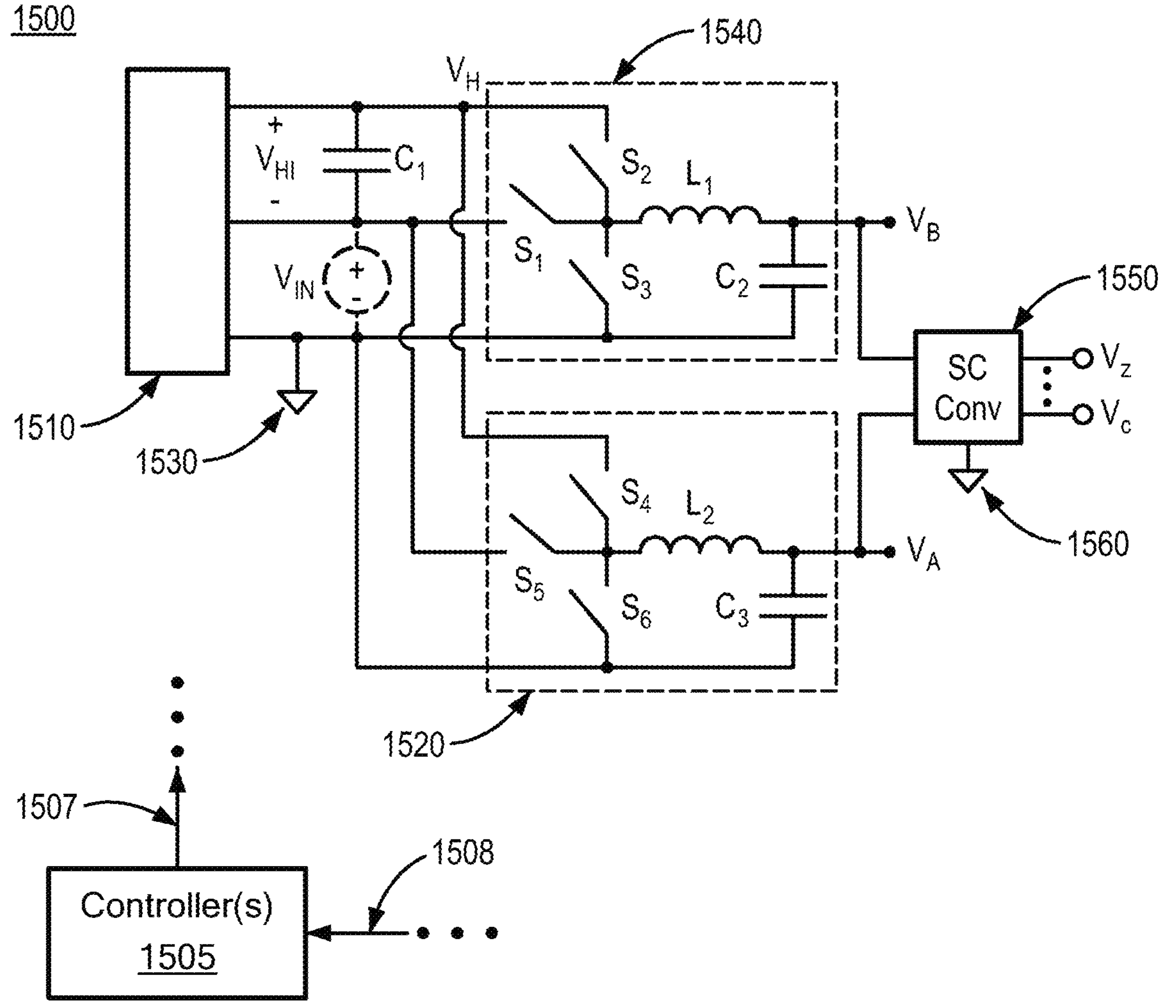
FIG. 15 is a schematic diagram of an example circuit that includes a boosting front-end stage shared by two NRHPZ converters, with inputs of the NRHPZ converters connected to the boosting front-end stage and outputs of the NRHPZ converters connected to inputs of a switched-capacitor converter.

In some embodiments, circuit blocks may be shared to generate a multiple-output NRHPZ converter. For example, a 3-level NRHPZ converter may employ a front-end stage (e.g., boost stage) to generate an additional voltage level above $V_{IN}$, such as is shown in FIGS. 3A-10. This front-end stage may be shared together with multiple 2-level and/or 3-level magnetic conversion stages to generate multiple outputs. One example of such an implementation is shown in FIG. 15. In circuit 1500 of FIG. 15, additional voltage outputs may be generated with a switched-capacitor (SC) conversion stage 1550 fed from one or both outputs of a multiple output converter and/or common ground, or by use of additional three-level magnetic converter stages fed from the same front-end stage. For example, circuit 1500 may include a front-end stage (magnetic or switched-capacitor boost stage) 1510 that charges a capacitor $C_1$. Circuit 1500 may further include two 3-level magnetic stages (e.g., 3-level buck converters) 1520, 1540 connected to front-end stage 1510, 3-level magnetic stage 1520 outputting a voltage $V_A$, and 3-level magnetic stage 1540 outputting a voltage $V_B$. Circuit 1500 may also include a switched-capacitor converter stage 1550 connected to output voltages $V_A$ and/or $V_B$, and outputting further voltages (e.g., $V_C, \ldots, V_Z$). SC converter stage 1550 may also optionally have a common ground (e.g., ground 1560) with the NRHPZ converters 1520, 1540 (e.g., ground 1530). For example, SC stage 1485 may be implemented with a common-referenced or differential SC converter structure. In some embodiments, one or more additional NRHPZ converters may be introduced into the circuit to generate even more voltage outputs.

One or more controller(s) 1505 may control the switches (e.g., $S_1$, $S_2$, $S_3$, $S_4$, $S_5$, $S_6$) and the switches in boosting stage 1510 and in SC converter stage 1550 in circuit 1500 to generate desired output voltages $V_A$, $V_B$, $V_C$. For example, controller(s) 1505 may alternate between two switch configurations per cycle (for two-phase operation) or three switch configurations per cycle (for tri-phase operation) to synthesize desired output voltages $V_A$, $V_B$, and/or $V_C$, as previously discussed. Controller(s) 1505 may be implemented as described for controller(s) 155 of FIG. 1B, but with different signal line(s) 1507 for controlling the different switches of circuit 1500, and with different feedback/feedforward signal line(s) 1508 for detecting different feedback/feedforward signals (e.g., voltage $V_A$, voltage $V_B$, voltage $V_C$, voltage $V_{HI}$, voltages of capacitors or inductors in boosting stage 1510, voltages of capacitors in SC converter stage 1550, current to load sensed at $V_A$, current to load sensed at $V_B$, current to load sensed at $V_C$, current of inductor $L_1$, current of inductor $L_2$, input voltage $V_{IN}$, current drawn from input energy source $I_{IN}$) based on the different architecture of circuit 1500. In some embodiments, controller(s) 1505 may comprise a feedforward current shaping controller, such as controller 1805 of FIG. 18A or 18B, and may connect to circuit 1500 as shown in FIG. 18A or 18B.

In some embodiments, one or more controllers may be used to operate some of the switches in a circuit, while one or more other controllers may be used to operate other switches in the circuit. For example, a first set of one or more controllers 1505 may operate to control on/off states and on/off timing of switches front-end stage 1510 via a first set of one or more signal lines (e.g., circuit connections) 1507, thereby controlling front-end stage 1510. A second set of one or more controllers 1505 may operate to control on/off states and on/off timing of switches in 3-level magnetic stage 1520 via a second set of one or more signal lines (e.g., circuit connections) 1507, thereby controlling 3-level magnetic stage 1520. A third set of one or more controllers 1505 may operate to control on/off states and/or on/off timing of switches in 3-level magnetic stage 1540 via a third set of one or more signal lines (e.g., circuit connections) 1507, thereby controlling 3-level magnetic stage 1540. A fourth set of one or more controllers 1505 may operate to control on/off states and/or on/off timing of switches in SC converter stage 1550, thereby controlling SC converter stage 1550.

In some embodiments, the first set of one or more controllers 1505 may operate switches in front-end stage 1510 at a different frequency and/or duty cycle than the frequency and/or duty cycle at which the second set of one or more controllers 1505 may operate switches in 3-level magnetic stage 1520 and/or than the frequency and/or duty cycle at which the third set of one or more controllers 1505 may operate switches in 3-level magnetic stage 1540 and/or than the frequency and/or duty cycle at which the fourth set of one or more controllers 1505 may operate switches in SC converter stage 1550. In some embodiments, the fourth set of one or more controllers 1505 may operate switches in SC converter 1550 at a different frequency and/or duty cycle than the frequency and/or duty cycle at which the first set of one or more controllers 1505 may operate switches in front-end stage 1510 and/or than the frequency and/or duty cycle at which the second set of one or more controllers 1505 may operate switches in 3-level magnetic stage 1520 and/or than the frequency and/or duty cycle at which the third set of one or more controllers 1505 may operate switches in 3-level magnetic stage 1540. For example, a duty cycle at which switches in front-end stage 1510 and/or SC converter stage 1550 operate may depend on the detailed topology and operating regime (e.g., slow-switching limit versus fast switching limit). In some embodiments, the first set of one or more controllers 1505 may control the switches of front-end stage 1510 at approximately a 50% duty ratio. In some embodiments, the fourth set of one or more controllers 1505 may control the switches of SC converter 1550 at approximately a 50% duty ratio. In some embodiments, the second set of one or more controllers may operate switches in 3-level magnetic stage 1520 at a different frequency and/or duty cycle than the frequency and/or duty cycle at which the third set of one or more controllers may operate switches in 3-level magnetic stage 1540.

In some embodiments, the switches of front-end stage 1510 may be operated independently of the switches of 3-level magnetic stage 1520, 3-level magnetic stage 1540, and/or SC converter 1550. In some embodiments, the switches of SC converter 1550 may be operated independently of the switches in front-end stage 1510, 3-level magnetic stage 1520, and 3-level magnetic stage 1540. In some embodiments, the switches of 3-level magnetic stage 1520 may be operated independently of the switches in 3-level magnetic stage 1540. In some embodiments, a first set of one or more controllers 1505 may receive a first set of one or more feedback/feedforward signals 1508, a second set of one or more controllers 1505 may receive a second set of feedback/feedforward signals 1508 that may be different than the first set of feedback/feedforward signals 1508, the third set of one or more controllers 1505 may receive a third set of feedback/feedforward signals 1508 different than the first and second sets of feedback/feedforward signals 1508, and the fourth set of one or more controllers 1505 may receive a fourth set of feedback/feedforward signals 1508 different from the first, second, and third sets of feedback/feedforward signals 1508.

Figure 16A:
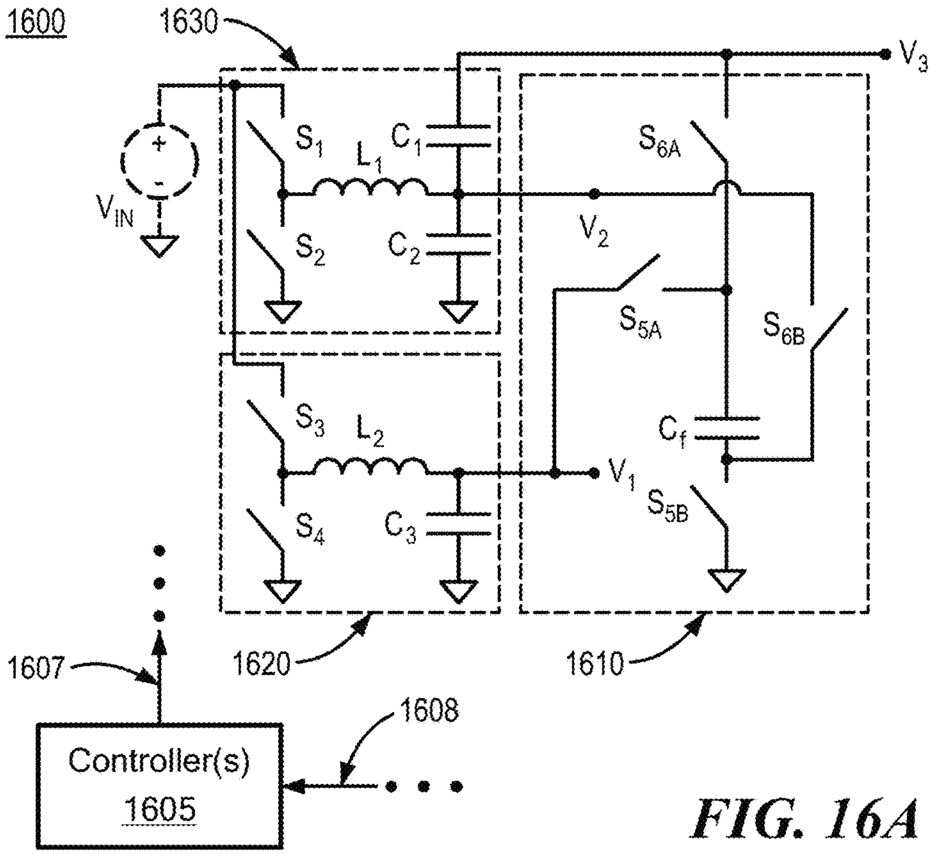
FIG. 16A is a schematic diagram of an example circuit that includes two NRHPZ converters, with inputs of the NRHPZ converters connected to an energy source, and with outputs of the NRHPZ converters connected to inputs of a switched capacitor converter to generate a third voltage output.
Figure 16B:
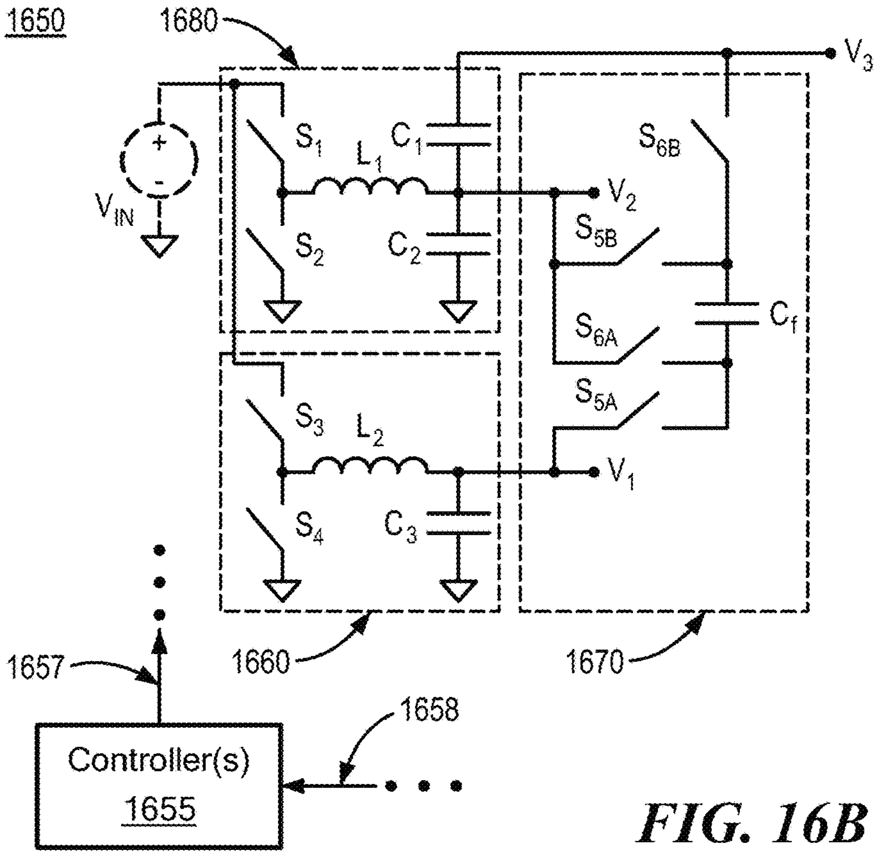
FIG. 16B is a schematic diagram of another example circuit that includes two NRHPZ converters, with inputs of the NRHPZ converters connected to an energy source, and with outputs of the NRHPZ converters connected to a switched-capacitor converter to generate a third voltage output.

FIGS. 16A and 16B each show example implementations of the architecture illustrated in FIG. 14A. In each case, buck converters are illustrated as the example NRHPZ converters. However, one of ordinary skill in the art would recognize that one or both of the buck converters illustrated in each of these examples may be replaced with three-level buck converters as previously described herein, or may be implemented as three-level buck converters with a shared front end, as illustrated in FIG. 15.

FIG. 16A shows an example circuit 1600, where an output voltage $V_3$ may be realized with a SC converter 1610 fed from voltage $V_1$, yielding a voltage level $V_3$ that is $V_1+V_2$. Circuit 1600 may include two NRHPZ converters 1620, 1630 (here buck converters). NRHPZ converter 1620 may output a voltage $V_1$. NRHPZ converter 1630 may output a voltage $V_2$. When switches $S_{5A}$ and $S_{5B}$ are on and switches $S_{6A}$ and $S_{6B}$ are off, flying capacitor $C_f$ may be charged to a voltage $V_1$. Then, when switches $S_{6A}$ and $S_{6B}$ are turned on, capacitor $C_1$ may be charged to a voltage $V_1$ from the voltage on capacitor $C_f$ yielding a voltage $V_3$ of $V_1+V_2$ (e.g., $V_1+V_2=V_3$).

One or more controller(s) 1605 may control the switches (e.g., $S_1$, $S_2$, $S_3$, $S_4$, $S_{5A}$, $S_{5B}$, $S_{6A}$, $S_{6B}$) in circuit 1600 to generate desired output voltages $V_1$, $V_2$, $V_3$. For example, controller(s) 1605 may alternate between two switch configurations per cycle (for two-phase operation) or three switch configurations per cycle (for tri-phase operation) to synthesize desired output voltages $V_1$, $V_2$, and/or $V_3$, as previously discussed. Controller(s) 1605 may be implemented as described for controller(s) 155 of FIG. 1B, but with different signal line(s) 1607 for controlling the different switches of circuit 1600, and with different feedback/feedforward signal line(s) 1608 for detecting different feedback/feedforward signals (e.g., voltage $V_1$, voltage $V_2$, voltage $V_3$, voltage of capacitor $C_1$, voltage of capacitor $C_2$, voltage of capacitor $C_3$, voltage of capacitor $C_f$, current in inductor $L_1$, current in inductor $L_2$, current to load at voltage $V_1$, current to load at voltage $V_2$, current to load at voltage $V_3$, input voltage $V_{IN}$, current drawn from input energy source $I_{IN}$) based on the different architecture of circuit 1600. In some embodiments, controller(s) 1605 may comprise a feedforward current shaping controller, such as controller 1805 of FIG. 18A or 18B, and may connect to circuit 1600 as shown in FIG. 18A or 18B.

In some embodiments, one or more controllers may be used to operate some of the switches in a circuit, while one or more other controllers may be used to operate other switches in the circuit. For example, a first set of one or more controllers 1605 may operate to control on/off states and on/off timing of switches in NRHPZ converter 1620 via a first set of one or more signal lines (e.g., circuit connections) 1607, thereby controlling NRHPZ converter 1620. A second set of one or more controllers 1605 may operate to control on/off states and on/off timing of switches in NRHPZ converter 1630 via a second set of one or more signal lines (e.g., circuit connections) 1607, thereby controlling NRHPZ converter 1630. A third set of one or more controllers 1605 may operate to control on/off states and/or on/off timing of switches in SC converter 1610 via a third set of one or more signal lines (e.g., circuit connections) 1607, thereby controlling SC converter 1610. In some embodiments, the first set of one or more controllers 105 may operate switches in NRHPZ converter 1620 at a different frequency and/or duty cycle than the frequency and/or duty cycle at which the second set of one or more controllers 1605 may operate switches in NRHPZ converter 1630 and/or than the frequency and/or duty cycle at which the third set of one or more controllers 1605 may operate switches in SC converter 1610. In some embodiments, the third set of one or more controllers 1605 may operate switches in SC converter 1610 at a different frequency and/or duty cycle than the frequency and/or duty cycle at which the first set of one or more controllers 1605 may operate switches in NRHPZ converter 1620 and/or than the frequency and/or duty cycle at which the second set of one or more controllers 1605 may operate switches in NRHPZ converter 1630 For example, a duty cycle at which switches in SC converter 1610 operate may depend on the detailed topology and operating regime (e.g., slow-switching limit versus fast switching limit). In some embodiments, the third set of one or more controllers 1605 may control the switches of SC converter 1610 at approximately a 50% duty ratio. In some embodiments, the switches of NRHPZ converter 1620 may be operated independently of the switches of NRHPZ converter 1630 and/or SC converter 1610. In some embodiments, the switches of SC converter 1610 may be operated independently of the switches in NRHPZ converter 1620 and/or NRHPZ converter 1630. In some embodiments, a first set of one or more controllers 1605 may receive a first set of one or more feedback/feedforward signals 1608, a second set of one or more controllers 1605 may receive a second set of feedback/feedforward signals 1608 that may be different than the first set of feedback/feedforward signals 1608, and the third set of one or more controllers 1605 may receive a third set of feedback/feedforward signals 1608 different than the first and second sets of feedback/feedforward signals 1608.

FIG. 16B shows an example circuit 1650, where a voltage $V_3$ may be realized with a switched capacitor converter stage 1670 fed differentially between $V_1$ and $V_2$, yielding a voltage $V_3$ that is $V_2+(V_2-V_1)$, or $2*V_2-V_1$. Circuit 1650 may include two NRHPZ converters 1660, 1680 (here buck converters). NRHPZ converter 1660 may output a voltage $V_1$. NRHPZ converter 1680 may output a voltage $V_2$. When switches SA and $S_{5B}$ are on and switches $S_{6A}$ and $S_{6B}$ are off, capacitor $C_f$ may be charged to a voltage $V_2-V_1$. When switches $S_{6A}$ and $S_{6B}$ are on and switches $S_{5A}$ and $S_{5B}$ are off, capacitor $C_1$ may be charged to $V_2-V_1$ from the voltage on capacitor $C_f$. Voltage $V_2$ and the voltage $V_2-V_1$ on capacitor $C_1$ are then connected, which may yield a voltage $V_3$ of $V_2+V_2-V_1$ (e.g., $V_2+V_2-V_1=V_3$ or $2*V_2-V_1=V_3$).

One or more controller(s) 1655 may control the switches (e.g., $S_1$, $S_2$, $S_3$, $S_4$, $S_{5A}$, $S_{5B}$, $S_{6A}$, $S_{6B}$) in circuit 1650 to generate desired output voltages $V_1$, $V_2$, $V_3$. For example, controller(s) 1655 may alternate between two switch configurations (for two-phase operation) or three switch configurations (for tri-phase operation) to synthesize desired output voltages $V_1$, $V_2$, and/or $V_3$, as previously discussed. Controller(s) 1655 may be implemented as described for controller(s) 155 of FIG. 1B, but with different signal line(s)

1657 for controlling the different switches of circuit 1650, and with different feedback/feedforward signal line(s) 1658 for detecting different feedback/feedforward signals (e.g., voltage $V_1$, voltage $V_2$, voltage $V_3$, voltage of capacitor $C_1$, voltage of capacitor $C_2$, voltage of capacitor $C_3$, voltage of capacitor $C_f$, current in inductor $L_1$, current in inductor $L_2$, current to load at voltage $V_1$, current to load at voltage $V_2$, current to load at voltage $V_3$, input voltage $V_{IN}$, current drawn from input energy source $I_{IN}$) based on the different architecture of circuit 1650. In some embodiments, controller(s) 1655 may comprise a feedforward current shaping controller, such as controller 1805 of FIG. 18A or 18B, and may connect to circuit 1650 as shown in FIG. 18A or 18B.

In some embodiments, one or more controllers may be used to operate some of the switches in a circuit, while one or more other controllers may be used to operate other switches in the circuit. For example, a first set of one or more controllers 1655 may operate to control on/off states and on/off timing of switches in NRHPZ converter 1660 via a first set of one or more signal lines (e.g., circuit connections) 1657, thereby controlling NRHPZ converter 1660. A second set of one or more controllers 1655 may operate to control on/off states and on/off timing of switches in NRHPZ converter 1680 via a second set of one or more signal lines (e.g., circuit connections) 1657, thereby controlling NRHPZ converter 1680. A third set of one or more controllers 1655 may operate to control on/off states and/or on/off timing of switches in SC converter 1670 via a third set of one or more signal lines (e.g., circuit connections) 1657, thereby controlling SC converter 1670. In some embodiments, the first set of one or more controllers 1655 may operate switches in NRHPZ converter 1660 at a different frequency and/or duty cycle than the frequency and/or duty cycle at which the second set of one or more controllers 1655 may operate switches in NRHPZ converter 1680 and/or than the frequency and/or duty cycle at which the third set of one or more controllers 1655 may operate switches in SC converter 1670. In some embodiments, the third set of one or more controllers 1655 may operate switches in SC converter 1670 at a different frequency and/or duty cycle than the frequency and/or duty cycle at which the first set of one or more controllers 1655 may operate switches in NRHPZ converter 1660 and/or than the frequency and/or duty cycle at which the second set of one or more controllers 1655 may operate switches in NRHPZ converter 1680. For example, a duty cycle at which switches in SC converter 1670 operate may depend on the detailed topology and operating regime (e.g., slow-switching limit versus fast switching limit). In some embodiments, the third set of one or more controllers 1655 may control the switches of SC converter 1670 at approximately a 50% duty ratio. In some embodiments, the switches of NRHPZ converter 1660 may be operated independently of the switches of NRHPZ converter 1680 and/or SC converter 1670. In some embodiments, the switches of SC converter 1670 may be operated independently of the switches of NRHPZ converter 1660 and/or NRHPZ converter 1680. In some embodiments, a first set of one or more controllers 1655 may receive a first set of one or more feedback/feedforward signals 1658, a second set of one or more controllers 1655 may receive a second set of feedback/feedforward signals 1658 that may be different than the first set of feedback/feedforward signals 1658, and the third set of one or more controllers 1655 may receive a third set of feedback/feedforward signals 1658 different than the first and second sets of feedback/feedforward signals 1658.

It may be recognized that while the two NRHPZ converters in FIGS. 16A and 16B are illustrated as being fed from an input voltage $V_{IN}$ with their inputs in parallel, either implementation (that shown in FIG. 16A or FIG. 16B) may be realized with two NRHPZ converters connected in cascade, as shown in FIG. 14B. Likewise, while example switched-capacitor converters (e.g., 1610, 1670) are shown, a person of ordinary skill in the art would recognize that interleaved switched-capacitor converters, such as those described with respect to FIG. 6A, 6C, or 8 may instead be utilized.

Figure 17A:
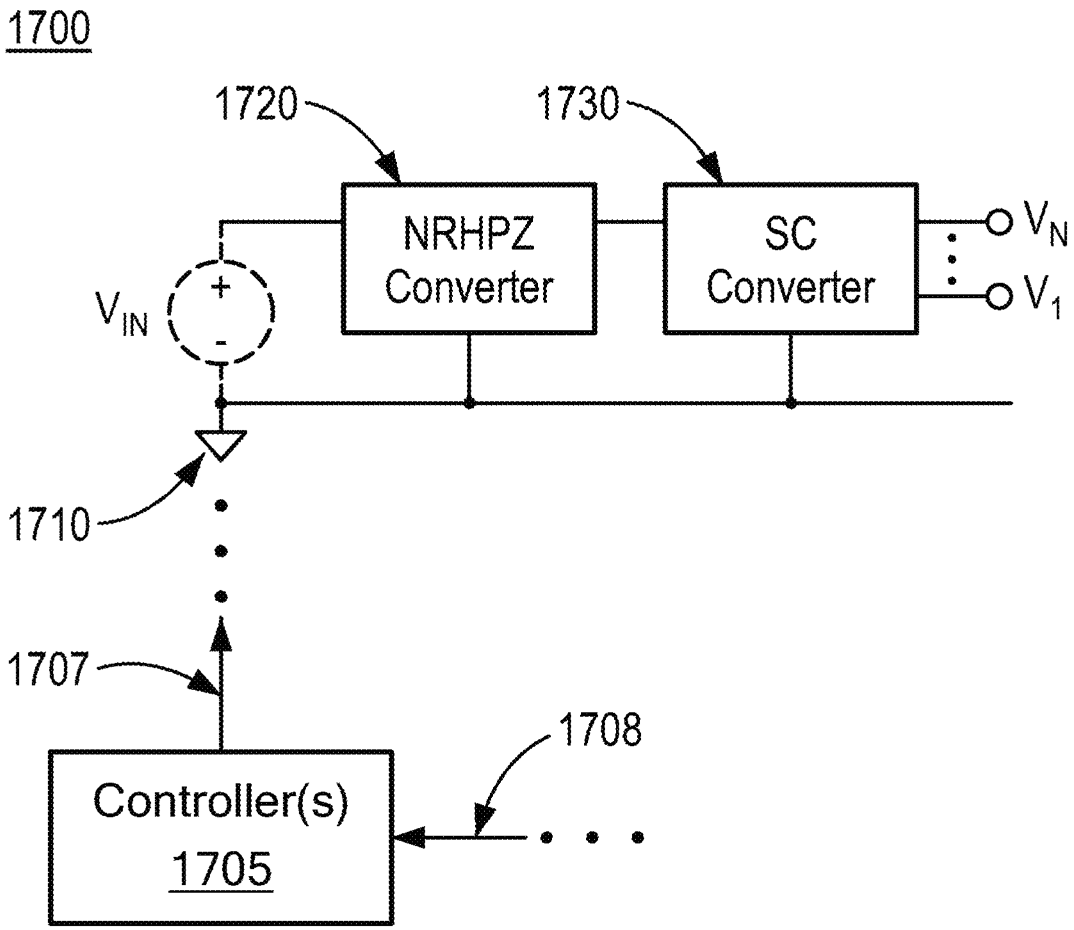
FIG. 17A is a block diagram of an example circuit that utilizes an NRHPZ converter together with a multi-output switched-capacitor converter.

FIG. 17A shows an example circuit 1700 that uses a single NRHPZ converter 1720 together with a multi-output switched-capacitor converter 1730 to synthesize multiple levels of an output voltage (e.g., $V_1 \ldots V_N$). One or more controller(s) 1705 may control the switches of NRHPZ converter 1720 and/or switched-capacitor converter 1730 in circuit 1700 to generate desired output voltages $V_1 \ldots V_N$. For example, controller(s) 1705 may alternate between two switch configurations (for two-phase operation) or three switch configurations (for tri-phase operation) to synthesize desired output voltages $V_1 \ldots V_N$, as previously discussed. Controller(s) 1705 may be implemented as described for controller(s) 155 of FIG. 1B, but with different signal line(s) 1707 for controlling the different switches of circuit 1700, and with different feedback/feedforward signal line(s) 1708 for detecting different feedback/feedforward signals (e.g., voltages at $V_1 \ldots V_N$, currents to load at $V_1 \ldots V_N$, voltages and/or currents at output of NRHPZ converter 1720, voltages on capacitors in NRHPZ converter 1720 or SC converter 1730, currents in inductors in NRHPZ 1720, input voltage $V_{IN}$, current drawn from input energy source $I_{IN}$) based on the different architecture of circuit 1700. In some embodiments, controller(s) 1705 may comprise a feedforward current shaping controller, such as controller 1805 of FIG. 18A or 18B, and may connect to circuit 1700 as shown in FIG. 18A or 18B. While not shown explicitly in FIG. 17A, it will be appreciated that switched-capacitor converter 1730 may additionally or optionally be connected to input voltage $V_{IN}$, either directly or via a switched connection, such that switched-capacitor converter 1730 may be fed either between the output of NRHPZ converter 1720 and ground or fed differentially between the output of NRHPZ converter 1720 and $V_{IN}$.

In some embodiments, one or more controllers may be used to operate some of the switches in a circuit, while one or more other controllers may be used to operate other switches in the circuit. For example, a first set of one or more controllers 1705 may operate to control on/off states and on/off timing of switches in NRHPZ converter 1720 via a first set of one or more signal lines (e.g., circuit connections) 1707, thereby controlling NRHPZ converter 1720. A second set of one or more controllers 1705 may operate to control on/off states and on/off timing of switches in SC converter 1730 via a second set of one or more signal lines (e.g., circuit connections) 1707, thereby controlling SC converter 1730. In some embodiments, the first set of one or more controllers 1705 may operate switches in NRHPZ converter 1720 at a different frequency and/or duty cycle than the frequency and/or duty cycle at which the second set of one or more controllers 1705 may operate switches in SC converter 1730. For example, a duty cycle at which switches in SC converter 1730 operate may depend on the detailed topology and operating regime (e.g., slow-switching limit versus fast switching limit). In some embodiments, the third set of one or more controllers 1705 may control the switches of SC converter 1730 at approximately a 50% duty ratio. In some embodiments, the switches of NRHPZ converter 1720 may be operated independently of the switches of SC converter 1730. In some embodiments, a first set of one or more controllers 1705 may receive a first set of one or more feedback/feedforward signals 1708 and a second set of one or more controllers 1705 may receive a second set of feedback/feedforward signals 1708 that may be different than the first set of feedback/feedforward signals 1708.

Figure 17B:
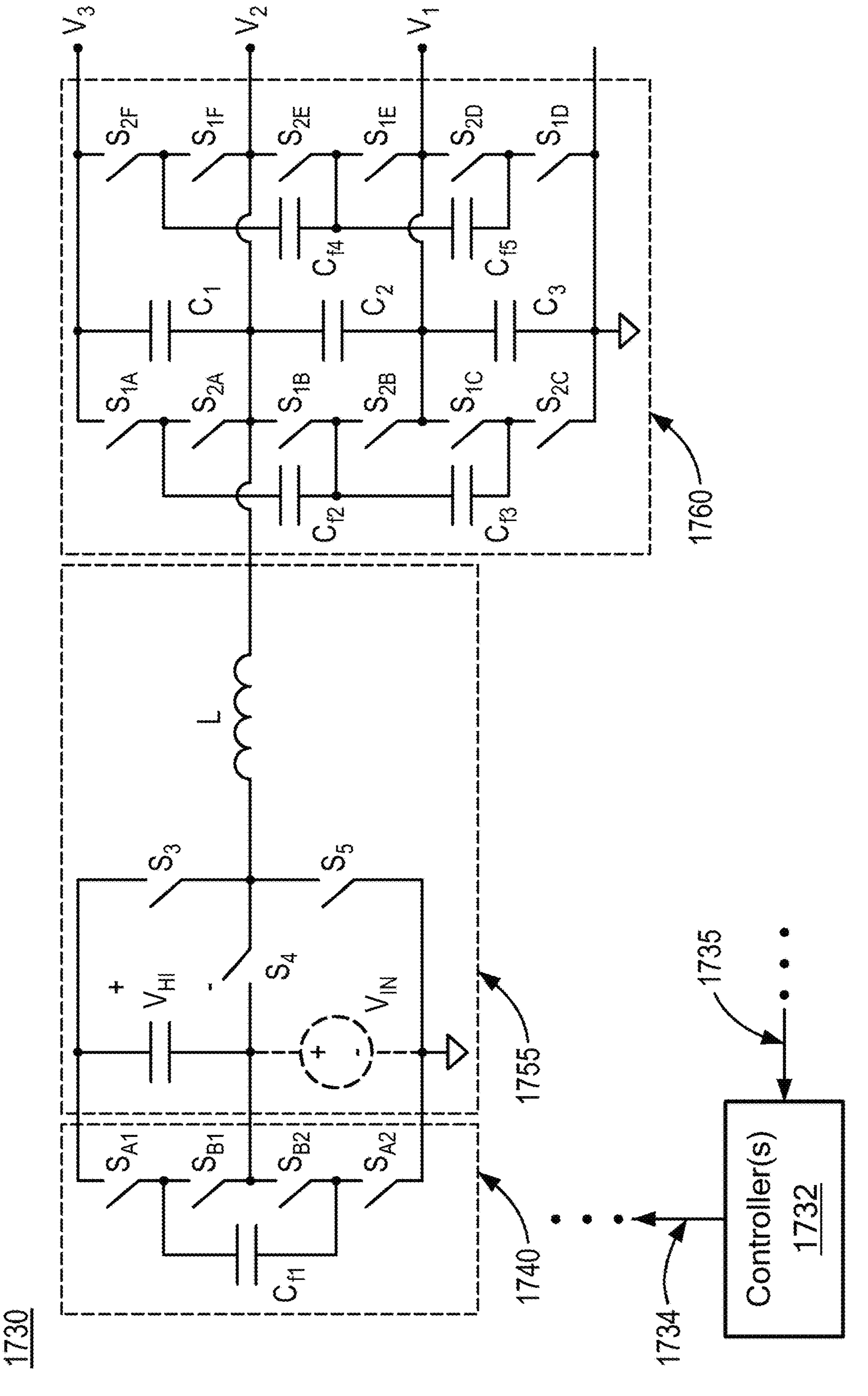
FIG. 17B is a schematic diagram of an example circuit with a switched-capacitor front-end and a multi-output switched-capacitor converter, and that is capable of outputting voltages as high as three times the input voltage.

FIG. 17B shows an example circuit 1730 that may be capable of realizing output voltages well above the input voltage $V_{IN}$. For example, circuit 1730 may be capable of synthesizing output voltages as high as $3*V_{IN}$. Circuit 1730 may include a single NRHPZ converter 1755 with a front-end stage 1740 (shown here as a switched-capacitor front-end stage) and a multi-output switched capacitor converter 1760. As previously discussed with respect to FIG. 3A, NRHPZ converter 1755 may select any of three voltage levels (e.g., $V_H=V_{HI}+V_{IN}$, $V_{IN}$, ground or 0V) as an input to its 3-level buck converter. As also previously discussed with respect to FIG. 3A, one or more controllers (here controller (s) 1732) may switch between different $V_H=V_{HI}+V_{IN}$, $V_{IN}$, and 0V using two-phase or tri-phase operation to synthesize a desired output voltage (here voltage $V_2$). Multi-output switched capacitor converter 1760 may then generate a variety of possible output voltages (e.g., $V_1$, $V_2$, $V_3$) from the voltage $V_2$ output from NRHPZ converter 1755. For example, by operation of switched-capacitor converter 1760, each of $C_2$ and $C_3$ will hold a voltage up to $0.5*V_2$. When switches $S_{1A}$, $S_{1B}$, $S_{1C}$, $S_{1D}$, $S_{1E}$, and $S_{1F}$ are on and switches $S_{2A}$, $S_{2B}$, $S_{2C}$, $S_{2D}$, $S_{2E}$, and $S_{2F}$ are off, capacitor $C_{f3}$ may be charged to a voltage up to $0.5*V_2$ ($V_2$-$0.5*V_2$ (voltage on capacitor $C_3$)), capacitor $C_{f4}$ may be charged to a voltage up to $0.5*V_2$ ($V_2$-$0.5*V_2$ (voltage on capacitor $C_3$)), and capacitor $C_{f5}$ may be charged to a voltage up to $0.5*V_2$ (voltage on capacitor $C_3$). Then, when switches $S_{2A}$, $S_{2B}$, $S_{2C}$, $S_{2D}$, $S_{2E}$, and $S_{2F}$ are on and switches $S_{1A}$, $S_{1B}$, $S_{1C}$, $S_{1D}$, $S_{1E}$, and $S_{1F}$ are off, capacitors $C_3$, $C_{f4}$, and $C_{f5}$ may be connected, yielding a voltage up to $1.5*V_2$, and may charge capacitor $C_1$ up to $0.5*V_2$ ($1.5*V_2-V_2$ at $V_2$ rail). With $C_1$, $C_2$, and $C_3$ each holding a voltage up to $0.5*V_2$, $V_3$ may output a voltage up to $1.5*V_2$. $V_2$ may have up to a voltage of $2*V_{IN}$ (see, e.g., discussion of switched-capacitor front-end with respect to FIG. 3A). As a result, circuit 1730 may yield a maximum output voltage of up to $1.5*2*V_{IN}$, or $3*V_{IN}$. When switches $S_{1A}$, $S_{1B}$, $S_{1C}$, $S_{1D}$, $S_{1E}$, and $S_{1F}$ are on again and switches $S_{2A}$, $S_{2B}$, $S_{2C}$, $S_{2D}$, $S_{2E}$, and $S_{2F}$ are off again in the next cycle, capacitors $C_3$, $C_{f2}$, and $C_{f3}$ will be connected, which may keep capacitor $C_1$ charged at a voltage of up to $0.5*V_2$ and maintain output voltage $V_3$ at $3*V_{IN}$. Thus, by controlling the on/off states of switches $S_{1A}$, $S_{1B}$, $S_{1C}$, $S_{1D}$, $S_{1E}$, $S_{1F}$, $S_{2A}$, $S_{2B}$, $S_{2C}$, $S_{2D}$, $S_{2E}$, and $S_{2F}$, multiple voltages between 0V and $3*V_{IN}$ may be synthesized.

A design capable of supporting a maximum output of $2*V_{IN}$ may be implemented by feeding switched capacitor converter 1760 at the $V_3$ voltage rail (not shown) instead of at the $V_2$ voltage rail (as is shown in FIG. 17B). In some embodiments, multi-output switched-capacitor converter 1760 may be optionally selectively fed at different voltage rails through the introduction of additional selector switches (not shown), enabling greater reconfigurability.

One or more controller(s) 1732 may control the switches (e.g., $S_{A1}$, $S_{A2}$, $S_{B1}$, $S_{B2}$, $S_3$, $S_4$, $S_5$, $S_{1A}$, $S_{1B}$, $S_{1C}$, $S_{1D}$, $S_{1E}$, $S_{1F}$, $S_{2A}$, $S_{2B}$, $S_{2C}$, $S_{2D}$, $S_{2E}$, $S_{2F}$) and optional additional selector switches in circuit 1730 to generate desired output voltages $V_1$, $V_2$, $V_3$. For example, controller(s) 1732 may alternate between two switch configurations per cycle (for two-phase operation) or three switch configurations per cycle (for tri-phase operation) to synthesize desired output voltages $V_1$, $V_2$, and/or $V_3$, as previously discussed. Controller(s) 1732 may be implemented as described for controller(s) 155 of FIG. 1B, but with different signal line(s) 1734 for controlling the different switches of circuit 1730, and with different feedback/feedforward signal line(s) 1735 for detecting different feedback/feedforward signals (e.g., voltage $V_1$, voltage $V_2$, voltage $V_3$, voltage of capacitor(s) (e.g., $C_1$, $C_2$, $C_3$, $C_{HI}$, $C_{f1}$, $C_{f2}$, $C_{f3}$, $C_{f4}$, $C_{f5}$), current in inductor L (e.g., $i_L$), current to load at voltage $V_1$, current to load at voltage $V_2$, current to load at voltage $V_3$, input voltage $V_{IN}$, current drawn from input energy source $I_{IN}$) based on the different architecture of circuit 1730. In some embodiments, controller(s) 1732 may comprise a feedforward current shaping controller, such as controller 1805 of FIG. 18A or 18B, and may connect to circuit 1730 as shown in FIG. 18A or 18B.

In some embodiments, one or more controllers may be used to operate some of the switches in a circuit, while one or more other controllers may be used to operate other switches in the circuit. For example, a first set of one or more controllers 1732 may operate to control on/off states and on/off timing of switches in front-end stage 1740 via a first set of one or more signal lines (e.g., circuit connections) 1734, thereby controlling front-end stage 1740. A second set of one or more controllers 1732 may operate to control on/off states and on/off timing of switches in NRHPZ converter 1755 via a second set of one or more signal lines (e.g., circuit connections) 1734, thereby controlling NRHPZ converter 1755. A third set of one or more controllers 1732 may operate to control on/off states and/or on/off timing of switches in SC converter 1760 via a third set of one or more signal lines (e.g., circuit connections) 1734, thereby controlling SC converter 1760.

In some embodiments, the first set of one or more controllers 1732 may operate switches in front-end stage 1740 at a different frequency and/or duty cycle than the frequency and/or duty cycle at which the second set of one or more controllers 1732 may operate switches in NRHPZ converter 1755 and/or than the frequency and/or duty cycle at which the third set of one or more controllers 1732 may operate switches in SC converter 1760. In some embodiments, the third set of one or more controllers 1732 may operate switches in SC converter 1760 at a different frequency and/or duty cycle than the frequency and/or duty cycle at which the first set of one or more controllers 1732 may operate switches in front-end stage 1740 and/or than the frequency and/or duty cycle at which the second set of one or more controllers 1732 may operate switches in NRHPZ converter 1755. For example, a duty cycle at which switches in front-end stage 1740 and/or SC converter 1760 operate may depend on the detailed topology and operating regime (e.g., slow-switching limit versus fast switching limit). In some embodiments, the first set of one or more controllers 1732 may control the switches of front-end stage 1740 at approximately a 50% duty ratio. In some embodiments, the third set of one or more controllers 1732 may operate the switches in SC converter stage 1760 at approximately a 50% duty ratio.

In some embodiments, the switches of front-end stage 1740 may be operated independently of the switches of NRHPZ converter 1755 and/or SC converter 1760. In some embodiments, the switches of SC converter 1760 may be operated independently of the switches of front-end stage 1740 and/or NRHPZ converter 1755. In some embodiments, a first set of one or more controllers 1732 may receive a first set of one or more feedback/feedforward signals 1735, a second set of one or more controllers 1732 may receive a second set of feedback/feedforward signals 1735 that may be different than the first set of feedback/feedforward signals 1735, and the third set of one or more controllers 1732 may receive a third set of feedback/feedforward signals 1735 different than the first and second sets of feedback/feedforward signals 1735.

Figure 17C:
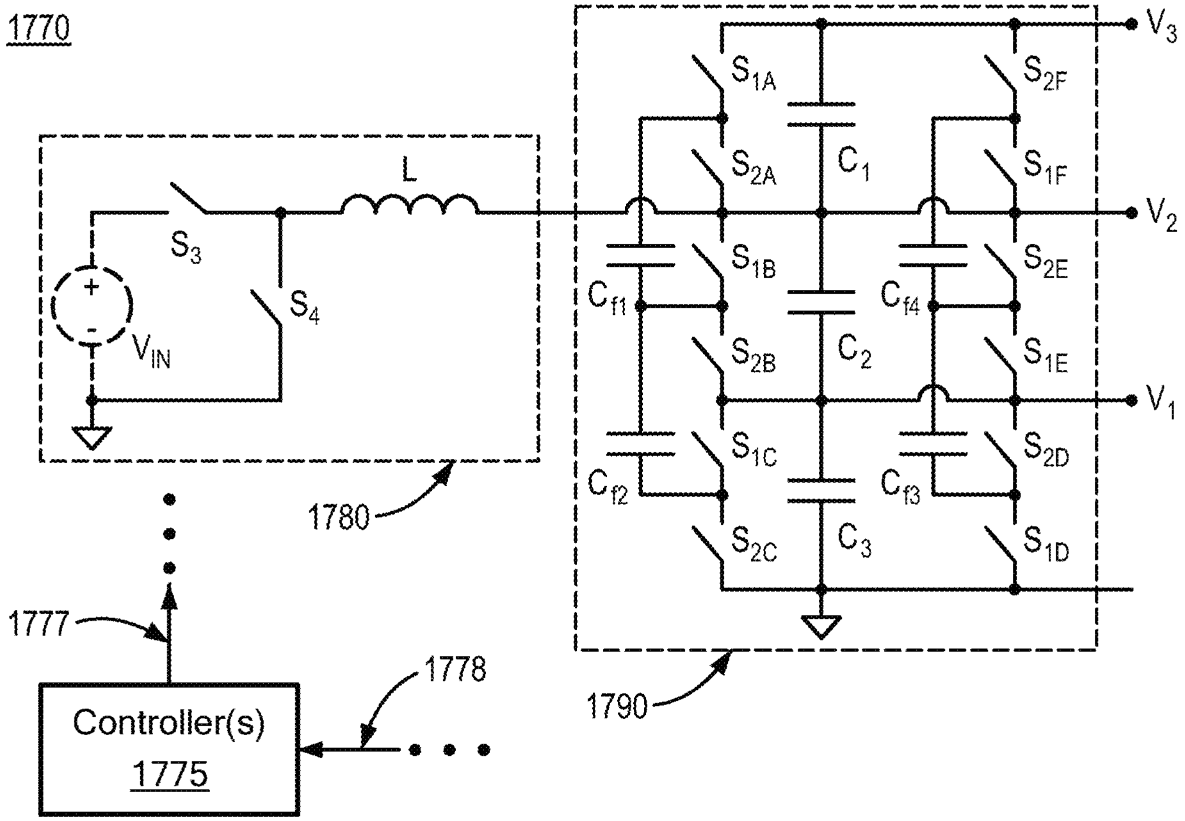
FIG. 17C is a schematic diagram of an example circuit with a multi-output switched-capacitor converter that is capable of outputting voltages as high as 1.5 times the input voltage.

FIG. 17C shows an example circuit 1770 that may include a single NRHPZ converter 1780 with a multi-output switched-capacitor converter 1790. Circuit 1770 may be capable of synthesizing multiple different output voltages, up to a maximum output voltage of $1.5{*}V_{IN}$. The multi-output switched-capacitor converter 1790 shown here in FIG. 17C has the same topology as multi-output switched capacitor converter 1760 of FIG. 17B. However, unlike circuit 1730, circuit 1770 may not have a front end (e.g., switched-capacitor front end). As a result, the maximum voltage output by NRHPZ converter 1780 (e.g., a buck converter) may be $V_{IN}$, and the maximum output voltage of multi-output switched-capacitor converter 1790 may be $1.5{*}V_{IN}$ at $V_3$. Thus, by controlling the on/off states of switches $S_{1A}$, $S_{1B}$, $S_{1C}$, $S_{1D}$, $S_{1E}$, $S_{1F}$, $S_{2A}$, $S_{2B}$, $S_{2C}$, $S_{2D}$, $S_{2E}$, and $S_{2F}$, multiple voltages between 0V and $1.5{*}V_{IN}$ may be synthesized. In some embodiments, multi-output switched-capacitor converter 1790 may be optionally selectively fed at different voltage rails through the introduction of additional selector switches (not shown), enabling greater reconfigurability.

One or more controller(s) 1775 may control the switches (e.g., $S_{A1}$, $S_{A2}$, $S_{B1}$, $S_{B2}$, $S_3$, $S_4$, $S_5$, $S_{1A}$, $S_{1B}$, $S_{1C}$, $S_{1D}$, $S_{1E}$, $S_{1F}$, $S_{2A}$, $S_{2B}$, $S_{2C}$, $S_{2D}$, $S_{2E}$, $S_{2F}$) and optional additional selector switches in circuit 1770 to generate desired output voltages $V_1$, $V_2$, $V_3$. For example, controller(s) 1775 may alternate between two switch configurations per cycle (for two-phase operation) or three switch configurations per cycle (for tri-phase operation) to synthesize desired output voltages $V_1$, $V_2$, and/or $V_3$, as previously discussed. Controller(s) 1770 may be implemented as described for controller(s) 155 of FIG. 1B, but with different signal line(s) 1777 for controlling the different switches of circuit 1775, and with different feedback/feedforward signal line(s) 1778 for detecting different feedback/feedforward signals (e.g., voltage $V_1$, voltage $V_2$, voltage $V_3$, voltage of capacitor(s) (e.g., $C_1$, $C_2$, $C_3$, $C_{f1}$, $C_{f2}$, $C_{f3}$, $C_{f4}$, $C_{f5}$), current in inductor L (e.g., $i_L$), current to load at voltage $V_1$, current to load at voltage $V_2$, current to load at voltage $V_3$, input voltage $V_{IN}$, current drawn from input energy source $I_{IN}$) based on the different architecture of circuit 1730. In some embodiments, controller(s) 1775 may comprise a feedforward current shaping controller, such as controller 1805 of FIG. 18A or 18B, and may connect to circuit 1775 as shown in FIG. 18A or 18B.

In some embodiments, one or more controllers may be used to operate some of the switches in a circuit, while one or more other controllers may be used to operate other switches in the circuit. For example, a first set of one or more controllers 1775 may operate to control on/off states and on/off timing of switches in NRHPZ converter 1780 via a first set of one or more signal lines (e.g., circuit connections) 1777, thereby controlling NRHPZ converter 1780. A second set of one or more controllers 1775 may operate to control on/off states and on/off timing of switches in SC converter 1790 via a second set of one or more signal lines (e.g., circuit connections) 1777, thereby controlling SC converter 1790. In some embodiments, the first set of one or more controllers 1775 may operate switches in NRHPZ converter 1780 at a different frequency and/or duty cycle than the frequency and/or duty cycle at which the second set of one or more controllers 1775 may operate switches in SC converter 1790. For example, a duty cycle at which switches in SC converter 1790 operate may depend on the detailed topology and operating regime (e.g., slow-switching limit versus fast switching limit). In some embodiments, the second set of one or more controllers 1775 may control the switches of SC converter 1790 at approximately a 50% duty ratio. In some embodiments, the switches of NRHPZ converter 1780 may be operated independently of the switches of SC converter 1790. In some embodiments, a first set of one or more controllers 1775 may receive a first set of one or more feedback/feedforward signals 1778 and a second set of one or more controllers 1775 may receive a second set of feedback/feedforward signals 1778 that may be different than the first set of feedback/feedforward signals 1778.

Load Current Feedforward Control

In some embodiments, it may be desirable to control one or more NRHPZ converters with a load current feedforward control mechanism. FIG. 18A shows an example system architecture 1800 implementing a load current feedforward control mechanism for one or more NRHPZ converters 1845. Circuit 1800 may include one or more NRHPZ converters 1845, and one or more NRHPZ controllers 1805. In some embodiments, NRHPZ controller 1805 may be implemented as described for controller(s) 155 of FIG. 1B, but with signal line(s) 1820 for controlling the different switches of NRHPZ converter(s) 1845, and with feedback/feedforward signal line(s) 1815, 1825, 1830, 1835 based on the architecture of circuit 1800. For example, NRHPZ controller 1805 may receive one or more signals 1815 representing input voltage $V_{IN}$, one or more signals 1830 representing output voltage $V_O$, one or more signals 1835 representing load current, and one or more signals representing one or more states of NRHPZ converter 1845. Signal(s) 1830 may include, for example, state variables of the converter, such as signals characteristic of inductor currents and/or capacitor voltages of NRHPZ converter 1845. In some embodiments, NRHPZ controller 1805 may receive one or more reference commands 1810, such as commands from a user or from another device or system (e.g., another device or system with a mobile device, such as within a mobile phone). Reference command(s) 1810 may include any type command, including, for example, a command for a desired output voltage (e.g., output voltage reference) or a desired load current reference. Based on one or more of the feedback/feedforward signals and/or reference commands, NRHPZ controller 1805 may send one or more signals on one or more signal lines 1820 to control NRHPZ converter 1845. For example, NRHPZ controller 1805 may send pulse-width modulated (PWM) signals on the signal lines 1820 to control one or more switches within NRHPZ converter 1845 to achieve a desired switch state for a particular phase of a cycle. Based on these signals, NRHPZ converter 1845 may then output a voltage and current to a load 1840 (e.g., one or more power amplifiers).

NRHPZ controller 1805 may be used as any of the controllers previously discussed with respect to FIGS. 1-6C and 9-17, for controlling their respective circuits. For example, NRHPZ controller 1805 may be used to control switches in a magnetic regulation stage, such as the magnetic stages (e.g., 3-level buck converters) previously described with respect to FIGS. 1-6C and 9-17. That is, NRHPZ controller 1805 may be used as controller(s) 155 for controlling circuit 150 of FIG. 1B, as controller(s) 205 for controlling circuit 200 of FIG. 2A, as controller(s) 255 for controlling circuit 250 of FIG. 2B, as controller(s) 275 for controlling circuit 275 of FIG. 2C, as controller(s) 305 for controlling circuit 300 of FIG. 3A, as controller(s) 370 for controlling circuit 350 of FIG. 3B, as controller(s) 405 for controlling circuit 400 of FIG. 4, as controller(s) 505 for controlling circuit 500 of FIG. 5, as controller(s) 605 for controlling circuit 600 of FIG. 6A, as controller(s) 612 for controlling circuit 640 of FIG. 6B, as controller(s) 690 for controlling circuit 670 of FIG. 6C, as controller(s) 905 for controlling circuit 900 of FIG. 9, as controller(s) 1005 for controlling circuit 1000 of FIG. 10, as controller(s) 1105 for controlling circuit 1100 of FIG. 11, as controller(s) 1205 for controlling circuit 1200 of FIG. 12, as controller(s) 1305 for controlling circuit 1300 of FIG. 13, as controller(s) 1405 for controlling circuit 1400 of FIG. 14A, as controller(s) 1455 for controlling circuit 1450 of FIG. 14B, as controller(s) 1505 for controlling circuit 1500 of FIG. 15, as controller(s) 1605 for controlling circuit 1600 of FIG. 16A, as controller(s) 1655 for controlling circuit 1650 of FIG. 16B, as controller(s) 1705 for controlling circuit 1700 of FIG. 17A, as controller(s) 1732 for controlling circuit 1730 of FIG. 17B, or as controller(s) 1775 for controlling circuit 1770 of FIG. 17C.

One of ordinary skill in the art would recognize how to implement any of the previously discussed circuits to operate as shown in circuit 1800 in FIG. 18A. For example, NRHPZ controller 1800 would control the various switches of the NRHPZ converters (e.g., 3-level buck converters) of the previously discussed circuits using signal lines 1820. That is, signal line(s) 1820 would correspond to the one or more signal lines described for each of these circuits (e.g., signal line(s) 157 of circuit 150 of FIG. 1B, signal line(s) 207 of circuit 200 of FIG. 2A, signal line(s) 257 of circuit 250 of FIG. 2B, signal line(s) 282 of circuit 275 of FIG. 2C, signal line(s) 307 of circuit 300 of FIG. 3A, signal line(s) 373 of circuit 350 of FIG. 3B, signal line(s) 407 of circuit 400 of FIG. 4, signal line(s) 507 of circuit 500 of FIG. 5, signal line(s) 607 of circuit 600 of FIG. 6A, signal line(s) 613 of circuit 640 of FIG. 6B, signal line(s) 692 of circuit 670 of FIG. 6C, signal line(s) 907 of circuit 900 of FIG. 9, signal line(s) 1005 of circuit 1000 of FIG. 10, signal line(s) 1107 of circuit 1100 of FIG. 11, signal line(s) 1207 of circuit 1200 of FIG. 12, signal line(s) 1307 of circuit 1300 of FIG. 13, signal line(s) 1407 of circuit 1400 of FIG. 14A, signal line(s) 1466 of circuit 1450 of FIG. 14B, signal line(s) 1507 of circuit 1500 of FIG. 15, signal line(s) 1607 of circuit 1600 of FIG. 16A, signal line(s) 1657 of circuit 1650 of FIG. 16B, signal line(s) 1707 of circuit 1700 of FIG. 17A, signal line(s) 1734 of circuit 1730 of FIG. 17B, or signal line(s) 1777 of circuit 1770 of FIG. 17C).

NRHPZ controller 1805 would further receive feedback/feedforward signals of the various NRHPZ converters (e.g., 3-level buck converters) of the previously discussed circuits using feedback/feedforward signals 1815, 1825, 1830, 1835. That is, input voltage signal 1815, converter state signal 1825, output voltage signal 1830, and load current signal 1835 would correspond to the corresponding one or more feedback/feedforward signals described for each of these circuits (e.g., feedback/feedforward signal(s) 158 of circuit 150 of FIG. 1B, feedback/feedforward signal(s) 208 of circuit 200 of FIG. 2A, feedback/feedforward signal(s) 258 of circuit 250 of FIG. 2B, feedback/feedforward signal(s) 283 of circuit 275 of FIG. 2C, feedback/feedforward signal(s) 308 of circuit 300 of FIG. 3A, feedback/feedforward signal(s) 374 of circuit 350 of FIG. 3B, feedback/feedforward signal(s) 408 of circuit 400 of FIG. 4, feedback/feedforward signal(s) 508 of circuit 500 of FIG. 5, feedback/feedforward signal(s) 608 of circuit 600 of FIG. 6A, feedback/feedforward signal(s) 614 of circuit 640 of FIG. 6B, feedback/feedforward signal(s) 693 of circuit 670 of FIG. 6C, feedback/feedforward signal(s) 908 of circuit 900 of FIG. 9, feedback/feedforward signal(s) 1008 of circuit 1000 of FIG. 10, feedback/feedforward signal(s) 1108 of circuit 1100 of FIG. 11, feedback/feedforward signal(s) 1208 of circuit 1200 of FIG. 12, feedback/feedforward signal(s) 1308 of circuit 1300 of FIG. 13, feedback/feedforward signal(s) 1408 of circuit 1400 of FIG. 14A, feedback/feedforward signal(s) 1467 of circuit 1450 of FIG. 14B, feedback/feedforward signal(s) 1508 of circuit 1500 of FIG. 15, feedback/feedforward signal(s) 1608 of circuit 1600 of FIG. 16A, feedback/feedforward signal(s) 1658 of circuit 1650 of FIG. 16B, feedback/feedforward signal(s) 1708 of circuit 1700 of FIG. 17A, feedback/feedforward signal(s) 1735 of circuit 1730 of FIG. 17B, feedback/feedforward signal(s) 1778 of circuit 1770 of FIG. 17C). NRHPZ controller 1805 would further optionally receive one or more input command signals as previously described with respect to the previous circuits (with reference to controller(s) 155 of FIG. 1B) as reference command(s) 1810.

FIG. 18B shows circuit 1800 again, but with additional details as to the operation of a NRHPZ controller 1805. As shown in FIG. 18B, NRHPZ controller 1805 may further include a current control subsystem 1870, a feedforward current shaping subsystem 1865, and a feedback control subsystem 1860. Feedback control system may receive one or more signals, such as one or more of the feedback signals previously discussed with respect to FIG. 18A or with respect to any of the other circuits previously discussed. In the example shown in FIG. 18B, feedback control subsystem 1860 may receive one or more signals 1815 representing input voltage $V_{IN}$, and one or more signals 1830 representing output voltage $V_O$. In the example shown in FIG. 18B, feedback control subsystem 1860 may also receive one or more reference command signals 1810. Based on the signals it receives (e.g., signals 1810, 1815, and 1830 in the example of FIG. 18B), feedback control subsystem 1860 may provide one or more feedback control signals 1855 to current control subsystem 1870.

Feedforward current shaping subsystem 1865 may receive one or more signals, such as one or more of the feedforward signals previously discussed with respect to FIG. 18A or with respect to any of the other circuits previously discussed. In the example shown in FIG. 18B, feedforward current shaping subsystem 1865 may receive one or more signals 1815 representing input voltage $V_{IN}$, one or more signals 1830 representing output voltage $V_O$, and one or more signals 1825 representing inductor current $i_L$. Load current 1835 may also be provided to NRHPZ controller 1805 for feedforward current control. In the example shown in FIG. 18B, feedforward current shaping subsystem 1865 may also receive one or more reference command signals 1810. Based on the signals it receives (e.g., signals 1810, 1815, 1830, 1835 in the example of FIG. 18B), feedforward current shaping subsystem 1865 may provide one or more feedforward control signals 1850 to current control subsystem 1870.

Current control subsystem 1870 may receive one or more signals, such as one or more of the feedback/feedforward signals previously discussed with respect to FIG. 18A or with respect to any of the other circuits previously discussed. In the example shown in FIG. 18B, current control subsystem 1870 may receive one or more signals 1830 representing output voltage $V_O$, and one or more signals 1825 representing converter state. In the example of FIG. 18B, current control subsystem 1870 may also receive one or more reference command signals 1810. In the example of FIG.

18B, current control subsystem 1870 may also receive one or more feedback control signals 1855 from feedback control subsystem 1860 and one or more feedforward control signals 1850 from feedforward current shaping subsystem 1865. Based on the signals it receives (e.g., signals 1810, 1825, 1830, 1850, 1855 in the example of FIG. 18B), current control subsystem 1870 may output signals 1820 over one or more signals lines for controlling one or more switches of one or more NRHPZ converters 1845. For example, current control subsystem 1870 may output one or more PWM signals over the signal lines to control the on/off states of the switches into a desired switch configuration for each phase of a cycle.

Although further details as to components within current control subsystem 1870, feedforward current shaping subsystem 1865, and feedback control subsystem 1860 are not provided, one of skill in the art would recognize further circuitry would be included within these subsystems (e.g., such as the circuitry described for subsystems with respect to controller(s) 155 of FIG. 1B). One of ordinary skill in the art would understand how to construct a feedback control subsystem that may provide one or more feedback control signals 1855 to a current control subsystem 1870 based on one or more signals 1830 representing output voltage $V_O$, one or more signals 1815 representing input voltage $V_{IN}$, and one or more reference commands 1810. One of ordinary skill in the art would further understand how to construct a feedforward current shaping subsystem 1865 that may provide one or more feedforward command signals 1850 to a current control subsystem 1870 based on one or more signals 1830 representing output voltage $V_O$, one or more signals 1835 representing load current, one or more signals representing input voltage $V_{IN}$, and one or more reference command signals 1810. One of ordinary skill in the art would also understand how to construct a current control subsystem 1870 that may provide one or more output signals 1820 (e.g., PWM signals) to one or more NRHPZ converters 1845 based on one or more signals 1830 representing output voltage $V_O$, one or more signals 1825 representing converter stage, one or more reference command signals 1810, one or more feedback control signals 1855 from a feedback control subsystem 1860, and one or more feedforward command signals from a feedforward current shaping subsystem 1865.

Three-Level NRHPZ Conversion with Two-Phase, Tri-Phase, and/or N-Phase Operation As discussed previously, the three-level NRHPZ converters described herein may be used with two-phase control or with tri-phase control. Tri-phase control refers to the ability to control switch configurations of a converter in three different phases per cycle, in contrast to two-phase control where switch configurations of a converter may be controlled in two different phases per cycle.

The three-level NRHPZ converters discussed previously may be used with tri-phase control to generate output voltages between 0V and a top voltage $V_H$. For example, a desired output voltage may be achieved by alternating $V_X$ between two or more of the available input voltages (e.g., 0V, $V_{IN}$, $V_H$ in the example of FIG. 9). A desired output voltage may then be achieved by applying one of the input voltages at a certain duty cycle for one phase of the cycle and filling one or more remaining phases of the cycle with one or more other input voltages. Voltage mode control, current mode control, or feedforward current control (see, e.g., FIGS. 18A, 18B and corresponding discussion) may also be used to control the timing at which a particular input voltage is selected in a cycle. For example, a voltage or current, such as an input voltage, current pulled from the energy source, an output voltage, a load current, and/or a voltage or current measured at a component, may be monitored and a controller may change from one switch configuration to another within a cycle based on the monitored values. If a desired output voltage, for example, is $V_{IN}$, and a monitored output voltage is lower than $V_{IN}$, one or more controllers (see, e.g., the controllers discussed herein with reference to FIGS. 1-6C and 9-18B) may operate the switches of a converter such that $V_X$ receives input voltage $V_H$, to increase the output voltage of the converter. Once the output voltage is above $V_{IN}$, the converter may operate the switches such that $V_X$ receives an input voltage of $V_{IN}$ or 0V to reduce the output voltage closer to $V_{IN}$.

Considering circuit 900 of FIG. 9 as one example, for output voltages between 0V up to nearly $V_{IN}$, a desired output voltage may be synthesized by switching to modulate (e.g., using duty ratio/voltage mode control, current mode control, and/or feedforward current control) voltage $V_X$ between 0V and $V_{IN}$. This is an example of two-phase operation. To synthesize output voltages above $V_{IN}$, voltage $V_X$ may be modulated between $V_{IN}$ and $V_H$. This is another example of two-phase operation. In some embodiments, tri-phase operation may be used to synthesize output voltages near $V_{IN}$.

For example, in circuit 900 of FIG. 9, in either "low-range" (e.g., output voltage $V_{OUT}$ less than $V_{IN}$) or "high-range" (e.g., output voltage $V_{OUT}$ greater than $V_{IN}$), control of the magnetic regulation stage over a switching cycle may be broken up into two phases. The first phase (e.g., phase 1) may have a duty ratio D, and the second phase (e.g., phase 2) may have a duty ratio of 1-D. In order to reach a periodic steady-state operation, one phase may impose a zero or positive voltage on the inductor (such that $di_L/dt>=0$) and the other phase may impose a zero or negative voltage on the inductor (such that $di_L/dt<=0$), with the steady state voltages such that the average voltage across the inductor over a switching cycle may be zero in periodic stead state operation ($<d_{iL}/dt>=0$, where the average < > is taken over a switching cycle). There are many ways in which the values of the duty ratios may be determined, such as through voltage-mode control or current-mode control, or load feedforward current control, including average, peak and/or valley current-mode control, for example. For circuit 900 as shown in FIG. 9, the switching possibilities listed below in Table 5 may be typical. In Table 5, the "Mode" column lists various switch modes for circuit 900 of FIG. 9 as an example. The "Mode use" column lists what value of output voltage may be synthesized through use of the mode. The "Phase 1: di/dt>=0" column lists the value of voltage $V_X$ during phase 1 of the switching cycle. The "Phase 2: di/dt<=0" column lists the value of voltage $V_X$ during phase 2 of the switching cycle.

TABLE 5

| Mode | Mode use | Phase 1: di/dt >= 0 | Phase 2: di/dt <= 0 |
|---|---|---|---|
| 1 | Low $V_{OUT}$ | $V_X = V_{IN}$ | $V_X = 0$ |
| 2 | Any $V_{OUT}$ | $V_X = V_H$ | $V_X = 0$ |
| 3 | High $V_{OUT}$ | $V_X = V_H$ | $V_X = V_{IN}$ |
| 4 | Bypass $V_{OUT} = V_{IN}$ | $V_X = V_{IN}$ | $V_X = V_{IN}$ |

The different two-phase switching patterns provided in Table 5 may provide different capabilities in terms of periodic steady state voltage conversion ratios of the magnetic regulation stage. Mode 1 ("low") may enable a periodic steady-state voltage that is equal to or less than the input voltage $V_{IN}$. Mode 3 ("high") may enable an output voltage that is equal to or greater than the input voltage $V_{IN}$, up to voltage $V_H$. Mode 2 ("any") may attain output voltages $V_{OUT}$ in any range between 0V and $V_H$, but this mode may impose a relatively high degree of stress and loss on components for a given conversion ratio as compared to Modes 1 or 3. Thus, if utilized, this mode may be less efficient and may require larger components than other modes. Mode 4 ("bypass") may connect the input voltage $V_{IN}$ to the output voltage $V_{OUT}$, providing a conversion ratio of 1, but in reality slightly less than one due to component voltage drops. Some more sophisticated degree of control may therefore be desirable to realize output voltages $V_{OUT}$ near the input voltage $V_{IN}$ without high stress on the components.

In converters previously discussed, operation of the magnetic regulation stage may be extended beyond a two-phase mode of operation for at least some desired range of voltage conversion ratios. That is, three or more sets of switch states may be utilized over a switching (i.e., operation cycle) cycle of the magnetic regulation stage. Such an operating mode using 3 or more sets of switch states may be referred to as "tri-phase" control, and may be implemented in a variety of ways, including with voltage mode control, current mode control, or load current feedforward control. A converter using tri-phase control may provide voltage conversion for conversion ratios of <1, =1, and >1 in a manner that is more efficient than may be possible with converters using a two-phase (i.e., 2 switch states per cycle) approach, while still allowing for wide operating ranges and low component stress. It may also be desirable to provide such a tri-phase converter efficiently and compactly with relatively simple circuitry that preserves other capabilities that may be desired, such as current mode control, high regulation bandwidth, and simple compensation with smooth mode transitions. It may also be valuable to realize smooth transitions between conventional two-phase control and a tri-phase operating mode. This may be accomplished with tri-phase control techniques, but with the three phases of tri-phase control implemented with one phase having $V_X=V_{IN}$, a second phase having $V_X=V_H$, and a third phase having $V_X=0$ (not necessarily in that order of switching). The order and control of switching may be arranged in any number of manners.

It should be appreciated that although examples are described herein with reference to a two-phase or tri-phase operating mode, such reference is made only to promote clarity in the description of the broad concepts sought to be protected and are not intended as, and should not be construed as, limiting. For example, after reading the description provided herein, it will be apparent to one of ordinary skill in the art that the concepts, systems, system architectures, circuits, methods, and techniques described herein may be extended to even more than three phases per cycle. Indeed any integer number of phases N may be used per cycle by turning on select groups of switches in each phase out of N per cycle. This may be referred to as N-phase control.

In embodiments disclosed herein, a group of switches to be switched on or off in a phase of a cycle may comprise one or more switches. Although some examples provided herein may describe specific groups of switches for a phase or mode, and some may not, after reading the examples and description, one of ordinary skill in the art will appreciate how many switches and which switches might be included in a phase of a cycle.

Figure 13:
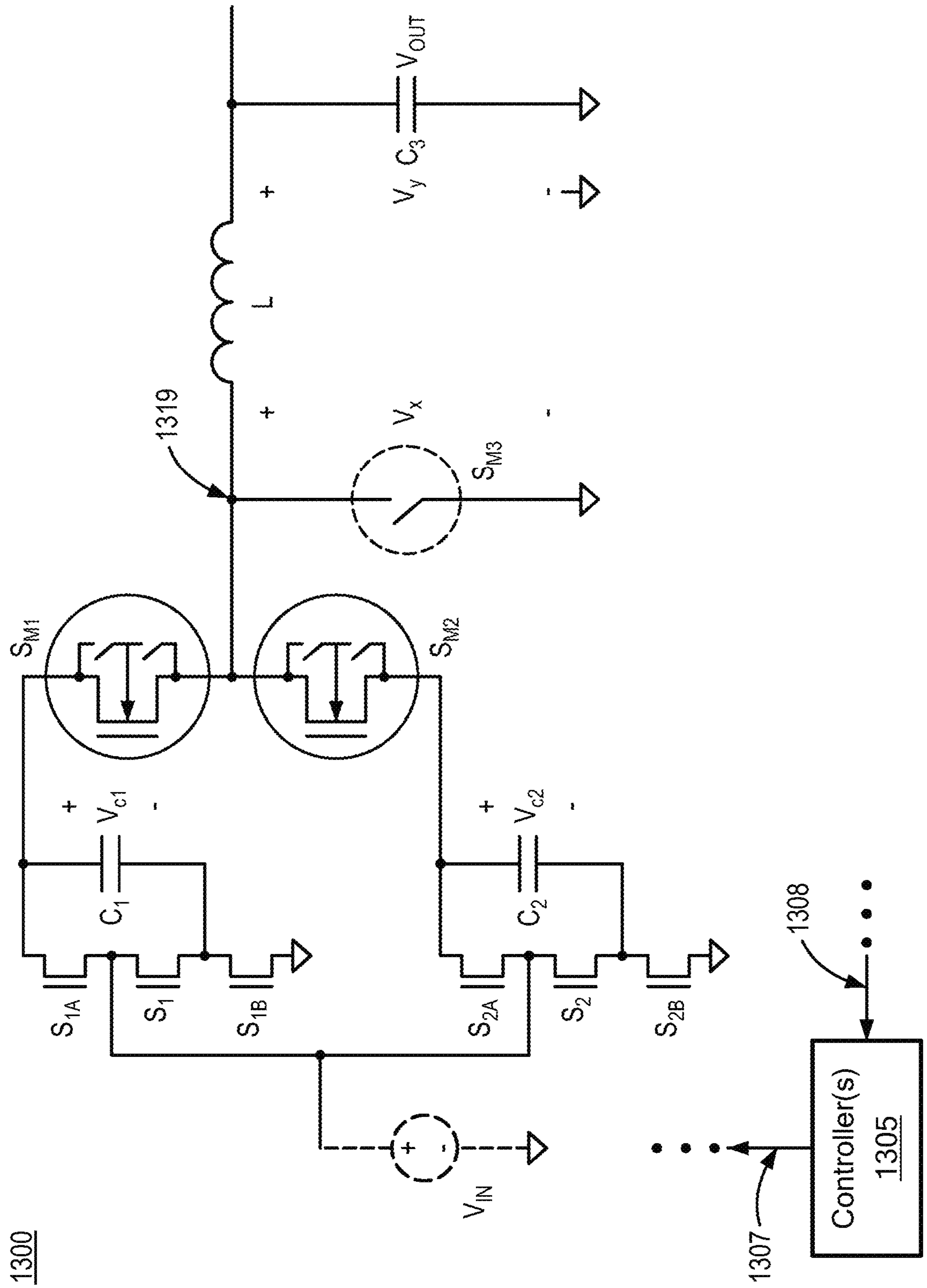
FIG. 13 is a schematic diagram of an example circuit that utilizes an interleaved circuit in which two flying capacitors may be alternately connected to synthesize a voltage above the input voltage.
Figure 19:
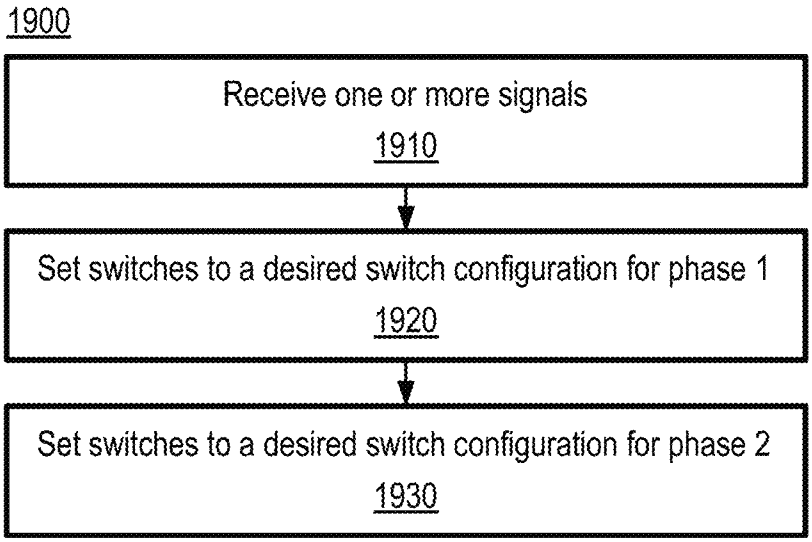
FIG. 19 is a flow diagram of an example process for controlling a magnetic regulation stage of the circuits disclosed herein.

Decisions on how many phases to include in a cycle, which switch states of the switches in a circuit to include in each phase of a cycle, and/or when to switch between phases/switch states in a cycle may be made by one or more controllers (see, e.g., controller(s) 155 of FIG. 1B, controller(s) 205 of FIG. 2A, controller(s) 280 of FIG. 2C, controller(s) 305 of FIG. 3A, controller(s) 370 of FIG. 3B, controller(s) 405 of FIG. 4, controller(s) 505 of FIG. 5, controller(s) 605 of FIG. 6A, controller(s) 612 of FIG. 6B, controller(s) 690 of FIG. 6C, controller(s) 905 of FIG. 9, controller(s) 1005 of FIG. 10, controller(s) 1105 of FIG. 11, controller(s) 1205 of FIG. 12, controller(s) 1305 of FIG. 13, controller(s) 1405 of FIG. 14A, controller(s) 1455 of FIG. 14B, controller(s) 1505 of FIG. 15, controller(s) 1605 of FIG. 16A, controller(s) 1655 of FIG. 16B, controller(s) 1705 of FIG. 17A, controller(s) 1732 of FIG. 17B, controller(s) 1775 of FIG. 17C, controller(s) of FIG. 18, controller(s) of FIG. 19). In some embodiments, these decisions may be made based, at least in part, on information conveyed to the one or more controllers in one or more feedback/feedforward signals (see, e.g., feedback/feedforward signal(s) 158 of FIG. 1B, feedback/feedforward signal(s) 208 of FIG. 2A, feedback/feedforward signal(s) 258 of FIG. 2B, feedback/feedforward signal(s) 283 of FIG. 2C, feedback/feedforward signal(s) 308 of FIG. 3A, feedback/feedforward signal(s) 374 of FIG. 3B, feedback/feedforward signal(s) 408 of FIG. 4, feedback/feedforward signal(s) 508 of FIG. 5, feedback/feedforward signal(s) 608 of FIG. 6A, feedback/feedforward signal(s) 614 of FIG. 6B, feedback/feedforward signal(s) 693 of FIG. 6C, feedback/feedforward signal(s) 908 of FIG. 9, feedback/feedforward signal(s) 1008 of FIG. 10, feedback/feedforward signal(s) 1108 of FIG. 11, feedback/feedforward signal(s) 1208 of FIG. 12, feedback/feedforward signal(s) 1308 of FIG. 13, feedback/feedforward signal(s) 1408 of FIG. 14A, feedback/feedforward signal(s) 1467 of FIG. 14B, feedback/feedforward signal(s) 1508 of FIG. 15, feedback/feedforward signal(s) 1608 of FIG. 16A, feedback/feedforward signal(s) 1658 of FIG. 16B, feedback/feedforward signal(s) 1708 of FIG. 17A, feedback/feedforward signal(s) 1735 of FIG. 17B, feedback/feedforward signal(s) 1778 of FIG. 17C, feedback/feedforward signal(s) of FIG. 18, feedback/feedforward signal(s) of FIG. 19) relating to a current state of the circuit. The one or more controllers may control the switches in each phase of a cycle through one or more switch control signal lines (see, e.g., signal line(s) 157 of FIG. 1B, signal line(s) 207 of FIG. 2A, signal line(s) 257 of FIG. 2B, signal line(s) 282 of FIG. 2C, signal line(s) 307 of FIG. 3A, signal line(s) 373 of FIG. 3B, signal line(s) 407 of FIG. 4, signal line(s) 507 of FIG. 5, signal line(s) 607 of FIG. 6A, signal line(s) 613 of FIG. 6B, signal line(s) 692 of FIG. 6C, signal line(s) 907 of FIG. 9, signal line(s) 1007 of FIG. 10, signal line(s) 1107 of FIG. 11, signal line(s) 1207 of FIG. 12, signal line(s) 1307 of FIG. 13, signal line(s) 1407 of FIG. 14A, signal line(s) 1466 of FIG. 14B, signal line(s) 1507 of FIG. 15, signal line(s) 1607 of FIG. 16A, signal line(s) 1657 of FIG. 16B, signal line(s) 1707 of FIG. 17A, signal line(s) 1734 of FIG. 17B, signal line(s) 1777 of FIG. 17C, signal line(s) of FIG. 18, signal line(s) of FIG. 19). For example, the one or more controllers may control a switch state by pulsing signals on or off (e.g., at a certain duty cycle) on the signal lines for each switch to be controlled to put it in its proper state for a switch configuration in a particular phase of a cycle, such as through pulse-width modulation (PWM) control of a signal on a signal line.

In some embodiments, these decisions may be made before a switching cycle (i.e., operation cycle) starts. For example, the one or more controllers may, based on configuration information stored in the one or more controllers, decide how many phases to include in a cycle and which on/off states to include for each of the switches in a circuit for each phase of that cycle, and control the switches accordingly. In some embodiments, the one or more controllers may take feedback/feedforward information from any of the feedback/feedforward signals previously discussed regarding a current state of a circuit into account in making these decisions.

In some embodiments, these decisions may be made on-the-fly. That is, within a cycle, the one or more controllers may take information from any of the feedback and/or feedforward signals previously discussed regarding a current state of a circuit into account, and, within the cycle, choose a configuration of the switches for the next phase accordingly to achieve a desired output. For example, if a desired output voltage is $V_{IN}$ and a signal is received indicating a current output voltage of far less than $V_{IN}$, the one or more controllers may control the switches to output a higher voltage to the NRHPZ converter (e.g., $V_H$ at $V_X$) to increase the output voltage. In some embodiments, the one or more controllers may control the NRHPZ converter to use three switching configurations in one cycle (tri-phase operation) and two switching configurations in the next cycle (two-phase operation), or vice versa, and may switch between tri-phase operation and two-phase operation smoothly.

In some embodiments, different types of feedback/feedforward information may be used in different operation cycles of a converter. For example, voltage mode control may be used to determine which switching configurations to use in one operation cycle, while current mode control (including, for example, load current feedforward control) may be used to determine which switching configurations to use in another operation cycle.

A person of ordinary skill in the art will recognize upon reading this disclosure that certain circuits within the circuits described with respect to FIGS. 1A-18B may be used together in combination to create additional circuits with additional benefits, depending on the particular application. For example, one of skill in the art would recognize that certain front-end switched-capacitor converters and/or magnetic front ends may be used with one or more magnetic converters (e.g., 3-level buck converters) (e.g., in parallel or in cascade) and may be used with one or more multi-output switched-capacitor converters, depending on the application. One of skill in the art would recognize that any combination of front-end circuitry and/or output converter circuitry discussed herein may be used in combination with an NRHPZ converter, and all such combinations should be considered to be within the spirit and scope of the disclosure provided herein.

FIG. 19 shows an example process 1900 that may be used for implementing switch configurations in two-phase operation of a converter, as previously discussed. In some embodiments, process 1900 may be implemented, for example, by a processor in one or more of the controllers previously discussed with respect to FIGS. 1A-18B. In some embodiments, process 1900 may be implemented by an application specific integrated circuit (ASIC) in one or more of the controllers previously discussed with respect to FIGS. 1A-18B. In some embodiments, process 1900 may be implemented in digital logic components in one or more of the controllers previously discussed with respect to FIGS. 1A-18B. In some embodiments, process 1900 may be implemented in analog components in one or more of the controllers previously discussed with respect to FIGS. 1A-18B.

In 1910, one or more signals may be received. For example, a controller (e.g., one or more of the controllers described with respect to FIGS. 1A-18B) may receive one or more feedback and/or feedforward signals (e.g., one or more of the signals described with respect to FIGS. 1A-18B). In some embodiments, the one or more signals may be one or more input commands or reference command signals (e.g., one or more of the input command signals or reference command signals as previously described with respect to FIGS. 1A-18B).

In 1920, one or more switches of a circuit (e.g., one or more of the circuits described with respect to FIGS. 1A-18B) may be set to an on or off state for a certain first switch configuration for a first phase of an operation cycle. For example, based on the feedback/feedforward signals, input command signals, and/or reference command signals received in 1910, controller (e.g., one of the controller(s) described with respect to FIGS. 1A-18B) may select a desired switch configuration and output signals on signal lines (e.g., one or more of the signal lines discussed with respect to FIGS. 1A-18B) to set the switches of the circuit to that switch configuration.

In 1930, one or more switches of the circuit may be set to an on or off state for a certain second switch configuration for a second phase of an operation cycle. The second switch configuration may be determined, for example, based on one or more additional feedback signals, feedforward signals, reference command signals, and/or input command signals received since setting the first switch configuration, or may be based on the previously received signals.

Figure 20:
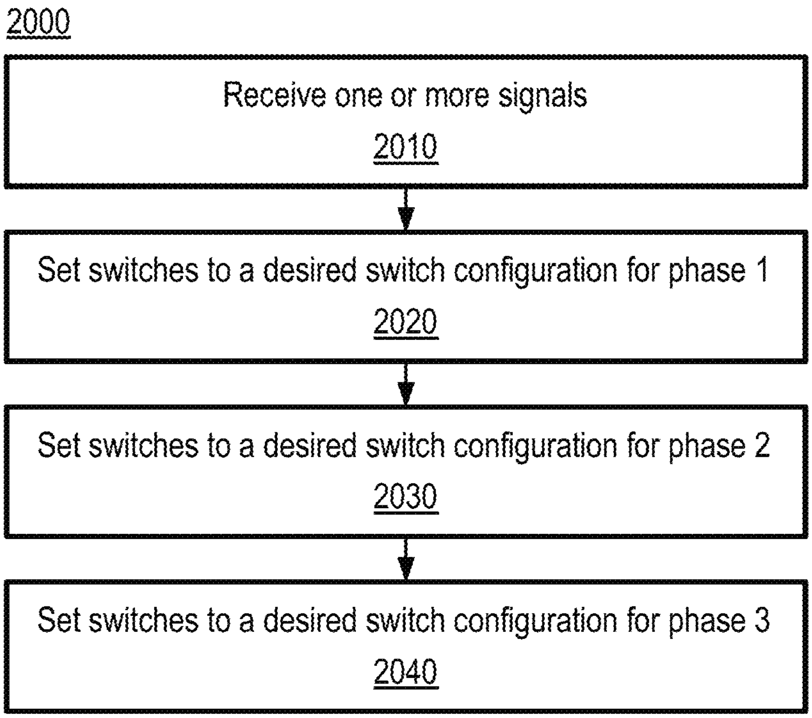
FIG. 20 is a flow diagram of an example process for utilizing tri-phase control for controlling a magnetic regulation stage of the circuits disclosed herein.

FIG. 20 shows an example process 2000 that may be used for implementing switch configurations in tri-phase operation of a converter, as previously discussed. In some embodiments, process 2000 may be implemented, for example, by a processor in one or more of the controllers previously discussed with respect to FIGS. 1A-6C and 9-18B. In some embodiments, process 2000 may be implemented by an application specific integrated circuit (ASIC) in one or more of the controllers previously discussed with respect to FIGS. 1A-6C and 9-18B. In some embodiments, process 2000 may be implemented in digital logic components in one or more of the controllers previously discussed with respect to FIGS. 1A-6C and 9-18B. In some embodiments, process 2000 may be implemented in analog components in one or more of the controllers previously discussed with respect to FIGS. 1A-6C and 9-18B.

In 2010, one or more signals may be received. For example, a controller (e.g., one or more of the controllers described with respect to FIGS. 1A-6C and 9-18B) may receive one or more signals (e.g., one or more of the feedforward and/or feedback signals described with respect to FIGS. 1A-6C and 9-18B). In some embodiments, the one or more signals may include one or more input commands or reference command signals (e.g., one or more of the input command signals or reference command signals as previously described with respect to FIGS. 1A-6C and 9-18B).

In 2020, one or more switches of a circuit (e.g., one or more of the circuits described with respect to FIGS. 1A-6C and 9-18B) may be set to an on or off state for a certain first switch configuration for a first phase of an operation cycle. For example, based on the feedback/feedforward signals, input command signals, and/or reference command signals received in 2010, controller (e.g., one of the controller(s) described with respect to FIGS. 1A-6C and 9-18B) may select a desired switch configuration and output signals on signal lines (e.g., one or more of the signal lines discussed with respect to FIGS. 1A-6C and 9-18B) to set the switches of the circuit to that switch configuration.

In 2030, one or more switches of the circuit may be set to an on or off state for a certain second switch configuration for a second phase of an operation cycle. The second switch configuration may be determined, for example, based on one or more additional feedforward and/or feedback signals, reference command signals, and/or input command signals received since setting the first switch configuration, or may be based on the previously received signals.

In 2040, one or more switches of the circuit may be set to an on or off state for a certain third switch configuration for a third phase of an operation cycle. The third switch configuration may be determined, for example, based on one or more additional feedforward and/or feedback signals, reference command signals, and/or input command signals received since setting the first switch configuration, or may be based on the previously received signals.

Although multiple switch configurations are described with respect to FIGS. 19 and 20, these switch configurations may be different from one another or the same. For example, for process 2000, in some embodiments, the first and second switch configurations may be the same, the first and third switch configurations may be the same, or the second and third switch configurations may be the same.

Figure 21:
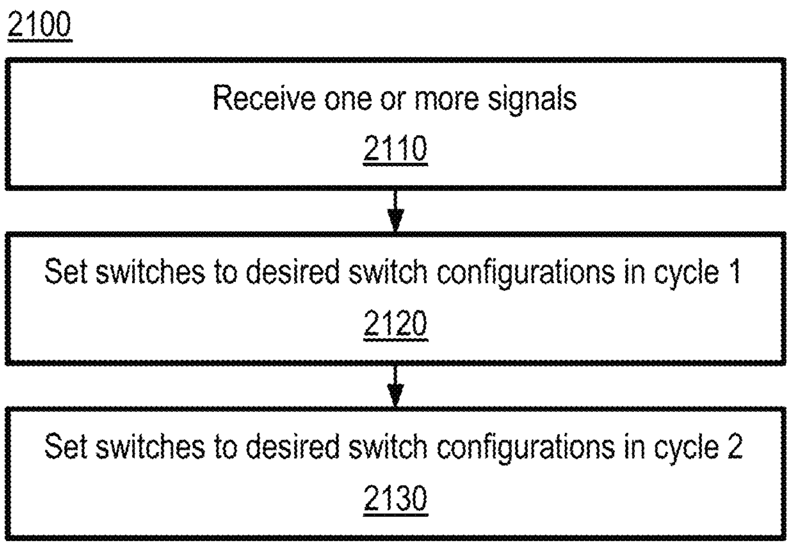
FIG. 21 is a flow diagram of an example process for controlling a magnetic regulation stage of the circuits disclosed herein over two operating cycles.

FIG. 21 shows an example process 2100 that may be used for implementing switch configurations over multiple operation cycles of a converter, as previously discussed. In some embodiments, process 2100 may be implemented, for example, by a processor in one or more of the controllers previously discussed with respect to FIGS. 1A-6C and 9-18B. In some embodiments, process 2100 may be implemented by an application specific integrated circuit (ASIC) in one or more of the controllers previously discussed with respect to FIGS. 1A-6C and 9-18B. In some embodiments, process 2100 may be implemented in digital logic components in one or more of the controllers previously discussed with respect to FIGS. 1A-6C and 9-18B. In some embodiments, process 2100 may be implemented in analog components in one or more of the controllers previously discussed with respect to FIGS. 1A-6C and 9-18B.

In 2110, one or more signals may be received. For example, a controller (e.g., one or more of the controllers described with respect to FIGS. 1A-6C and 9-18B) may receive one or more signals (e.g., one or more of the feedforward and/or feedback signals described with respect to FIGS. 1A-6C and 9-18B). In some embodiments, the one or more signals may include one or more input commands or reference command signals (e.g., one or more of the input command signals or reference command signals as previously described with respect to FIGS. 1A-6C and 9-18B).

In 2020, one or more switches of a circuit (e.g., one or more of the circuits described with respect to FIGS. 1A-6C and 9-18B) may be set to an on or off state for certain first switch configurations for the multiple phases (e.g., two for two-phase control, three for tri-phase control) of an operation cycle. For example, based on the feedback and/or feedforward signals, input command signals, and/or reference command signals received in 2010, controller (e.g., one of the controller(s) described with respect to FIGS. 1A-6C and 9-18B) may select a desired switch configuration for at least one of the phases of the operation cycle, and output signals on signal lines (e.g., one or more of the signal lines discussed with respect to FIGS. 1A-6C and 9-18B) to set the switches of the circuit to that switch configuration for one or more phases of the operation cycle. In some embodiments, switch configurations for all phases of the operation cycle may be determined based on the signals received in 2110. In some embodiments, a first switch configuration for a first phase of the operation cycle may be determined based on the signals received in 2110, and additional switch configurations for additional phases of the operation cycle may be determined based on additional feedback and/or feedforward signals, input command signals, and/or reference command signals received during the operation cycle.

In 2030, one or more switches of the circuit (e.g., one or more of the circuits described with respect to FIGS. 1A-6C and 9-18B) may be set to an on or off state for certain first switch configurations for the multiple phases (e.g., two for two-phase control, three for tri-phase control) of a second operation cycle. For example, based on feedback/feedforward signals, input command signals, and/or reference command signals (e.g., as received in 2010 or as received during the previous operation cycle), the controller (e.g., one of the controller(s) described with respect to FIGS. 1A-6C and 9-18B) may select a desired switch configuration for at least one of the phases of the second operation cycle, and output signals on signal lines (e.g., one or more of the signal lines discussed with respect to FIGS. 1A-6C and 9-18B) to set the switches of the circuit to that switch configuration for one or more phases of the operation cycle. In some embodiments, switch configurations for all phases of the operation cycle may be determined based on the signals received. In some embodiments, a first switch configuration for a first phase of the operation cycle may be determined based on the signals received, and additional switch configurations for additional phases of the operation cycle may be determined based on additional feedforward and/or feedback signals, input command signals, and/or reference command signals received during the second operation cycle.

In some embodiments, operation cycle 1 of process 2100 may be controlled with two-phase control (see, e.g., process 1900 of FIG. 19) and operation cycle 2 of process 2100 may be controlled with tri-phase control (see, e.g., process 2000 of FIG. 20). In some embodiments, operation cycle 1 of process 2100 may be controlled with tri-phase control (see, e.g., process 2000 of FIG. 20) and operation cycle 2 of process 2100 may be controlled with two-phase control (see, e.g., process 1900 of FIG. 19). In some embodiments, operation cycle 1 of process 2100 may be controlled with two-phase control (see, e.g., process 1900 of FIG. 19) and operation cycle 2 of process 2100 may also be controlled with two-phase control (see, e.g., process 1900 of FIG. 19). In some embodiments, operation cycle 1 of process 2100 may be controlled with tri-phase control (see, e.g., process 2000 of FIG. 20) and operation cycle 2 of process 2100 may also be controlled with tri-phase control (see, e.g., process 2000 of FIG. 20). Process 2100 may repeat for each cycle of a converter, such as in any of the circuits previously discussed (e.g., circuits described with respect to FIGS. 1A-6C and 9-18B).

Various embodiments of the concepts, systems, system architectures, circuits, methods, and techniques sought to be protected are described herein with reference to the related drawings. Alternative embodiments may be devised without departing from the scope of the concepts, systems, system architectures, circuits, methods, and techniques described herein. It is noted that various connections and positional relationships (e.g., over, below, adjacent, etc.) may be set forth between elements in the foregoing description and in the drawings. These connections and/or positional relationships, unless specified otherwise, may be direct or indirect, and the described concepts, systems, system architectures, circuits, methods, and techniques are not intended to be limited in this respect. Accordingly, a coupling of components or subsystems may refer to either a direct or an indirect coupling, and a positional relationship between components or subsystems may be a direct or indirect positional relationship.

FIGS. 1A-18B illustrate circuits with certain components directly connected to one another. A person of ordinary skill in the art would understand that each of these components has terminals by which they may be connected with the other components over wires, electrical traces, or other conductive lines as shown in the schematic drawings. While FIGS. 1A-18B may illustrate certain components as being directly connected to one another, the disclosure is not so limited. One or more components may, for example, be connected between the components illustrated as being directly connected in the schematic drawings of FIGS. 1A-18B. Both direct connections and indirect connections are intended to be encompassed by the disclosure herein. When direct connections are meant herein and in the claims, the word "direct" will be used in connoting the connection between the components. Thus, the term "connection" (or any variant thereof), may include an "indirect connection" or a "direct connection."

As used herein, the terms "comprises," "comprising," "includes," "including," "has," "having," contains," "containing," or any other variation thereof, are intended to cover a non-exclusive inclusion. For example, a system, system architecture, subsystem, component, circuit, process, method, article, or apparatus that comprises a list of elements or steps is not necessarily limited to only those elements or steps but may include other elements or steps not expressly listed or inherent to such system, system architecture, subsystem, component, circuit, process, method, article, or apparatus.

Additionally, the term "exemplary," if used herein, means "serving as an example, instance or illustration." Any embodiment or example described herein as "exemplary" is not necessarily to be construed as preferred or advantageous over other embodiments or designs. The terms "one or more" is understood to include any integer number greater than or equal to one, i.e., one, two, three, four, etc. The term "plurality" is understood to include any integer number greater than or equal to two, i.e., two, three, four, five, etc.

References in the specification to "one embodiment," "an embodiment," "an example embodiment," etc., indicate that the embodiment may include a particular feature, structure, or characteristic, but every embodiment may include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described in that manner.

Use of ordinal terms, such as "first, second," "third," etc., in the claims to modify a claim element does not by itself connote any priority, preference, or order of one claim element over another, or the temporal order in which acts of a method are performed, but are used merely as labels to distinguish one claim element having a certain name from another element having a same name (but for use of the ordinal term) to distinguish the claim elements.

The terms "approximately," substantially or "about" may be used to mean +/−30% of a target value in some embodiments, within +/−20% of a target value in some embodiments, within +/−10% of a target value in some embodiments, within +/−5% of a target value in some embodiments, and within +/−2% of a target value in some embodiments. The aforementioned terms may include the target value. The terms "approximately equal to," substantially equal to" or "about equal to" may be used to refer to values that are within +/−30% of one another in some embodiments, within +/−20% of one another in some embodiments, within +/−10% of one another in some embodiments, within +/−5% of one another in some embodiments, and within +/−2% of one another in some embodiments. For example, a first voltage value that is "approximately," "substantially," or about equal to a second voltage value may within +/−30% of the second voltage value in some embodiments, within +/−20% of the second voltage value in some embodiments, within +/−10% of the second voltage value in some embodiments, within +/−5% of the second voltage value in some embodiments, or within +/−2% of the second voltage value in some embodiments. The aforementioned terms may exact matching of values.

It is to be understood that the disclosed subject matter is not limited in its application to the details of construction and to the arrangement of the components set forth in the foregoing description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, systems, system architectures, circuits, methods, and techniques for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing example embodiments, it is to be understood that the present disclosure has been made only by way of example, and that numerous changes in the details of implementation of the disclosed subject matter may be made without departing from the spirit and scope of the disclosed subject matter.

The invention claimed is:

1. A power converter having a pair of input terminals configured to be connected to terminals of a voltage source and having a pair of output terminals configured to be coupled to a load, the power converter configured to provide an output voltage at the output terminals without incurring a right-half-plane zero in a control-to-output transfer function of the power converter, the power converter comprising:

an inductor;

a plurality of switches; and one or more controllers configured to:

control the switches to selectively couple a first end of the inductor to a first one of the pair of input terminals in a first switch state during a first phase of a switching cycle of the power converter;

control the switches to selectively couple the first end of the inductor to a second one of the pair of input terminals in a second switch state during a third phase of the switching cycle; and control the switches to selectively couple the first end of the inductor to a first voltage level greater than a voltage at the input terminals in a third switch state during a second phase of the switching cycle.

2. The power converter of claim 1, wherein the power converter is configured to provide another output voltage at the output terminals that is between zero volts and twice the voltage at the input terminals.

3. The power converter of claim 1, wherein the switching cycle is a first switching cycle of the power converter, and the one or more controllers are further configured to control the switches in only two phases of a second switching cycle of the power converter by:

controlling the switches in accordance with a first one of the first switch state, the second switch state, or the third switch state during a first phase of the two phases of the second switching cycle; and controlling the switches in accordance with a second one of the first switch state, the second switch state, or the third switch state during a second phase of the two phases of the second switching cycle, wherein the first one and the second one are different.

4. The power converter of claim 1, wherein the switching cycle is a first switching cycle of the power converter, and the one or more controllers are further configured to synthesize another output voltage at the output terminals that is lower than the voltage at the input terminals by:

controlling the switches in accordance with the first switch state during a first phase of a second switching cycle of the power converter; and controlling the switches in accordance with the second switch state during a second phase of the second switching cycle of the power converter.

5. The power converter of claim 1, wherein the switching cycle is a first switching cycle of the power converter, and the one or more controllers are further configured to synthesize another output voltage at the output terminals that is higher than the voltage at the input terminals by:

controlling the switches in accordance with the third switch state during a first phase of a second switching cycle of the power converter; and controlling the switches in accordance with the first switch state during a second phase of the second switching cycle of the power converter.

6. The power converter of claim 1, further comprising a front-end stage configured to generate the first voltage level.

7. The power converter of claim 6, wherein the front-end stage comprises at least one of an inductor or a capacitor.

8. The power converter of claim 6, wherein the front-end stage is reconfigurable to provide the first voltage level at different voltage levels.

9. The power converter of claim 1, wherein the one or more controllers are further configured to receive one or more signals corresponding to a load current and to provide feedforward control to generate a desired output voltage level at the output terminals based on the one or more signals.

10. The power converter of claim 1, further comprising:

an output stage configured to:

receive a current from a second end of the inductor;

charge a first capacitor with the current during a first portion of a switching cycle of the output stage;

charge a second capacitor with the current during a second portion of the switching cycle of the output stage;

provide a first output voltage level at a first output terminal; and provide a second output voltage level at a second output terminal.

11. The power converter of claim 1, wherein the one or more controllers are further configured to control the switches to selectively couple a second voltage level greater than the voltage at the input terminals to the first end of the inductor in a fourth switch state.

12. The power converter of claim 11, wherein the switching cycle is a first switching cycle of the power converter, and the one or more controllers are further configured to control the plurality of switches to synthesize the output voltage by:

controlling the switches in accordance with the first switch state during a first phase of a second switching cycle of the power converter;

controlling the switches in accordance with the fourth switch state during a second phase of the second switching cycle; and controlling the switches in accordance with the second switch state during a third phase of the second switching cycle.

13. The power converter of claim 1, wherein the one or more controllers are further configured to determine which of the first switch state, the second switch state, or the third switch state to implement during each phase of the switching cycle of the power converter prior to the switching cycle.

14. The power converter of claim 1, wherein the one or more controllers are further configured to determine which of the first switch state, the second switch state, or the third switch state to implement during a phase of the switching cycle of the power converter during the switching cycle.

15. A method for controlling, by one or more controllers, a plurality of switches to provide an output voltage at output terminals of a power converter without incurring a right-half-plane zero in a control-to-output transfer function of the power converter, comprising:

controlling, by the one or more controllers, a plurality of switches to selectively couple a first end of an inductor to a first one of a pair of input terminals of a voltage source in a first switch state during a first phase of a switching cycle of the power converter;

controlling, by the one or more controllers, the switches to selectively couple the first end of the inductor to a second one of the pair of input terminals of the voltage source in a second switch state during a third phase of the switching cycle; and controlling, by the one or more controllers, the switches to selectively couple the first end of the inductor to a first voltage level greater than a voltage at the input terminals in a third switch state during a second phase of the switching cycle.

16. The method of claim 15, wherein the switching cycle is a first switching cycle of the power converter and the one or more controllers further control the switches in only two phases of a second switching cycle of the power converter, further comprising:

controlling, by the one or more controllers, the switches in accordance with a first one of the first switch state, the second switch state, or the third switch state during a first phase of the two phases of the second switching cycle; and controlling, by the one or more controllers, the switches in accordance with a second one of the first switch state, the second switch state, or the third switch state during a second phase of the two phases of the second switching cycle, wherein the first one and the second one are different.

* * * * *